(12) United States Patent
Yoneda et al.

(10) Patent No.: US 9,041,449 B2
(45) Date of Patent: May 26, 2015

(54) SEMICONDUCTOR STORAGE DEVICE

(75) Inventors: Seiichi Yoneda, Kanagawa (JP);
Hidetomo Kobayashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 25 days.

(21) Appl. No.: 13/455,195

(22) Filed: Apr. 25, 2012

(65) Prior Publication Data

US 2012/0274379 A1    Nov. 1, 2012

(30) Foreign Application Priority Data

Apr. 29, 2011  (JP) ................................. 2011-102540
May 14, 2011  (JP) ................................. 2011-108890

(51) Int. Cl.
*H03K 3/356* (2006.01)
*H01L 27/12* (2006.01)
*G11C 19/18* (2006.01)
*G11C 19/28* (2006.01)

(52) U.S. Cl.
CPC ...... *H01L 27/1225* (2013.01); *H03K 3/356008* (2013.01); *G11C 19/184* (2013.01); *G11C 19/28* (2013.01)

(58) Field of Classification Search
USPC ........... 327/199, 202, 203, 208, 210–212, 24, 327/215, 218, 219, 225, 214; 377/73–76
See application file for complete search history.

(56) References Cited

U.S. PATENT DOCUMENTS 5,099,502 A    3/1992    Tazuke
5,132,993 A    7/1992    Nishimura et al.
(Continued)

FOREIGN PATENT DOCUMENTS

EP    1 737 044 A1    12/2006
EP    2 226 847 A2     9/2010
(Continued)

OTHER PUBLICATIONS

Toshio Kamiya et al.; "Carrier Transport Properties and Electronics Structures of Amorphous Oxide Semiconductors: The present status"; Solid State Physics; Sep. 1, 2009; pp. 621-633; vol. 44, No. 9; Agne Gijutsu Center (with full English translation).

(Continued)

*Primary Examiner* — Long Nguyen
(74) *Attorney, Agent, or Firm* — Fish & Richardson P.C.

(57) ABSTRACT

A semiconductor storage device which stops and resumes the supply of power supply voltage without the necessity of saving and returning a data signal between a volatile storage device and a nonvolatile storage device is provided. In the nonvolatile semiconductor storage device, the volatile storage device and the nonvolatile storage device are provided without separation. Specifically, in the semiconductor storage device, data is held in a data holding portion connected to a transistor including a semiconductor layer containing an oxide semiconductor and a capacitor. The potential of the data held in the data holding portion is controlled by a data potential holding circuit and a data potential control circuit. The data potential holding circuit can output data without leaking electric charge, and the data potential control circuit can control the potential of the data held in the data holding portion without leaking electric charge by capacitive coupling through the capacitor.

22 Claims, 35 Drawing Sheets

(56) References Cited

U.S. PATENT DOCUMENTS

| | | | |
|---|---|---|---|
| 5,289,518 A * | 2/1994 | Nakao | 377/81 |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,633,995 B1 | 10/2003 | Nam | |
| 6,727,522 B1 | 4/2004 | Kawasaki et al. | |
| 6,756,960 B2 | 6/2004 | Miyatake | |
| 6,963,327 B2 | 11/2005 | Kawahata et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,712,009 B2 | 5/2010 | Ito et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0257136 A1 * | 12/2004 | Osame et al. | 327/219 |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0253500 A1 * | 10/2008 | Tso et al. | 377/69 |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0219072 A1 * | 9/2009 | Sobue | 327/199 |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0102018 A1 | 5/2011 | Shionoiri et al. | |
| 2011/0156024 A1 | 6/2011 | Koyama et al. | |
| 2011/0176357 A1 | 7/2011 | Koyama et al. | |
| 2012/0049889 A1 | 3/2012 | Hatano | |
| 2012/0182788 A1 | 7/2012 | Kurokawa | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-124290 A | 6/2010 |
| WO | 2004/114391 A1 | 12/2004 |

OTHER PUBLICATIONS

Asakuma, N et al., "Crystallization and Reduction of Sol-Gel-Derived Zinc Oxide Films by Irradation with Ultraviolet Lamp," Journal of Sol-Gel Science and Technology, 2003, vol. 26, pp. 181-184.

Asaoka, Y et al., "29.1: Polarizer-Free Reflective LCD Combined with Ultra Low-Powder Driving Technology," SID Digest '09 : SID International Symposium Digest of Technical Papers, 2009. pp. 395-398.

Chern, H et al., "An Analytical Model for the Above-Threshold Characterstics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

(56) References Cited

OTHER PUBLICATIONS

Coates, D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrate Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-FIlm Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronics Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 39, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel, YbFb2O4, and Yb2Fe3O7 Types of Structures for Compounds in the In2O3 and Sc2O3—A2O3—BO Systems [A; Fe, Ga, or Al; B; Mg, Mn, Fe, Ni, Cu, or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,"Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In, Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

(56) References Cited

OTHER PUBLICATIONS

Nowtari, H et al., "60.2: Intermediate Connector with Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ohara, H et al., "21.3: 2.0 In. QVGA AMOLED Display Using In—Ga—Zn—Oxide TFTs with a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variant for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al. "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronics Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display with Driver Circuit Using Amorphous In—Ga—Zn—Oxide TFTS," IDW '09 : Proceedings of the 16th International Display Workshops, 2009, pp. 689-692.

Son, K et al., "42.3L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

FIG. 20A  FIG. 20B
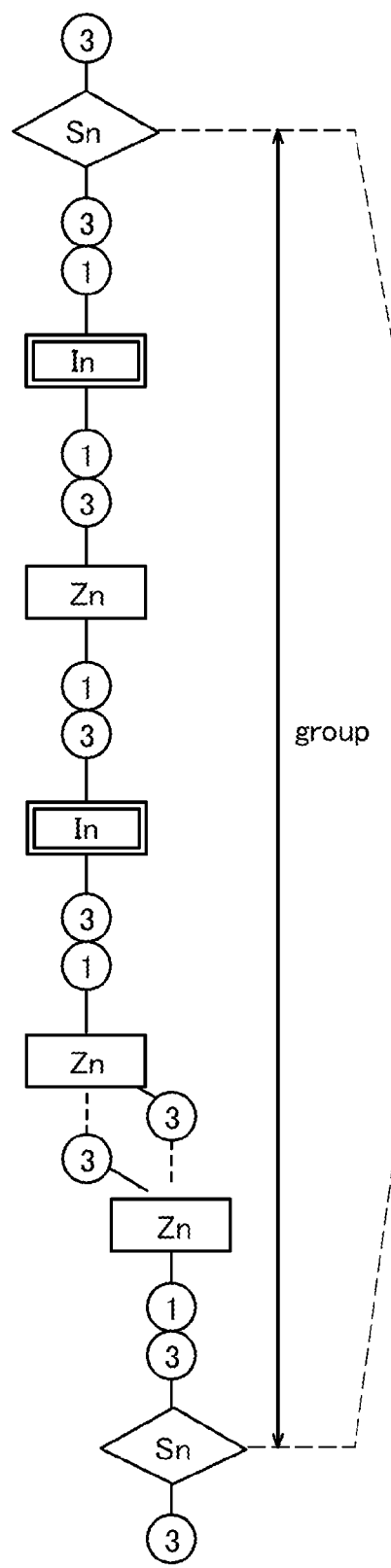
FIG. 20C
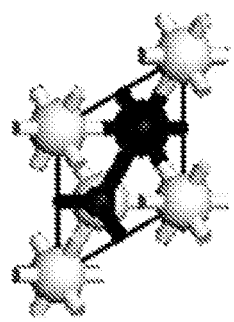

SEMICONDUCTOR STORAGE DEVICE

BACKGROUND OF THE INVENTION

1. Field of the Invention

The present invention relates to a semiconductor storage device. In particular, the present invention relates to a semiconductor storage device in a signal processing unit, which can keep a stored logic state even when power is turned off.

2. Description of the Related Art

A signal processing unit such as a central processing unit (CPU) has a variety of configurations depending on its application. The signal processing unit is generally provided with some kinds of storage devices such as a register and a cache memory in addition to a main memory for storing data or a program. A register has a function of temporarily holding a data signal for carrying out arithmetic processing, holding a program execution state, or the like. Meanwhile, a cache memory, which is located between an arithmetic unit and a main memory, is provided to reduce low-speed access to the main memory and to speed up the arithmetic processing.

In a storage device, such as a register or a cache memory, of a signal processing unit, writing of a data signal needs to be performed at higher speed than in a main memory. In general, a flip-flop, a static random access memory (SRAM), or the like is used as a register or a cache memory. That is, a volatile storage device in which a data signal is lost when the supply of power supply voltage is stopped is used for such a register, a cache memory, or the like.

In order to reduce power consumption, a method for temporarily stopping the supply of power supply voltage to a signal processing unit during a period in which a data signal is not input and output has been suggested (for example, see Patent Document 1). In the method disclosed in Patent Document 1, a nonvolatile storage device is located in the periphery of a volatile storage device, so that the data signal is temporarily stored in the nonvolatile storage device when the supply of power supply voltage is stopped.

Reference

[Patent Document 1] Japanese Published Patent Application No. 2010-124290

SUMMARY OF THE INVENTION

In the structure described in Patent Document 1, a data signal of the volatile storage device can be stored in the nonvolatile storage device located in the periphery of the volatile storage device while the supply of power supply voltage is stopped in the signal processing unit.

However, in the structure described in Patent Document 1, the volatile storage device and the nonvolatile storage device are provided separately. Therefore, when the supply of power supply voltage is stopped, it is necessary to save the data signal into the nonvolatile storage device from the volatile storage device. In addition, when the supply of power supply voltage is resumed, it is necessary to return the data signal to the volatile storage device from the nonvolatile storage device.

In view of the foregoing problems, an object of one embodiment of the present invention is to provide a semiconductor storage device which stops and resumes the supply of power supply voltage without the necessity of saving and returning a data signal between a volatile storage device and a nonvolatile storage device.

According to one embodiment of the present invention, in order to enable a data signal to be held even after the supply of power supply voltage is stopped, a volatile storage device and a nonvolatile storage device are provided without separation. Specifically, in a semiconductor storage device, a transistor including a semiconductor layer containing an oxide semiconductor and a capacitor are provided, a data signal is held in a data holding portion to which the transistor including a semiconductor layer containing an oxide semiconductor and the capacitor are connected. The potential of the data signal held in the data holding portion is controlled by a data potential holding circuit and a data potential control circuit. The potential of the data signal held in the data holding portion is controlled by the data potential holding circuit, and the data potential control circuit can control the potential of the data signal held in the data holding portion without leaking electric charge by capacitive coupling through the capacitor.

According to one embodiment of the present invention, a semiconductor storage device includes a first transistor to which data is supplied from a first terminal of the first transistor; a first data holding portion in which a second terminal of the first transistor, a first terminal of a second transistor, and a first electrode of a first capacitor are electrically connected to one another and which holds the data; a first data potential holding and outputting circuit which outputs the data with a potential of the first data holding portion held; a first data potential control circuit to which an output signal of the first data potential holding and outputting circuit and a first capacitor control signal are input and which controls a potential of a second electrode of the first capacitor; a second data holding portion in which a second terminal of the second transistor, a first terminal of a third transistor, and a first electrode of a second capacitor are electrically connected to one another and which holds the data which is supplied through the second transistor; a second data potential holding and outputting circuit which outputs the data with a potential of the second data holding portion held; and a second data potential control circuit to which an output signal of the second data potential holding and outputting circuit and a second capacitor control signal are input and which controls a potential of a second electrode of the second capacitor. In the semiconductor storage device, a first gate control signal is input to each gate of the first transistor and the third transistor, and a second gate control signal is input to a gate of the second transistor; the first data holding portion holds the data by bringing the first transistor and the second transistor out of conduction; the second data holding portion holds the data through the second transistor by bringing the second transistor and the third transistor out of conduction; the first data potential control circuit changes a potential of an output terminal of the first data potential control circuit to control the potential of the first data holding portion by capacitive coupling through the first capacitor; and the second data potential control circuit changes a potential of an output terminal of the second data potential control circuit to control the potential of the second data holding portion by capacitive coupling through the second capacitor.

According to one embodiment of the present invention, a semiconductor storage device includes a first transistor to which data is supplied from a first terminal of the first transistor; a first data holding portion in which a second terminal of the first transistor, a first terminal of a second transistor, a first electrode of a first capacitor, and an input terminal of a first inverter circuit are electrically connected to one another and which holds the data; a first NOR circuit to which a signal of an output terminal of the first inverter circuit and a first capacitor control signal are input and whose output terminal is electrically connected to a second electrode of the first capacitor; a second data holding portion in which a second terminal of the second transistor, a first terminal of a third transistor, a first electrode of a second capacitor, and an input terminal of a second inverter circuit are electrically connected to one another and which holds the data which is supplied through the second transistor; and a second NOR circuit to which a signal of an output terminal of the second inverter circuit and a second capacitor control signal are input and whose output terminal is electrically connected to a second electrode of the second capacitor. In the semiconductor storage device, a first gate control signal is input to each gate of the first transistor and the third transistor, and a second gate control signal is input to a gate of the second transistor; the first data holding portion holds the data by bringing the first transistor and the second transistor out of conduction; the second data holding portion holds the data through the second transistor by bringing the second transistor and the third transistor out of conduction; the first NOR circuit changes a potential of the output terminal of the first NOR circuit by the signal of the output terminal of the first inverter circuit and the first capacitor control signal to control a potential of the first data holding portion by capacitive coupling through the first capacitor; and the second NOR circuit changes a potential of the output terminal of the second NOR circuit by the signal of the output terminal of the second inverter circuit and the second capacitor control signal to control a potential of the second data holding portion by capacitive coupling through the second capacitor.

In the embodiment of the present invention, it is preferable that, in the semiconductor storage device, a transistor included in each of the first inverter circuit, the second inverter circuit, the first NOR circuit, and the second NOR circuit be a transistor including a semiconductor layer containing silicon.

In the embodiment of the present invention, it is preferable that, in the semiconductor storage device, the transistor including a semiconductor layer containing silicon and the first to third transistors be stacked.

In the embodiment of the present invention, it is preferable that, in the semiconductor storage device, the first to third transistors be each a transistor including a semiconductor layer containing an oxide semiconductor.

In the embodiment of the present invention, it is preferable that, in the semiconductor storage device, the oxide semiconductor be an In—Sn—Zn-based oxide semiconductor.

According to one embodiment of the present invention, it is possible to provide a semiconductor storage device which stops and resumes the supply of power supply voltage without the necessity of saving and returning a data signal between a volatile storage device and a nonvolatile storage device.

BRIEF DESCRIPTION OF THE DRAWINGS

FIGS. 20A to 20C illustrate a structure of an oxide material according to one embodiment of the present invention.

DETAILED DESCRIPTION OF THE INVENTION

Figure 1A:
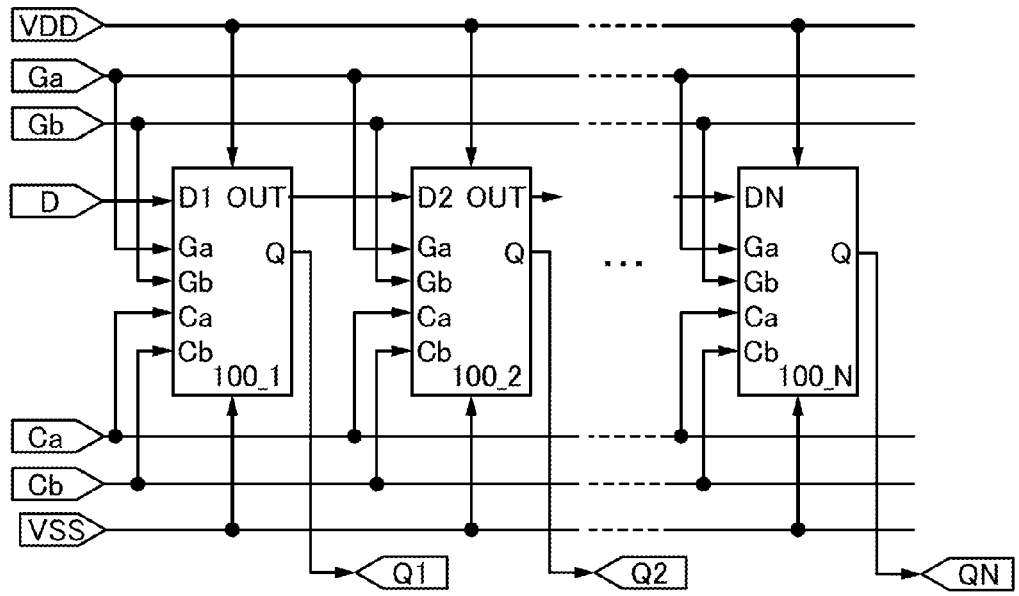
FIGS. 1A and 1B are circuit diagrams of a semiconductor storage device.

Embodiments of the present invention will be described below with reference to the accompanying drawings. Note that the present invention can be carried out in many different modes, and it is easily understood by those skilled in the art that various changes and modifications can be made without departing from the spirit and scope of the present invention. Therefore, the present invention should not be interpreted as being limited to the description in the following embodiments. Note that in structures of the present invention described below, reference numerals denoting the same portions are used in common in different drawings.

Note that the size, the thickness of a layer, signal waveform, and a region in structures illustrated in the drawings and the like in the embodiments are exaggerated for simplicity in some cases. Therefore, the scale is not necessarily limited to that illustrated in the drawings and the like.

Note also that "connection" in this specification means electrical connection and corresponds to the state in which current, voltage, or potential can be supplied or transmitted. Therefore, a state of electrical connection means not only a state of direct connection but also a state of indirect connection through a circuit element such as a wiring, or a resistor, in which current, voltage, or a potential can be supplied or transmitted.

Note also that even when a circuit diagram shows independent components as if they are connected to each other, there is a case in which one conductive film has functions of a plurality of components such as a case in which part of a wiring also functions as an electrode. The term "connection" also means such a case where one conductive film has functions of a plurality of components.

The names of the "source (or source electrode)" and the "drain (or drain electrode)" included in the transistor interchange with each other depending on the polarity of the transistor or the levels of potentials applied to the respective electrodes. In general, in an n-channel transistor, an electrode to which a lower potential is applied is called a source (or source electrode), and an electrode to which a higher potential is applied is called a drain (or drain electrode). Further, in a p-channel transistor, an electrode to which a lower potential is applied is called a drain (or drain electrode), and an electrode to which a higher potential is applied is called a source (or source electrode).

In this specification, although connection relation of the transistor is described assuming that the source (or source electrode) and the drain (or drain electrode) are fixed in some cases for convenience, actually, the names of the source (or source electrode) and the drain (or drain electrode) interchange with each other depending on the relation of the potentials. Therefore, it is difficult to define which is the source (or the drain). Thus, in this document (a specification, claims, drawings, and the like), a region functioning as the source and the drain may not be called the source or the drain. In such a case, for example, one of the source and the drain may be referred to as a first terminal and the other thereof may be referred to as a second terminal. Alternatively, one of the source and the drain may be referred to as a first electrode and the other thereof may be referred to as a second electrode. Further alternatively, one of the source and the drain may be referred to as a source region and the other thereof may be called a drain region.

Note that in this specification, the terms "first", "second", "third", and "N-th" (N is a natural number) are used in order to avoid confusion between components and thus do not limit the number of the components.

[Embodiment 1]

A semiconductor storage device can be a circuit that functions as a register through cascade connection. In this embodiment, a configuration of a semiconductor storage device in a signal processing unit will be described.

Note that examples of the signal processing unit includes, in its category, a large scale integrated circuit (LSI) such as a CPU, a microprocessor, an image processing circuit, a digital signal processor (DSP), and a field programmable gate array (FPGA).

FIG. 1A is an example of a block diagram of a semiconductor storage device that functions as a register. FIG. 1A illustrates a semiconductor storage device 100 of this embodiment, where N (N is a natural number)-stage semiconductor storage devices (semiconductor storage devices 100_1 to 100_N) are connected in cascade and pulse signals Q1 to QN which are shifted sequentially are output. Whereas data D is input to an input terminal D1 in the first-stage semiconductor storage device, output signals OUT of the previous stages are supplied to input terminals D2 to DN in the second-stage to N-stage semiconductor storage devices.

To the semiconductor storage device of each stage, a first gate control signal Ga, a second gate control signal Gb, a first capacitor control signal Ca, and a second capacitor control signal Cb are input. In the configuration of this embodiment, even when the supply of power supply voltage by a high power supply potential VDD and a low power supply potential VSS (GND) is stopped at the timing when data is held, the data D which is taken into the semiconductor storage device can be held therein, and, in the case where the supply of power supply voltage is resumed, the semiconductor storage device can operate again after the output of the held data D.

Note that in this specification, stop of the supply of a signal or power supply voltage means that the supply of the signal or the power supply voltage to a wiring for supplying the signal or the power supply voltage is not performed. Note also that in this specification, resumption of the supply of a signal or power supply voltage means that the supply of the signal or the power supply voltage to a wiring for supplying the signal or the power supply voltage is resumed from a state where the supply of the signal or the power supply voltage has been stopped. Note also that in this specification, fixing of a signal means that, for example, an AC signal oscillated with a predetermined frequency is converted into a DC signal having a fixed potential such as a high power supply potential VDD or a low power supply potential VSS.

Figure 1B:
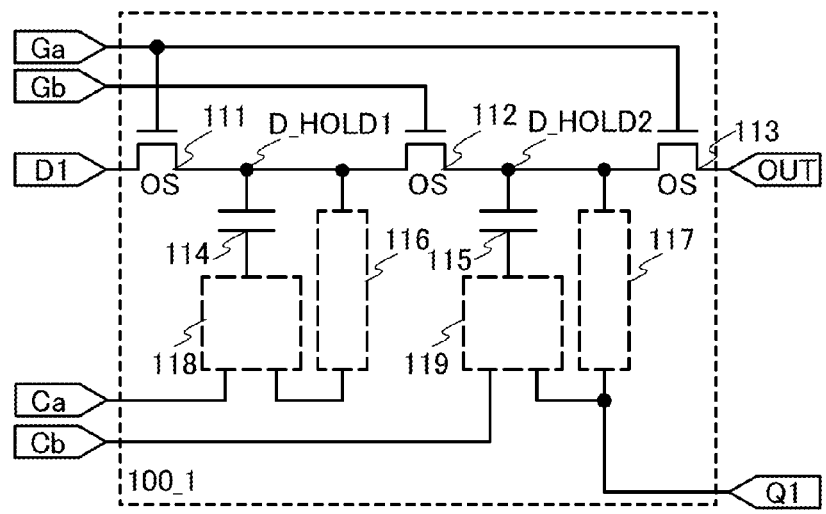

Next, in order to describe a specific circuit configuration, FIG. 1B illustrates a circuit configuration of the semiconductor storage device 100_1 in FIG. 1A. The semiconductor storage device 100_1 in FIG. 1B includes a first transistor 111, a second transistor 112, a third transistor 113, a first capacitor 114, a second capacitor 115, a first data potential holding and outputting circuit 116, a second data potential holding and outputting circuit 117, a first data potential control circuit 118, and a second data potential control circuit 119.

One (a first terminal) of a source and a drain of the first transistor 111 is connected to a data signal line to which the data D is supplied. The other (a second terminal) of the source and the drain of the first transistor 111 is connected to a first terminal of the second transistor 112 and a first electrode of the first capacitor 114. A gate of the first transistor 111 is connected to a wiring for supplying the first gate control signal Ga. A gate of the second transistor 112 is connected to a wiring for supplying the second gate control signal Gb. A wiring where the first transistor 111, the second transistor 112, and the first capacitor 114 are connected to one another is a wiring for holding data which is supplied through the first transistor 111 and is also referred to as a first data holding portion D_HOLD1 in the following description.

The first data potential holding and outputting circuit 116 is connected to the first data holding portion D_HOLD1. The first data potential holding and outputting circuit 116 includes a transistor and outputs a signal in response to a signal applied to a gate of the transistor. As the first data potential holding and outputting circuit 116, an inverter circuit or a buffer circuit including a complementary transistor can be used. The signals are input and output by controlling the outputs of the potentials of the power supply voltages through a channel formation region of the transistor, with an insulating film including a gate insulating film provided between the gate and the channel formation region.

The first data potential control circuit 118 is connected to a second electrode of the first capacitor 114. The first data potential control circuit 118 controls the potential of the second electrode of the first capacitor 114 in response to the first capacitor control signal Ca and an output signal of the first data potential holding and outputting circuit 116. When the first data holding portion D_HOLD1 is in an electrically floating state by controlling the potential of the second electrode of the first capacitor 114 in the first data potential control circuit 118, the potential of the first data holding portion D_HOLD1 can be controlled without leaking electric charge by capacitive coupling through the first capacitor 114.

A second terminal of a source and a drain of the second transistor 112 is connected to a first terminal of the third transistor 113 and a first electrode of the second capacitor 115. A gate of the third transistor 113 is connected to the wiring for supplying the first gate control signal Ga. A wiring where the second transistor 112, the third transistor 113, and the second capacitor 115 are connected to one another is a wiring for holding data which is supplied through the second transistor 112 and is also referred to as a second data holding portion D_HOLD2 in the following description.

The second data potential holding and outputting circuit 117 is connected to the second data holding portion D_HOLD2. The second data potential holding and outputting circuit 117 includes a transistor and outputs a signal in response to a signal applied to a gate of the transistor. As the second data potential holding and outputting circuit 117, an inverter circuit or a buffer circuit including a complementary transistor is used. The signals are input and output by controlling the outputs of the potentials of the power supply voltages through a channel formation region of the transistor, with an insulating film including a gate insulating film provided between the gate and the channel formation region.

The second data potential control circuit 119 is connected to a second electrode of the second capacitor 115. The second data potential control circuit 119 controls the potential of the second electrode of the second capacitor 115 in response to the second capacitor control signal Cb and an output signal of the second data potential holding and outputting circuit 117. When the second data holding portion D_HOLD2 is in an electrically floating state by controlling the potential of the second electrode of the second capacitor 115 in the second data potential control circuit 119, the potential of the second data holding portion D_HOLD2 can be controlled without leaking electric charge by capacitive coupling through the second capacitor 115.

As also illustrated in FIG. 1B, the first data holding portion D_HOLD1 is connected to the first transistor 111, the second transistor 112, the first capacitor 114, and the first data potential holding and outputting circuit 116. The first capacitor 114 and the first data potential holding and outputting circuit 116 are each an element in which signals are input and output through an insulating film; therefore, leakage of electric charge from the first capacitor 114 and the first data potential holding and outputting circuit 116 hardly occurs in the first data holding portion D_HOLD1. Therefore, the potential of the first data holding portion D_HOLD1 can be held by reducing as much as possible the off-state current in the case where the first transistor 111 and the second transistor 112 are in a non-conductive state.

As also illustrated in FIG. 1B, the second data holding portion D_HOLD2 is connected to the second transistor 112, the third transistor 113, the second capacitor 115, and the second data potential holding and outputting circuit 117. The second capacitor 115 and the second data potential holding and outputting circuit 117 are each an element in which signals are input and output through an insulating film; therefore, leakage of electric charge from the second capacitor 115 and the second data potential holding and outputting circuit 117 hardly occurs in the second data holding portion D_HOLD2. Therefore, the potential of the second data holding portion D_HOLD2 can be held by reducing as much as possible the off-state current in the cases where the second transistor 112 and the third transistor 113 are in a non-conductive state.

In this embodiment, a transistor whose channel is formed in an oxide semiconductor layer is used as each of the first transistor 111, the second transistor 112, and the third transistor 113 in order to reduce as much as possible the off-state current in the case where the transistors are in a non-conductive state. In drawings, "OS" is written in order to indicate that the first transistor 111, the second transistor 112, and the third transistor 113 are each a transistor whose channel is formed in an oxide semiconductor layer.

An oxide semiconductor includes at least one element selected from In, Ga, Sn, and Zn. For example, a four-component metal oxide such as an In—Sn—Ga—Zn-based oxide semiconductor; a three-component metal oxide such as an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, or a Sn—Al—Zn-based oxide semiconductor; a two-component metal oxide such as an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, an In—Mg-based oxide semiconductor, or an In—Ga-based oxide semiconductor; or a one-component metal oxide such as an In-based oxide semiconductor, a Sn-based oxide semiconductor, or a Zn-based oxide semiconductor can be used. In addition, any of the above oxide semiconductors may contain an element other than In, Ga, Sn, and Zn, for example, $SiO_2$.

As another element, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, an In—Ga—Zn-based oxide semiconductor means an oxide semiconductor containing indium (In), gallium (Ga), and zinc (Zn), and there is no limitation on the composition ratio thereof. In particular, in the case where an In—Sn—Zn-based oxide semiconductor is used for an oxide semiconductor film, the mobility of the transistor can be increased. Further, the use of an In—Sn—Zn-based oxide semiconductor for the transistor allows the threshold voltage of the transistor to be stably controlled.

As the oxide semiconductor, a thin film represented by the chemical formula, $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

In the case where an In—Zn-based material is to be used as an oxide semiconductor, a target therefor has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio (In$_2$O$_3$:ZnO=10:1 to 1:2 in a molar ratio), more preferably In:Zn=1.5:1 to 15:1 in an atomic ratio (In$_2$O$_3$:ZnO=3:4 to 15:2 in a molar ratio). For example, in a target used for forming an In—Zn-based oxide semiconductor having an atomic ratio of In:Zn:O=X:Y:Z, the relation of Z>1.5X+Y is satisfied.

In the case where the In—Sn—Zn-based oxide semiconductor is used, a target may have a composition ratio of In:Sn:Zn=1:2:2, In:Sn:Zn=2:1:3, or In:Sn:Zn=1:1:1 in an atomic ratio, for example.

The composition is not limited to those described above, and a material having an appropriate composition may be used depending on required semiconductor characteristics (e.g., mobility, threshold voltage, and variation). In order to obtain required semiconductor characteristics, it is preferable that the carrier concentration, the impurity concentration, the defect density, the atomic ratio of a metal element to oxygen, the interatomic distance, the density, and the like be set to appropriate values.

For example, high mobility can be obtained relatively easily in the case of using the In—Sn—Zn-based oxide semiconductor. However, mobility can be increased by reducing the defect density in a bulk also in the case of using an In—Ga—Zn-based oxide semiconductor.

The oxide semiconductor may be either single crystal or non-single-crystal. In the latter case, the oxide semiconductor may be amorphous but is preferably polycrystal. This is because high mobility can be expected when the oxide semiconductor is polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor is preferably formed over a surface with the average surface roughness (R$_a$) of less than or equal to 1 nm, more preferably less than or equal to 0.3 nm, further preferably less than or equal to 0.1 nm.

Note that R$_a$ is obtained by three-dimension expansion of center line average roughness that is defined by JIS B 0601 to be applied to a plane. The R$_a$ can be expressed as an "average value of the absolute values of deviations from a reference surface to a specific surface" and is defined by the formula below.

$$Ra = \frac{1}{S_0} \int_{y_1}^{y_2} \int_{x_1}^{x_2} |f(x, y) - Z_0| dx dy$$

In the above formula, S$_0$ represents an area of a plane to be measured (a rectangular region which is defined by four points represented by coordinates (x$_1$, y$_1$), (x$_1$, y$_2$), (x$_2$, y$_1$), and (x$_2$, y$_2$)), and Z$_0$ represents an average height of the plane to be measured. R$_a$ can be measured using an atomic force microscope (AFM).

The off-state current density of a transistor whose channel is formed in an oxide semiconductor layer that is highly purified by thorough removal of hydrogen contained in the oxide semiconductor layer can be less than or equal to 100 zA/μm, preferably less than or equal to 10 zA/μm, more preferably less than or equal to 1 zA/μm. Thus, the off-state current of the transistor is extremely lower than that of a transistor including silicon with crystallinity. Consequently, the potential of the first data holding portion D_HOLD1 and the potential of the second data holding portion D_HOLD2 can be held for a long time when the first transistor 111, the second transistor 112, and the third transistor 113 are in a non-conductive state.

Note that in this specification, an off-state current is a current which flows between a source and a drain when a transistor is in a non-conductive state. In the case of an n-channel transistor (e.g., with a threshold voltage of about 0 V to 2 V), the off-state current means a current which flows between a source and a drain when a negative voltage is applied between a gate and the source.

A material which can realize off-state current characteristics equivalent to those of the oxide semiconductor material may be used instead of the oxide semiconductor material. For example, a wide gap material like silicon carbide (more specifically, a semiconductor material whose energy gap Eg is larger than 3 eV) can be used. Further, a MEMS switch or the like may be used instead of a transistor to break connection between wirings, whereby electric charge in the first data holding portion D_HOLD1 and electric charge in the second data holding portion D_HOLD2 can be held for a long time.

Figure 2:
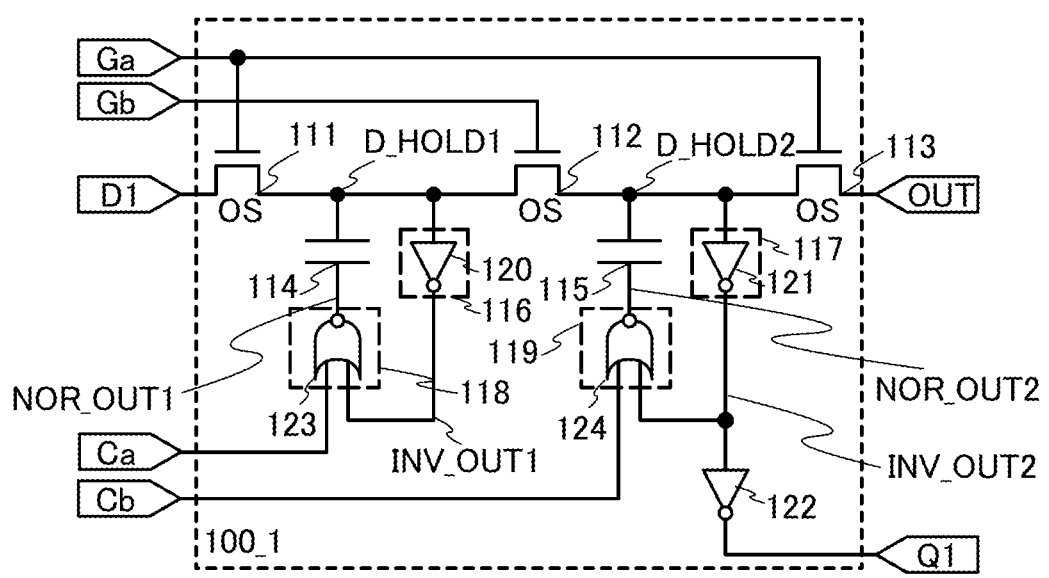
FIG. 2 is a circuit diagram of a semiconductor storage device.

Next, FIG. 2 is a circuit diagram illustrating a specific example of the first data potential holding and outputting circuit 116, the second data potential holding and outputting circuit 117, the first data potential control circuit 118, and the second data potential control circuit 119 in FIG. 1B.

In FIG. 2, a third inverter circuit 120 is included in the first data potential holding and outputting circuit 116. Without changing the potential of the data held in the first data holding portion D_HOLD1, the third inverter circuit 120 can output a signal of the data whose logic is inverted. Note that an output signal of the third inverter circuit 120 can be referred to as a "first data inverted signal INV_OUT1" in the description below.

In FIG. 2, a first inverter circuit 121 is included in the second data potential holding and outputting circuit 117. Without changing the potential of the data held in the second data holding portion D_HOLD2, the first inverter circuit 121 can output a signal whose logic is to the inverted logic of the data. Note that an output signal of the first inverter circuit 121 can be referred to as a "second data inverted signal INV_OUT2" in the description below.

Each of the third inverter circuit 120 and the first inverter circuit 121 in FIG. 2 can have a circuit configuration in which a p-channel transistor and an n-channel transistor are used in combination, for example. Note that in the case where the third inverter circuit 120 and the first inverter circuit 121 are used, the second data inverted signal INV_OUT2 can be input to a second inverter circuit 122 and a pulse signal Q1 can be output therefrom to be a signal whose logic is the inverted logic of the second data inverted signal INV_OUT2.

In FIG. 2, a first NOR circuit 123 is included in the first data potential control circuit 118. The first NOR circuit 123 outputs, to the second electrode of the first capacitor 114, a signal whose logic is obtained by NOR of the first data inverted signal INV_OUT1 and the first capacitor control signal Ca. Note that when the first data holding portion D_HOLD1 is in an electrically floating state and the first transistor 111 and the second transistor 112 are in a non-conductive state, the potential of the data held in the first data holding portion D_HOLD1 can be changed by changing the potential of the second electrode of the first capacitor 114. Note that an output signal of the first NOR circuit 123 is referred to as a "first NOR output signal NOR_OUT1" in the description below.

In FIG. 2, a second NOR circuit 124 is included in the second data potential control circuit 119. The second NOR circuit 124 outputs, to the second electrode of the second capacitor 115, a signal whose logic is obtained by NOR of the second data inverted signal INV_OUT2 and the second capacitor control signal Cb. Note that when the second data holding portion D_HOLD2 is in an electrically floating state and the second transistor 112 and the third transistor 113 are in a non-conductive state, the potential of the data held in the second data holding portion D_HOLD2 can be changed by changing the potential of the second electrode of the second capacitor 115. Note that an output signal of the second NOR circuit 124 is referred to as a "second NOR output signal NOR_OUT2" in the description below.

Each of the first NOR circuit 123 and the second NOR circuit 124 in FIG. 2 can have a circuit configuration in which a p-channel transistor and an n-channel transistor are used in combination, for example.

Transistors included in the third inverter circuit 120, the first inverter circuit 121, the first NOR circuit 123, and the second NOR circuit 124 in FIG. 2 can each be a transistor whose channel is formed in a layer or a substrate composed of a semiconductor other than an oxide semiconductor. For example, a transistor whose channel is formed in a silicon layer or a silicon substrate can be used.

Figure 3:
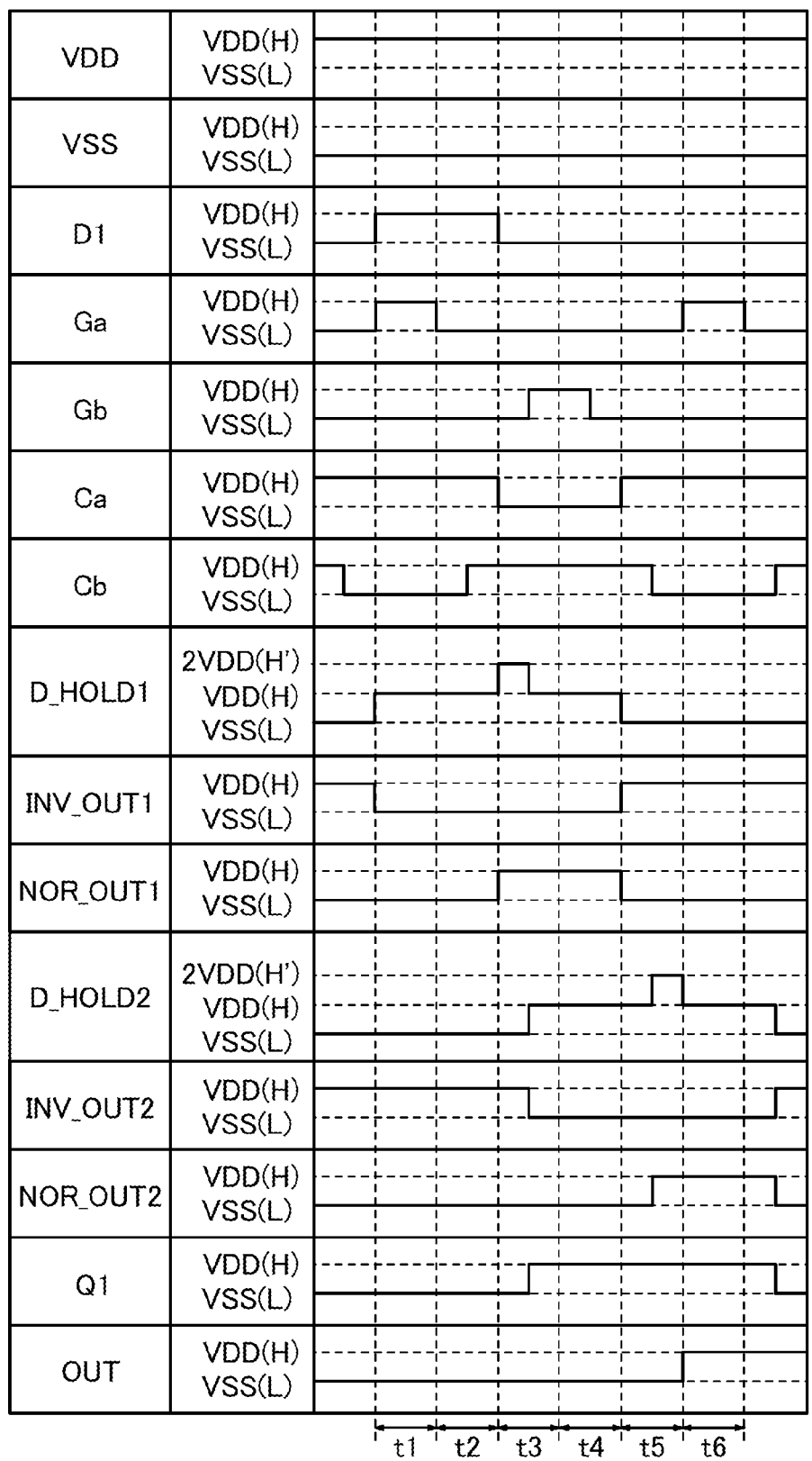
FIG. 3 is a timing chart showing the operation of a semiconductor storage device.

Next, operation of the semiconductor storage device which is performed while pulse signals are output will be described. FIG. 3 is a timing chart of the semiconductor storage device in FIG. 2, and description of the operation will be given with reference to the timing chart. In the timing chart of FIG. 3, VDD, VSS, D1, Ga, Gb, Ca, Cb, D_HOLD1, INV_OUT1, NOR_OUT1, D_HOLD2, INV_OUT2, NOR_OUT2, Q1, and OUT correspond to the potentials of the input and the output signals, the terminals, and the wirings which are described in FIG. 2. In the timing chart of FIG. 3, for the description of a plurality of possible states of the semiconductor storage device 100_1, a plurality of periods (periods t1 to t6) are shown with reference to FIGS. 4A and 4B, FIGS. 5A and 5B, and FIGS. 6A and 6B.

In the description of the operation in FIG. 3 below, transistors have the same conductivity types and logic circuits as the respective transistors illustrated in FIG. 2. Note that in the following description, the transistors do not necessarily have such conductivity types and logic circuits, and the conductivity type of each of the transistors, combination of the logic circuits, and the potential of each control signal can be determined as appropriate as long as the transistors perform the same operation in their conductive states. Each signal can be represented by an H signal (a high power supply potential VDD) and an L signal (a low power supply potential VSS). In the following description, the potential of the first data holding portion D_HOLD1 and the potential of the second data holding portion D_HOLD2 which are increased by capacitive coupling are each indicated by an "H' potential" (also referred to as 2VDD). Note that in the description of FIG. 3, FIGS. 4A and 4B, FIGS. 5A and 5B, and FIGS. 6A and 6B, the potential of the first data holding portion D_HOLD1 and the potential of the second data holding portion D_HOLD2 are each an L signal in an initial state.

Note that although each signal is described as an H signal or an L signal in the description of the timing chart, a potential of an H signal and an L signal may be different depending on the signals. For example, a decrease in potential, which corresponds to the threshold voltages of the first transistor 111, the second transistor 112, and the third transistor 113, can be suppressed by increasing H signals of the first gate control signal Ga and the second gate control signal Gb than an H signal of the data signal D.

The operation in the period t1 in FIG. 3 will be described. The period t1 is a period in which data of an H signal is taken into the first data holding portion D_HOLD1 from the data signal line.

Figure 4A:
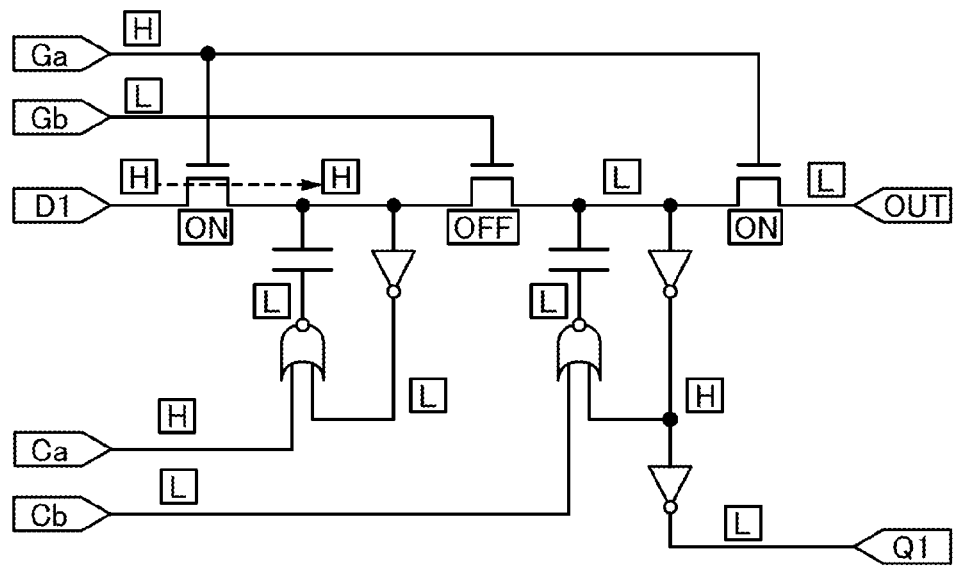
FIGS. 4A and 4B illustrate the operation of a semiconductor storage device.

FIG. 4A illustrates conductive states of the transistors and a flow of a current which is made visible in a dotted-line arrow in the semiconductor storage device 100_1 in the period t1. Note that in the description of FIGS. 4A and 4B, FIGS. 5A and 5B, and FIGS. 6A and 6B, whereas "ON" is written to indicate that a transistor is in a conductive state, "OFF" is written to indicate that a transistor is in a non-conductive state. Further, in the description of FIGS. 4A and 4B, FIGS. 5A and 5B, and FIGS. 6A and 6B, "H" and "L" which correspond to an H signal and an L signal of the potentials of the input and output signals and the wirings, respectively, are also written.

In the period t1, the first transistor 111 is brought into conduction by setting the first gate control signal Ga to an H signal. Then, an H signal is taken into the first data holding portion D_HOLD1 from the data signal line. In addition, the second transistor 112 is brought out of conduction by setting the second gate control signal line Gb to an L signal. At this time, the potential of the second data holding portion D_HOLD2 remains an L signal. Further, the third transistor 113 is brought into conduction by setting the first gate control signal Ga to the H signal. Furthermore, the L signal of the second data holding portion D_HOLD2 is output as an output signal OUT.

In the period t1, when the potential of the first data holding portion D_HOLD1 is the H signal, the first data inverted signal INV_OUT1 becomes an L signal. In addition, when the potential of the second data holding portion D_HOLD2 is the L signal, the second data inverted signal INV_OUT2 becomes an H signal. Further, a pulse signal Q1 which is a signal whose logic is the inverted logic of the second data inverted signal INV_OUT2 becomes an L signal.

In the period t1, the first capacitor control signal Ca is set to an H signal, and then the H signal and the L signal are input to the first NOR circuit 123. Consequently, the first NOR output signal NOR_OUT1 becomes an L signal. In the period t1, the second capacitor control signal Cb is set to an L signal, and then the L signal and the H signal are input to the second NOR circuit 124. Consequently, the second NOR output signal NOR_OUT2 becomes an L signal.

The operation in the period t2 in FIG. 3 will be described. The period t2 is a period in which data of an H signal is held in the first data holding portion D_HOLD1.

Figure 4B:
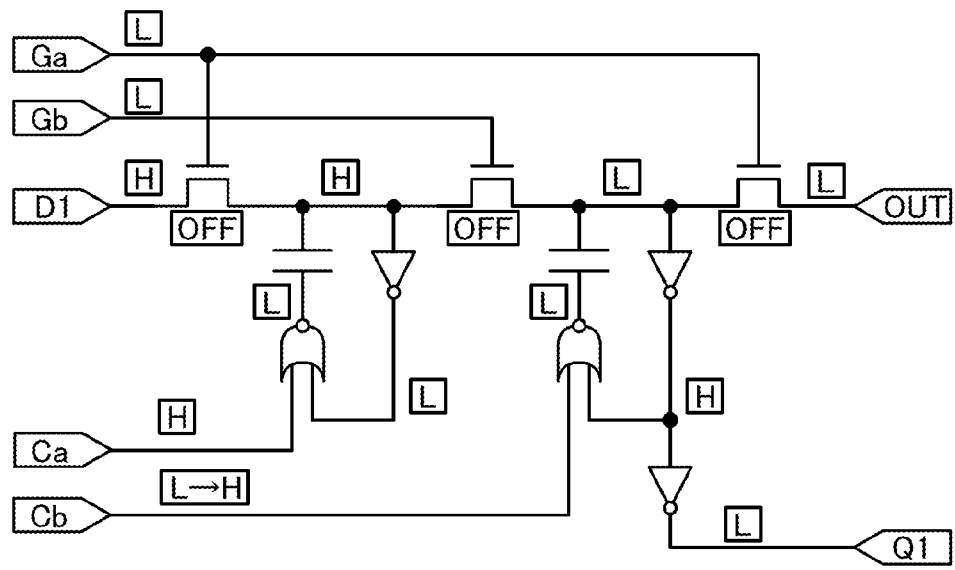

FIG. 4B illustrates conductive states of the transistors in the semiconductor storage device 100_1 in the period t2.

In the period t2, the first transistor 111 is brought out of conduction by setting the first gate control signal Ga to an L signal. At this time, the potential of the first data holding portion D_HOLD1 and the potential of the data signal line remain the H signals. In addition, the second transistor 112 is brought out of conduction by setting the second gate control signal line Gb to an L signal. At this time, the potential of the second data holding portion D_HOLD2 remains the L signal. Further, the third transistor 113 is brought out of conduction by setting the first gate control signal Ga to the L signal. Furthermore, the potential of an output signal OUT is an L signal.

In the period t2, when the potential of the first data holding portion D_HOLD1 is the H signal, the first data inverted signal INV_OUT1 becomes an L signal. In addition, when the potential of the second data holding portion D_HOLD2 is the L signal, the potential of the second data inverted signal INV_OUT2 becomes an H signal. Further, a pulse signal Q1 which is a signal whose logic is the inverted logic of the second data inverted signal INV_OUT2 becomes an L signal.

In the period t2, the first capacitor control signal Ca is set to an H signal, and then the H signal and the L signal are input to the first NOR circuit 123. Consequently, the first NOR output signal NOR_OUT1 becomes an L signal. In the period t2, the second capacitor control signal Cb is switched from an L signal to an H signal, and then the L signal and the H signal are input to the second NOR circuit 124 or the H signal and the H signal are input to the second NOR circuit 124. Consequently, the second NOR output signal NOR_OUT2 becomes an L signal.

The operation in the period t3 in FIG. 3 will be described. The period t3 is a period in which the H signal of the first data holding portion D_HOLD1 is taken into the second data holding portion D_HOLD2.

Figure 5A:
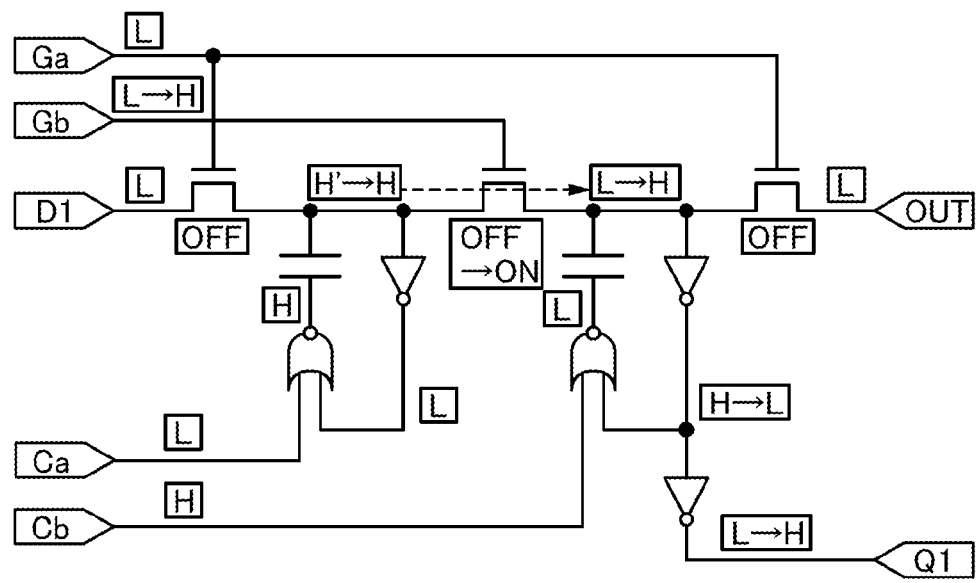
FIGS. 5A and 5B illustrate the operation of a semiconductor storage device.

FIG. 5A illustrates conductive states of the transistors and a flow of a current which is made visible in a dotted-line arrow in the semiconductor storage device 100_1 in the period t3.

In the period t3, first, the first transistor 111 and the second transistor 112 are brought out of conduction by setting the first gate control signal Ga and the second gate control signal Gb to an L signal and an L signal, respectively, whereby the first data holding portion D_HOLD1 is made in an electrically floating state. At this time, the potential of the second electrode of the first capacitor 114, which is connected to the first data holding portion D_HOLD1 in a floating state, is raised, and the potential of the first data holding portion D_HOLD1 is raised to an H' signal by utilization of the capacitive coupling through the first capacitor 114. Then, in the period t3, the second transistor 112 is brought into conduction from the non-conductive state by setting the second gate control signal Gb to an H signal from the L signal. At this time, electric charge in the first data holding portion D_HOLD1 moves to the second data holding portion D_HOLD2, whereby the potential of the first data holding portion D_HOLD1 becomes an H signal from the H' signal, and the potential of the second data holding portion D_HOLD2 becomes an H signal from an L signal.

In the period t3, the third transistor 113 is brought out of conduction by setting the first gate control signal Ga to the L signal. In addition, the potential of an output signal OUT is an L signal.

In the period t3, when the potential of the first data holding portion D_HOLD1 is the H signal or the H' signal, the first data inverted signal INV_OUT1 becomes an L signal. In addition, when the potential of the second data holding portion D_HOLD2 is switched from the L signal to an H signal, the second data inverted signal INV_OUT2 is switched from the H signal to an L signal. Further, a pulse signal Q1 which is a signal whose logic is the inverted logic of the second data inverted signal INV_OUT2 is switched from the L signal to an H signal.

In the period t3, the first capacitor control signal Ca is set to an L signal, and then both the L signals are input to the first NOR circuit 123. Consequently, the first NOR output signal NOR_OUT1 is switched from the L signal to an H signal. Therefore, as described above, the potential of the first data holding portion D_HOLD1, which is in an electrically floating state, is raised to the H' signal by the capacitive coupling through the first capacitor 114. In the period t3, the second capacitor control signal Cb is set to an H signal, and then the L signal and the H signal are input to the second NOR circuit 124 or the H signal and the H signal are input to the second NOR circuit 124. Consequently, the potential of the second NOR output signal NOR_OUT2 becomes an L signal.

The operation in the period t4 in FIG. 3 will be described. The period t4 is a period in which the data of the H signal is held in the second data holding portion D_HOLD2.

Figure 5B:
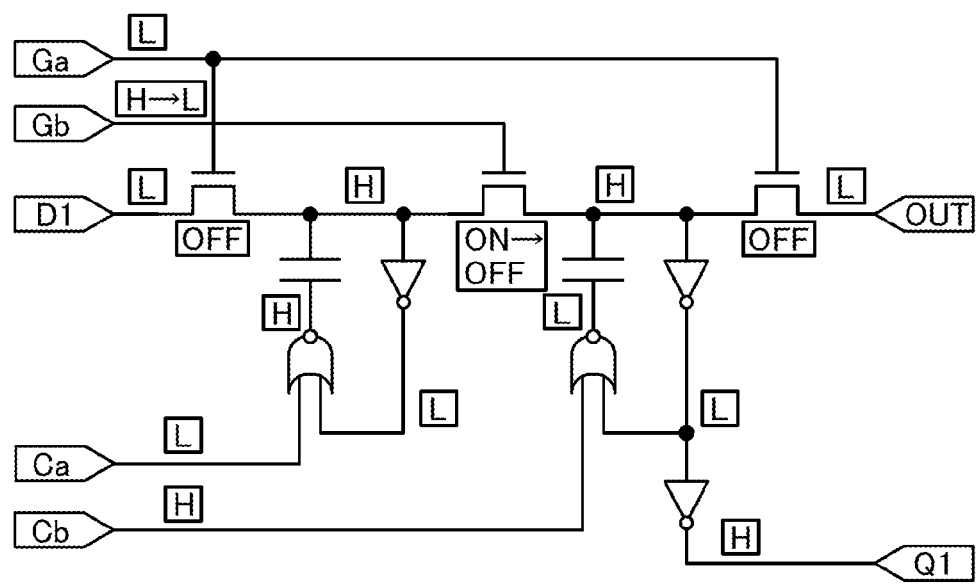

FIG. 5B illustrates conductive states of the transistors in the semiconductor storage device 100_1 in the period t4.

In the period t4, the first transistor 111 is brought out of conduction by setting the first gate control signal Ga to an L signal. At this time, the potential of the first data holding portion D_HOLD1 remains the H signal. The second transistor 112 is brought out of conduction from the conductive state by switching the second gate control signal Gb to an L signal from the H signal. At this time, the potential of the second data holding portion D_HOLD2 remains the H signal. Further, the third transistor 113 is brought out of conduction by setting the first gate control signal Ga to the L signal. Furthermore, the potential of an output signal OUT is an L signal.

In the period t4, when the potential of the first data holding portion D_HOLD1 is the H signal, the first data inverted signal INV_OUT1 becomes an L signal. In addition, when the potential of the second data holding portion D_HOLD2 is the H signal, the potential of the second data inverted signal INV_OUT2 becomes an L signal. Further, a pulse signal Q1 which is a signal whose logic is the inverted logic of the second data inverted signal INV_OUT2 becomes an H signal.

In the period t4, the first capacitor control signal Ca is set to an L signal, and then both the L signals are input to the first NOR circuit 123. Consequently, the first NOR output signal NOR_OUT1 becomes an H signal. In the period t4, the second capacitor control signal Cb is set to an H signal, and then the H signal and the L signal are input to the second NOR circuit 124. Consequently, the second NOR output signal NOR_OUT2 becomes an L signal.

The operation in the period t5 in FIG. 3 will be described. The period t5 is a period in which the data of the H signal in the first data holding portion D_HOLD1 is lowered to an L signal by utilization of the capacitive coupling through the first capacitor 114.

Figure 6A:
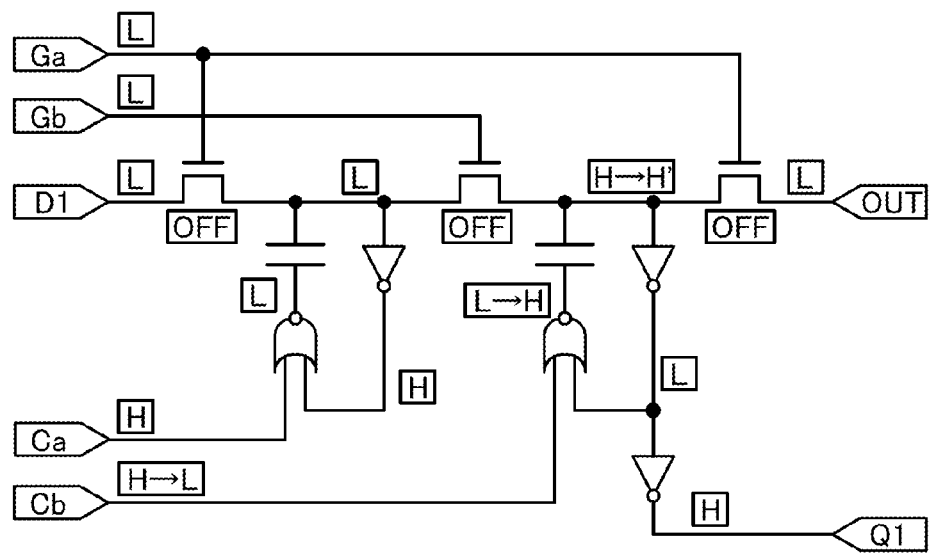
FIGS. 6A and 6B illustrate the operation of a semiconductor storage device.

FIG. 6A illustrates conductive states of the transistors in the semiconductor storage device 100_1 in the period t5.

In the period t5, the first transistor 111 and the second transistor 112 are brought out of conduction by setting the first gate control signal Ga and the second gate control signal Gb to an L signal and an L signal, respectively, whereby the first data holding portion D_HOLD1 is made in an electrically floating state. At this time, the potential of the second electrode of the first capacitor 114, which is connected to the first data holding portion D_HOLD1 in a floating state, is lowered, and the potential of the first data holding portion D_HOLD1 is lowered to an L signal by utilization of the capacitive coupling through the first capacitor 114.

In the period t5, the second transistor 112 and the third transistor 113 are brought out of conduction by setting the first gate control signal Ga and the second gate control signal Gb to the L signal and the L signal, respectively, whereby the second data holding portion D_HOLD2 is made in an electrically floating state. At this time, the potential of the second electrode of the second capacitor 115, which is connected to the second data holding portion D_HOLD2 in a floating state, is raised, and the potential of the second data holding portion D_HOLD2 is raised to an H' signal by utilization of the capacitive coupling through the second capacitor 115.

In the period t5, the third transistor 113 is brought out of conduction by setting the first gate control signal Ga to the L signal. In addition, the potential of an output signal OUT is an L signal.

In the period t5, when the potential of the first data holding portion D_HOLD1 is the L signal, the first data inverted signal INV_OUT1 becomes an H signal. In addition, when the potential of the second data holding portion D_HOLD2 is switched from the H signal to the H' signal, the second data inverted signal INV_OUT2 becomes an L signal. Further, a pulse signal Q1 which is a signal whose logic is the inverted logic of the second data inverted signal INV_OUT2 becomes an H signal.

In the period t5, the first capacitor control signal Ca is set to an H signal, and then both the H signals are input to the first NOR circuit 123. Consequently, the first NOR output signal NOR_OUT1 is switched from the H signal in the period t4 to an L signal. Therefore, as described above, the potential of the first data holding portion D_HOLD1, which is in an electrically floating state, is lowered to the L signal by the capacitive coupling through the first capacitor 114. In the period t5, the second capacitor control signal Cb is switched from the H signal to an L signal. Consequently, the potential of the second NOR circuit 124 is switched to a state in which both the L signals are input from the state in which the L signal and the H signal are input. Therefore, as described above, the potential of the second data holding portion D_HOLD2, which is in an electrically floating state, is raised to the H' signal by the capacitive coupling through the second capacitor 115.

The operation in the period t6 in FIG. 3 will be described. The period t6 is a period in which data of an H signal in the second data holding portion D_HOLD2 is output from an output signal OUT.

Figure 6B:
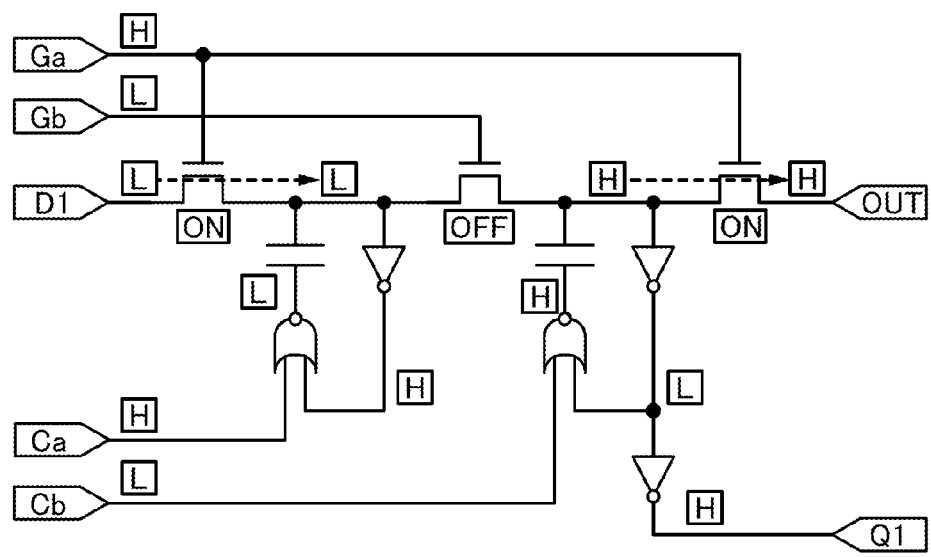

FIG. 6B illustrates conductive states of the transistors and flows of currents which are made visible in dotted-line arrows in the semiconductor storage device 100_1 in the period t6.

In the period t6, the first transistor 111 is brought into conduction by setting the first gate control signal Ga to an H signal. Then, an L signal is taken into the first data holding portion D_HOLD1 from the data signal line. In addition, the second transistor 112 is brought out of conduction by setting the second gate control signal line Gb to an L signal, and the third transistor 113 is brought into conduction by setting the first gate control signal Ga to the H signal. At this time, electric charge in the second data holding portion D_HOLD2 moves to the output signal OUT side, whereby the potential of the second data holding portion D_HOLD2 becomes an H signal from the H' signal, and the potential of the output signal OUT becomes an H signal.

In the period t6, when the potential of the first data holding portion D_HOLD1 is the L signal, the first data inverted signal INV_OUT1 becomes an H signal. In addition, when the potential of the second data holding portion D_HOLD2 is switched from the H' signal to the H signal, the second data inverted signal INV_OUT2 becomes an L signal. Further, a pulse signal Q1 whose logic is the inverted logic of the second data inverted signal INV_OUT2 becomes an H signal.

In the period t6, the first capacitor control signal Ca is set to an H signal, and then both the H signals are input to the first NOR circuit 123. Consequently, the first NOR output signal NOR_OUT1 becomes an L signal. In the period t6, the second capacitor control signal Cb is set to an L signal. Consequently, both the L signals are input to the second NOR circuit 124. Thus, the second NOR output signal NOR_OUT2 becomes an H signal.

The above is the description of the operation of the semiconductor storage device 100_1 which is performed while the pulse signals are output.

According to one embodiment of the present invention, at the time of manufacturing a nonvolatile semiconductor storage device, a volatile storage device and a nonvolatile storage device can be provided without separation. In the semiconductor storage device, a data signal is held in a data holding portion connected to a transistor including a semiconductor layer containing an oxide semiconductor and a capacitor. Consequently, the potential of the data signal held in the data holding portion can be controlled by a data potential holding circuit and a data potential control circuit, which enable output of pulse signals. The data potential holding circuit can output a data signal without leaking electric charge, and the data potential control circuit can control the potential of the data signal held in the data holding portion without leaking electric charge by capacitive coupling through the capacitor.

Figure 7:
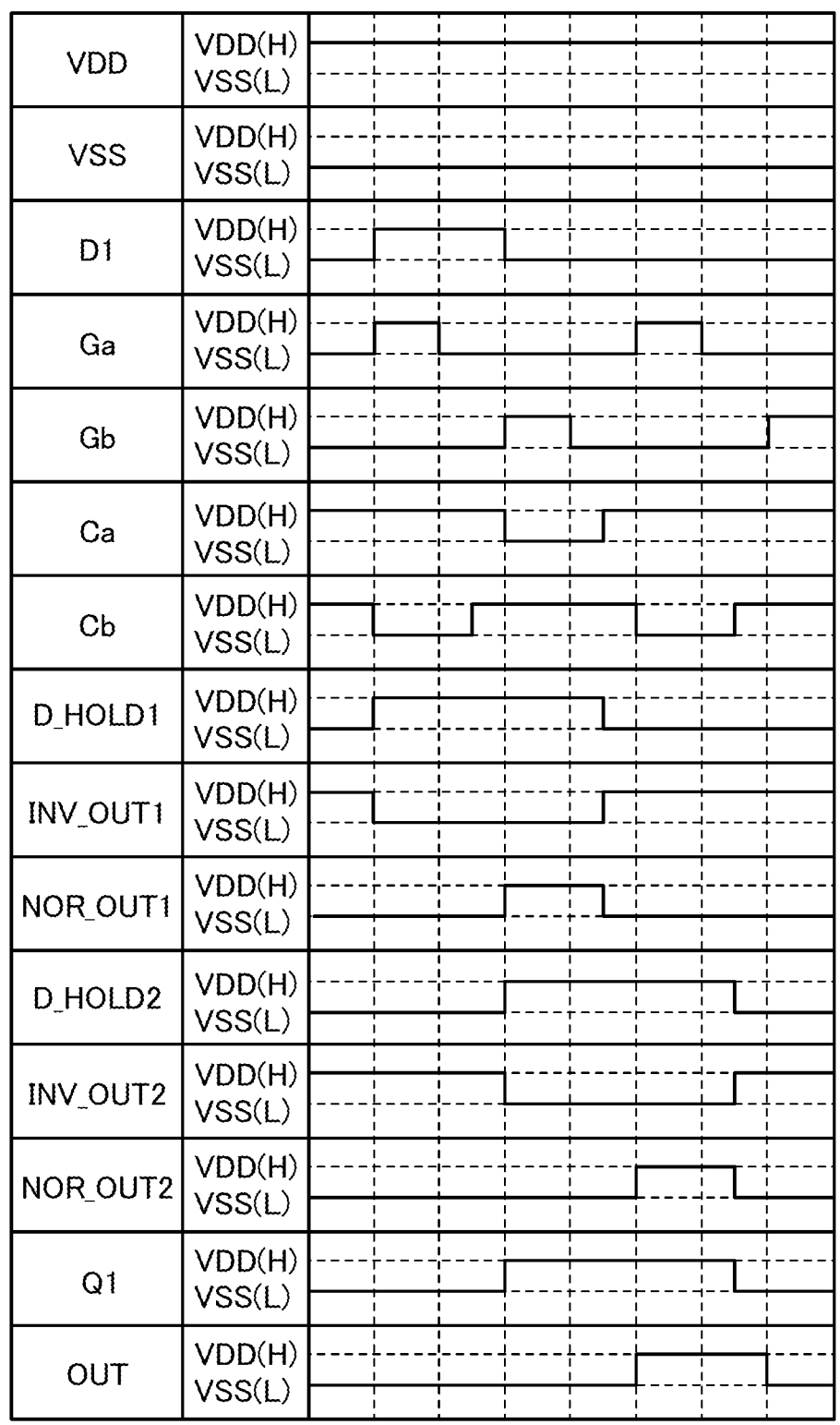
FIG. 7 is a timing chart showing the operation of a semiconductor storage device.

Note that the semiconductor storage device 100_1 in FIG. 2 can operate in a manner different from that in FIG. 3. For example, it is possible to operate the semiconductor storage device 100_1 in FIG. 2 as in a timing chart in FIG. 7. As illustrated in FIG. 7, a pulse signal Q can be obtained even when toggle operations of the first gate control signal Ga, the second gate control signal Gb, the first capacitor control signal Ca, and the second capacitor control signal Cb are performed in a manner different from that in FIG. 3

Figure 8A:
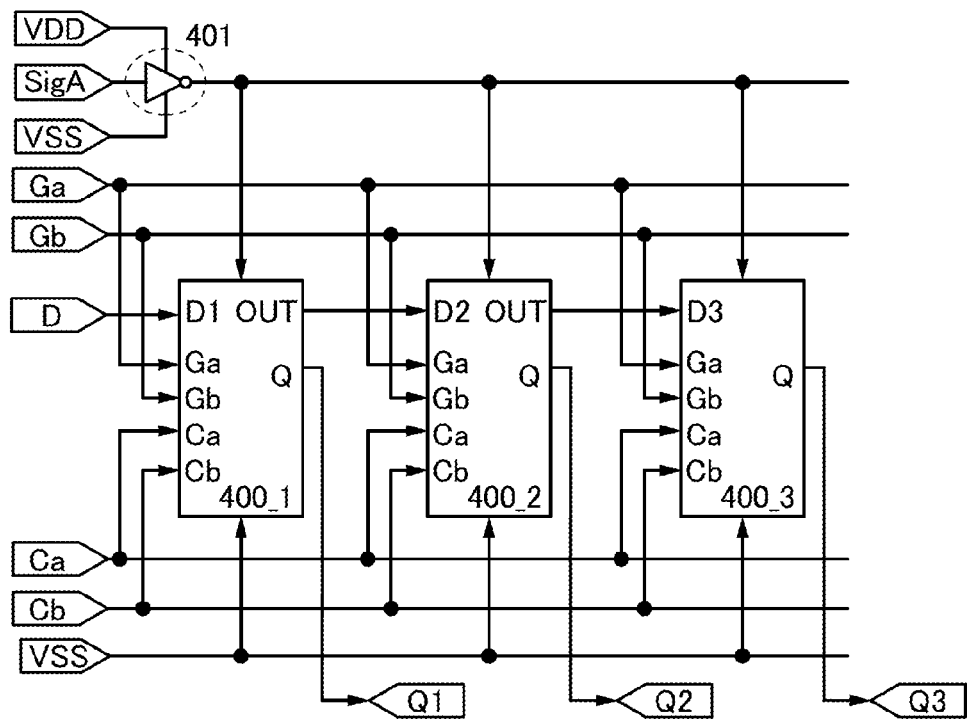
FIGS. 8A and 8B are circuit diagrams of a semiconductor storage device.

Next, operation performed while the supply of power supply voltage is stopped and resumed when the semiconductor storage device of this embodiment is operated will be described with reference to FIGS. 8A and 8B, FIGS. 9A and 9B, and FIG. 10. Specifically, in the following description, the N-stage semiconductor storage devices in FIG. 1A includes three stages of a semiconductor storage device 400_1, a semiconductor storage device 4002, and a semiconductor storage device 400_3 which are connected in cascade as illustrated in FIG. 8A. In the configuration of FIG. 8A, an inverter circuit 401 connected to a high power supply potential VDD and a low power supply potential VSS is provided for a wiring for supplying the high power supply potential VDD, and the high power supply potential VDD or the low power supply potential VSS, which is switched by a selection signal SigA, is applied to each of the semiconductor storage devices 400_1 to 400_3 through the inverter circuit 401.

Figure 8B:
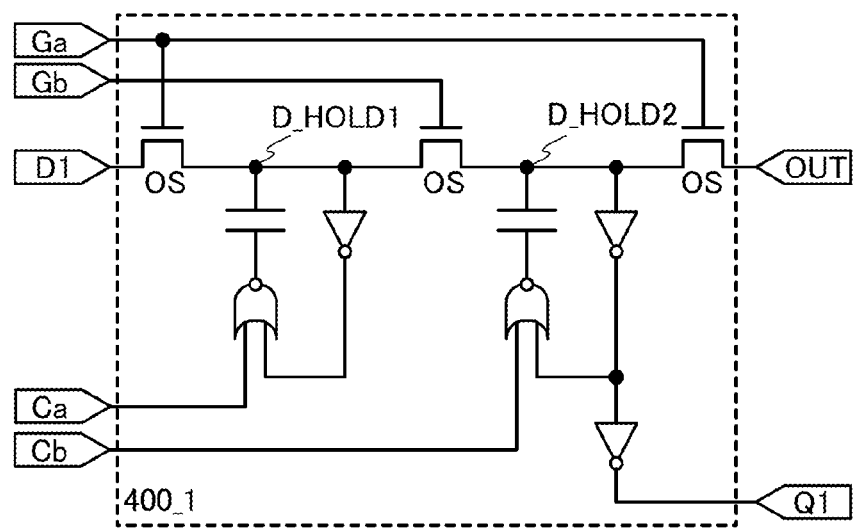
Figure 9A:
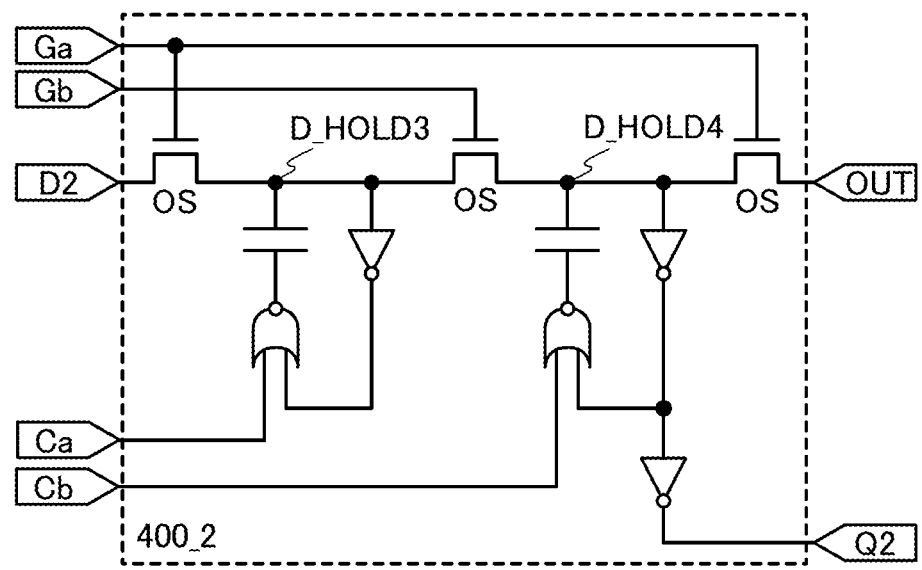
FIGS. 9A and 9B are circuit diagrams of a semiconductor storage device.
Figure 9B:
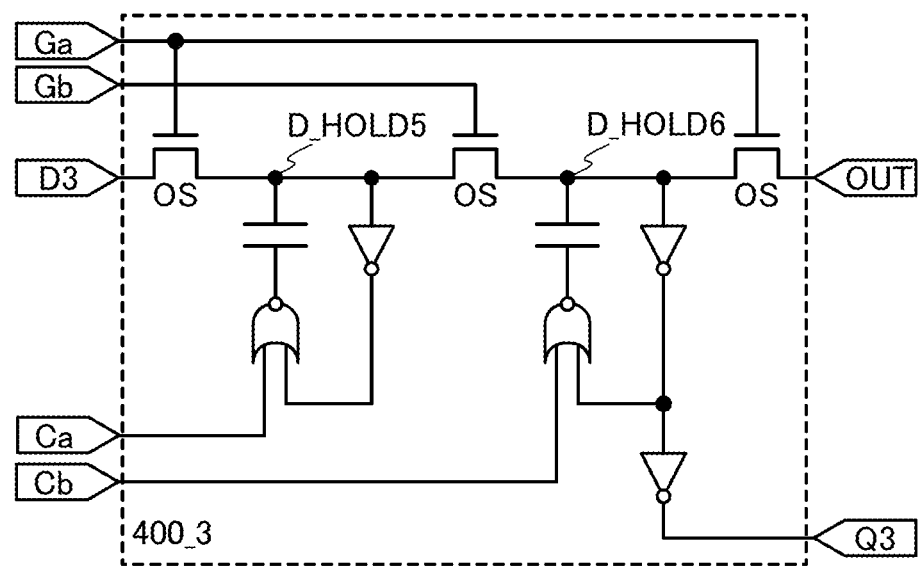
Figure 10:
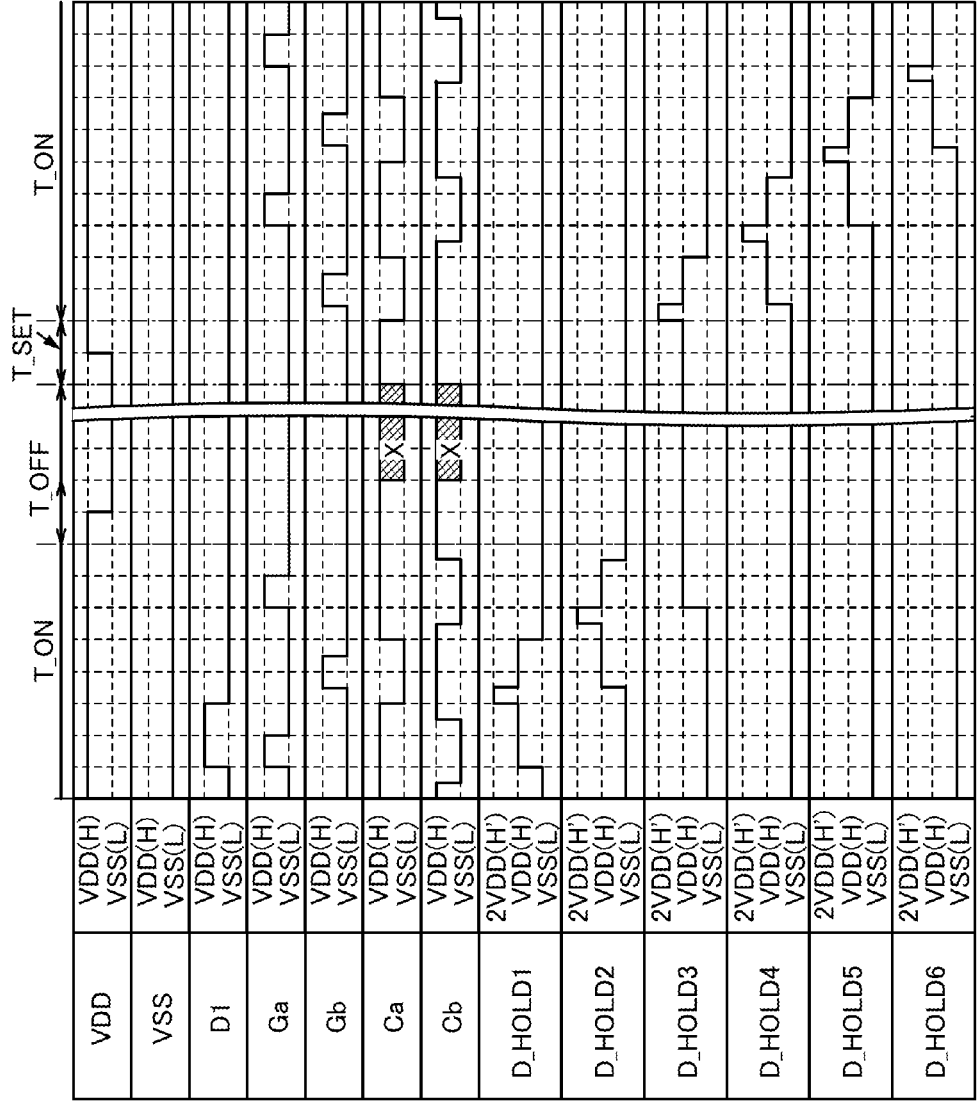
FIG. 10 is a timing chart showing the operation of a semiconductor storage device.

In a timing chart of FIG. 10 in which operation performed while the supply of power supply voltage is stopped and resumed is illustrated, a potential of a first data holding portion D_HOLD1 in the semiconductor storage device 400_1 is denoted by D_HOLD1 as illustrated in FIG. 8B. A potential of a second data holding portion D_HOLD2 in the semiconductor storage device 400_1 is denoted by D_HOLD2 as illustrated in FIG. 8B. A potential of a first data holding portion D_HOLD1 in the semiconductor storage device 400_2 is denoted by D_HOLD3 as illustrated in FIG. 9A. A potential of a second data holding portion D_HOLD2 in the semiconductor storage device 400_2 is denoted by D_HOLD4 as illustrated in FIG. 9A. A potential of a first data holding portion D_HOLD1 in the semiconductor storage device 400_3 is denoted by D_HOLD5 as illustrated in FIG. 9B. A potential of a second data holding portion D_HOLD2 in the semiconductor storage device 400_3 is denoted by D_HOLD6 as illustrated in FIG. 9B.

Next, operation performed while the supply of power supply voltage is stopped and operation when the supply of power supply voltage is stopped will be described with reference to the timing chart of FIG. 10. The description of FIG. 10 is made separately in the following periods: a period T_ON in which power supply voltage is supplied and a pulse signal is output from each of the semiconductor storage devices, a period T_OFF in which the supply of power supply voltage is stopped, and a period T_set until the period T_ON in which a pulse signal is output again after the supply of power supply voltage is resumed.

The operation during the period T_ON in FIG. 10 is similar to the operation described with reference to FIG. 3; thus, description thereof is omitted here.

Next, the operation during the period T_OFF in FIG. 10 will be described.

In the period T_OFF, first, each of a first gate control signal Ga and a second gate control signal Gb is fixed to an L signal. Thus, the potentials of the D_HOLD1 to D_HOLD6 are held. Next, the potential of the wiring for supplying a high power supply potential is set to a low power supply potential VSS in order to stop the supply of power supply voltage VDD. Then, the output of a first capacitor control signal Ca and a second capacitor control signal Cb are each in a restricted combination (a forbidden state).

Through the above operation, the supply of power supply voltage can be stopped without causing malfunction in the period T_OFF. Note that it is preferable to fix each of the first gate control signal Ga and the second gate control signal Gb to an L signal during a period in which the supply of power supply voltage is stopped.

Note that in the description of FIG. 10, a period of "X" with hatching is a period in a restricted combination, in which a signal is not supplied on the basis of the power supply potential of an H signal or an L signal.

Next, the operation during the period T_SET in FIG. 10 will be described.

In the period T_SET, first, each of the first capacitor control signal Ca and the second capacitor control signal Cb is fixed to an H signal. Thus, the potentials of the D_HOLD1 to D_HOLD6 are held in H signals or L signals. Next, the potential of the wiring for supplying a high power supply potential is set to a high power supply potential VDD in order to resume the supply of power supply voltage VDD. Then, toggle operations of the first gate control signal Ga, the second gate control signal Gb, the first capacitor control signal Ca, and the second capacitor control signal Cb are started and then the operation returns to the period T_ON in which operation similar to that described in FIG. 3 is performed.

The above is the description of the operation of the semiconductor storage device 100_1 which is performed while the supply of power supply voltage is stopped and resumed. Since a data signal can be held even after the supply of power supply voltage is stopped according to one embodiment of the present invention, outputs of pulse signals before the supply of power supply voltage is stopped can be continued when the supply of power supply voltage is resumed.

As described above, according to one embodiment of the present invention, at the time of manufacturing a nonvolatile semiconductor storage device, a volatile storage device and a nonvolatile storage device can be provided without separation. In the semiconductor storage device, a data signal is held in a data holding portion connected to a transistor including a semiconductor layer containing an oxide semiconductor and a capacitor. Consequently, the potential of data signal held in the data holding portion can be controlled by a data potential holding circuit and a data potential control circuit, which enable output of pulse signals. The data potential holding circuit can output a data signal without leaking electric charge, and the data potential control circuit can control the potential of the data signal held in the data holding portion without leaking electric charge by capacitive coupling through the capacitor. Moreover, since a data signal can be held even after the supply of power supply voltage is stopped according to one embodiment of the present invention, outputs of pulse signals before the supply of power supply voltage is stopped can be continued when the supply of power supply voltage is resumed.

This embodiment can be combined with any of the other embodiments as appropriate.

[Embodiment 2]

In this embodiment, a modified example of the semiconductor storage device described above in Embodiment 1 will be described.

Figure 11A:
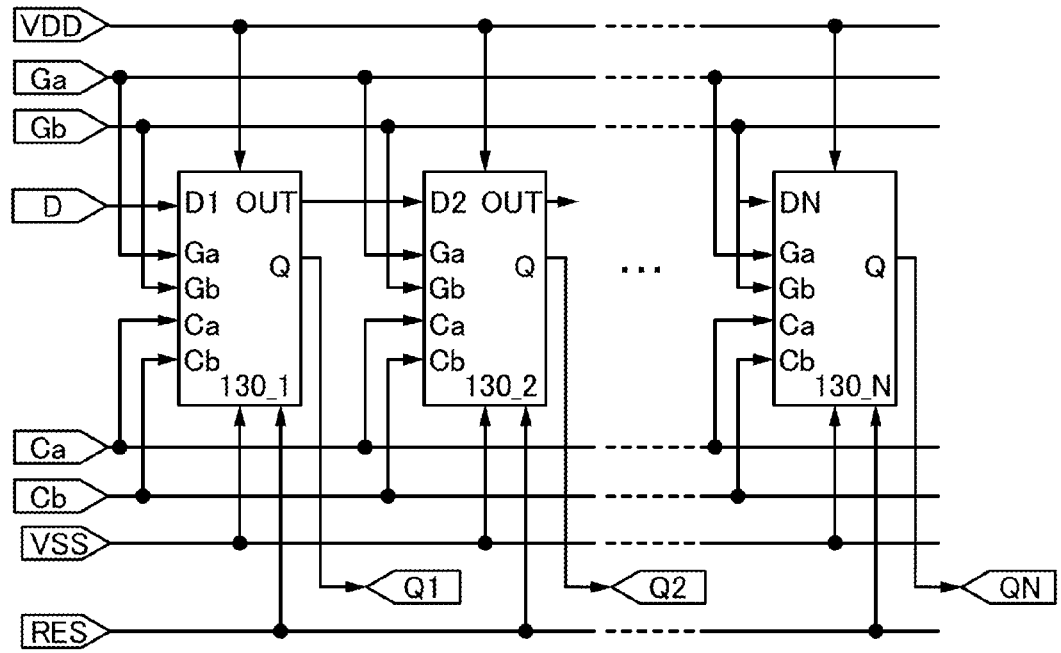
FIGS. 11A and 11B are circuit diagrams of a semiconductor storage device.

A modified example of the semiconductor storage device, in which a reset circuit for initializing the potential of the first data holding portion D_HOLD1 and the potential of the second data holding portion D_HOLD2 is provided, can be given. A specific circuit configuration thereof is illustrated in FIG. 11A. FIG. 11A illustrates semiconductor storage devices 130_1 to 130_N in which a reset signal RES is supplied from a wiring for supplying a reset signal RES to each of the semiconductor storage devices 100_1 to 100_N in FIG. 1A.

Figure 11B:
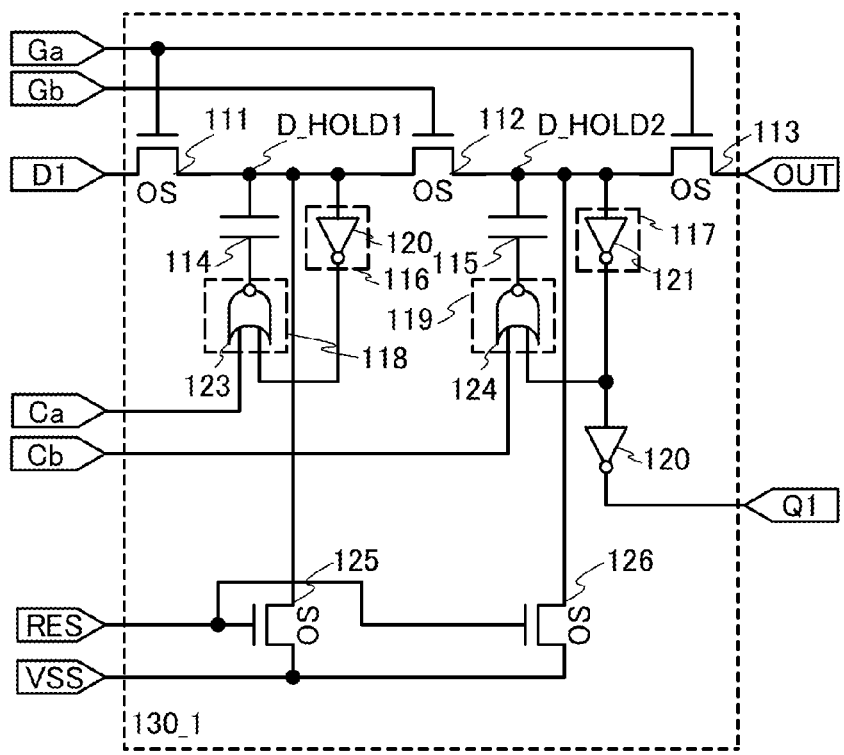

An example of a specific circuit configuration of the semiconductor storage device 130_1 is illustrated in FIG. 11B. The circuit diagram in FIG. 11B includes a first reset transistor 125 and a second reset transistor 126 in addition to the circuit configuration in FIG. 1B.

A first terminal of the first reset transistor 125 is connected to the first data holding portion D_HOLD1. A second terminal of the first reset transistor 125 is connected to a wiring for supplying a low power supply potential VSS. A first terminal of the second reset transistor 126 is connected to the second data holding portion D_HOLD2. A second terminal of the second reset transistor 126 is connected to the wiring for supplying a low power supply potential VSS. A gate of the first reset transistor 125 and a gate of the second reset transistor 126 are connected to the wiring for supplying a reset signal RES.

Note that in a manner similar to that of the first to third transistors, a transistor whose channel is formed in an oxide semiconductor layer is used as each of the first reset transistor 125 and the second reset transistor 126 in order to reduce as much as possible the off-state current in the case where the transistors are in a non-conductive state. In drawings, "OS" is written in order to indicate that the first reset transistor 125 and the second reset transistor 126 are each a transistor whose channel is formed in an oxide semiconductor layer.

Note that the reset signal RES operates in a non-conductive state except during initialization operation in which the potential of the first data holding portion D_HOLD1 and the potential of the second data holding portion D_HOLD2 are each set to an L signal. A transistor whose channel is formed in an oxide semiconductor layer is used for each of the first reset transistor 125 and the second reset transistor 126, whereby leakage of electric charge from the first data holding portion D_HOLD1 and the second data holding portion D_HOLD2 can be made to occur hardly.

Another modified example of the semiconductor storage device, in which a logic circuit is provided for each gate of the first transistor, the second transistor, and the third transistor, can be given. In this circuit configuration, which will be described below, the operation is performed in a manner similar to that in the circuit configuration in FIG. 1B.

Figure 12:
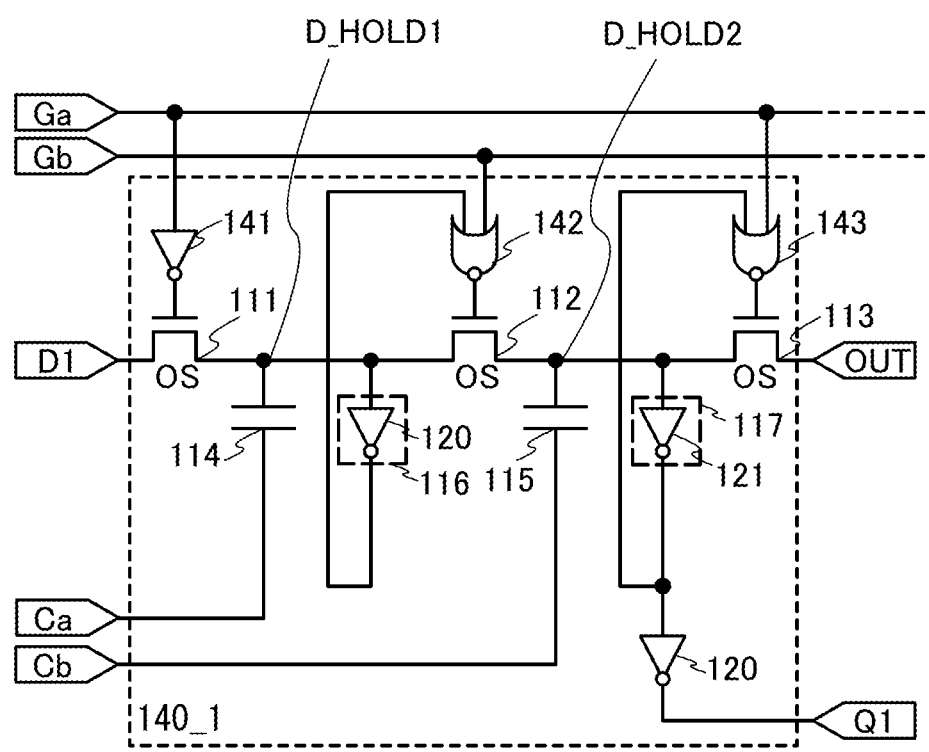
FIG. 12 is a circuit diagram of a semiconductor storage device.

A specific circuit configuration of a semiconductor storage device 140_1 is illustrated in FIG. 12. In FIG. 12, a gate-controlling inverter circuit 141 to which the first gate control signal Ga is input is provided for the gate of the first transistor 111. In addition, in FIG. 12, a first gate-controlling NAND circuit 142 to which the second gate control signal Gb and the output signal of the first data potential holding and outputting circuit 116 are input is provided for the gate of the second transistor 112. Further, in FIG. 12, a second gate-controlling NAND circuit 143 to which the first gate control signal Ga and the output signal of the second data potential holding and outputting circuit 117 are input is provided for the gate of the third transistor 113. In FIG. 12, the first capacitor control signal Ca is connected to the second electrode of the first capacitor 114, and the second capacitor control signal Cb is connected to the second electrode of the second capacitor 115.

In FIG. 12, the toggle operations of the data D, the first gate control signal Ga, the second gate control signal Gb, the first capacitor control signal Ca, and the second capacitor control signal Cb are performed in the same manner as those in FIG. 3, whereby the pulse signals Q which are similar to those in the operation described in FIG. 3 can be obtained.

This embodiment can be combined with any of the other embodiments as appropriate.

[Embodiment 3]

In this embodiment, a structure of a signal processing unit including the semiconductor storage device described in Embodiment 1 will be described.

Figure 13:
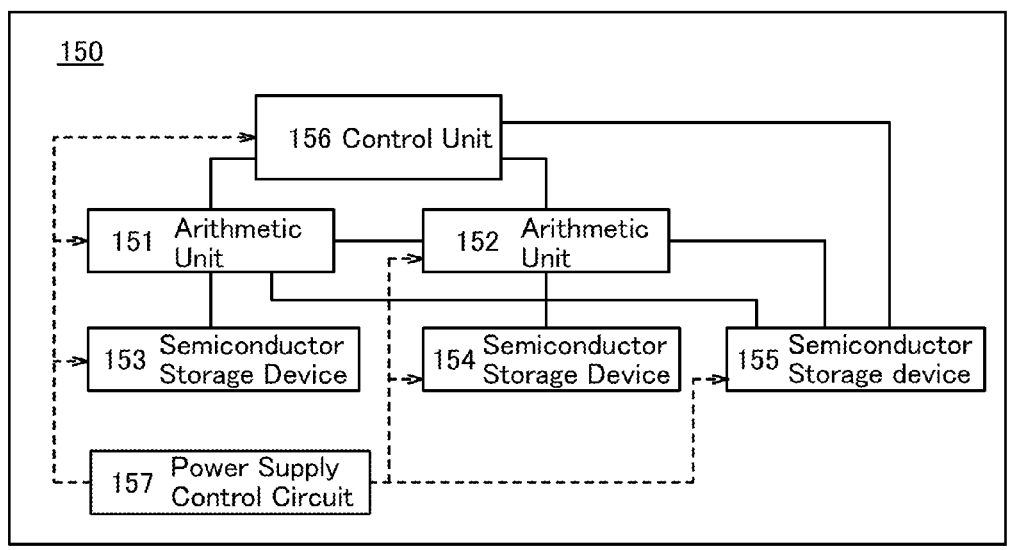
FIG. 13 is a block diagram of a signal processing unit.

FIG. 13 illustrates an example of a signal processing unit according to one embodiment of the present invention. The signal processing unit includes at least one or a plurality of arithmetic units and one or a plurality of semiconductor storage devices. Specifically, a signal processing unit 150 illustrated in FIG. 13 includes an arithmetic unit 151, an arithmetic unit 152, a semiconductor storage device 153, a semiconductor storage device 154, a semiconductor storage device 155, a control unit 156, and a power supply control circuit 157.

The arithmetic units 151 and 152 each include, as well as a logic circuit which carries out simple logic arithmetic processing, an adder, a multiplier, various arithmetic units, and the like. The semiconductor storage device 153 functions as a register which temporarily holds a data signal when the arithmetic processing is carried out in the arithmetic unit 151. The semiconductor storage device 154 functions as a register which temporarily holds a data signal when the arithmetic processing is carried out in the arithmetic unit 152.

In addition, the semiconductor storage device 155 can be used as a main memory and can store a program executed by the control unit 156 as a data signal or can store a data signal from the arithmetic unit 151 and the arithmetic unit 152.

The control unit 156 is a circuit which collectively controls operations of the arithmetic unit 151, the arithmetic unit 152, the semiconductor storage device 153, the semiconductor storage device 154, and the semiconductor storage device 155 included in the signal processing unit 150. Note that in FIG. 13, a structure in which the control unit 156 is provided in the signal processing unit 150 as a part thereof is illustrated, but the control unit 156 may be provided outside the signal processing unit 150.

By using the semiconductor storage device described in Embodiment 1 for the semiconductor storage device 153, the semiconductor storage device 154, and the semiconductor storage device 155, a data signal can be held without increasing the number of signals to be controlled even when the supply of power supply voltage to the semiconductor storage device 153, the semiconductor storage device 154, and the semiconductor storage device 155 is stopped. In the above manner, the supply of power supply voltage to the entire signal processing unit 150 can be stopped, whereby power consumption can be suppressed. Alternatively, the supply of power supply voltage to one or more of the semiconductor storage device 153, the semiconductor storage device 154, and the semiconductor storage device 155 can be stopped, whereby power consumption of the signal processing unit 150 can be suppressed. After the supply of the power supply voltage is resumed, the semiconductor storage device can return to the state same as that before the supply of the power supply voltage is stopped in a short time.

In addition, as well as the supply of the power supply voltage to the semiconductor storage device, the supply of power supply voltage to the control circuit or the arithmetic unit which transmits/receives a data signal to/from the semiconductor storage device may be stopped. For example, when the arithmetic unit 151 and the semiconductor storage device 153 are not operated, the supply of power supply voltage to the arithmetic unit 151 and the semiconductor storage device 153 may be stopped.

In addition, the power supply control circuit 157 controls the level of the power supply voltage which is supplied to the arithmetic unit 151, the arithmetic unit 152, the semiconductor storage device 153, the semiconductor storage device 154, the semiconductor storage device 155, and the control unit 156 included in the signal processing unit 150. Further, in the case where the supply of the power supply voltage is stopped, it may be stopped in the power supply control circuit 157, or in each of the arithmetic unit 151, the arithmetic unit 152, the semiconductor storage device 153, the semiconductor storage device 154, the semiconductor storage device 155, and the control unit 156.

A semiconductor storage device functioning as a cache memory may be provided between the semiconductor storage device 155 that is a main memory and each of the arithmetic unit 151, the arithmetic unit 152, and the control unit 156. By providing the cache memory, low-speed access to the main memory can be reduced and the speed of the signal processing such as arithmetic processing can be made higher. By applying the above-described semiconductor storage devices also to the semiconductor storage device functioning as a cache memory, power consumption of the signal processing unit 150 can be suppressed without increasing the number of signals to be controlled.

This embodiment can be combined with any of the other embodiments as appropriate.

[Embodiment 4]

In this embodiment, a configuration of a CPU, which is one of signal processing units according to one embodiment of the present invention, will be described.

Figure 14:
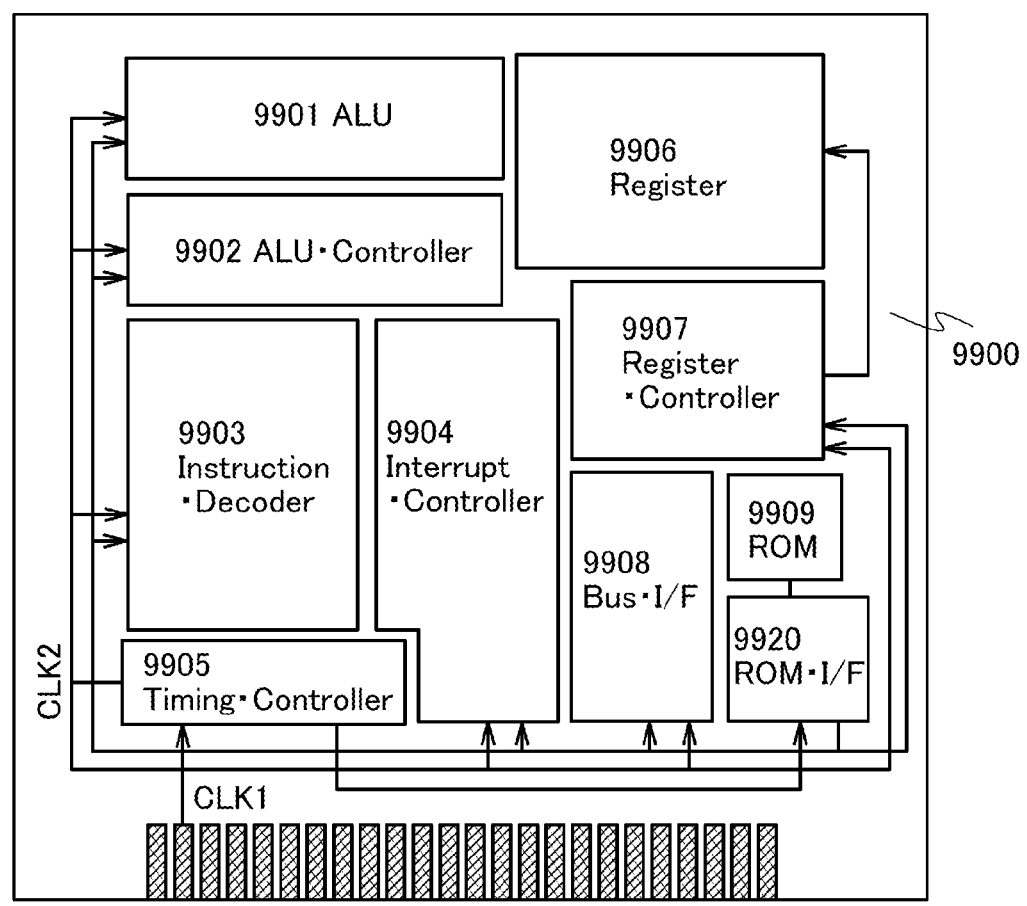
FIG. 14 is a block diagram of a CPU including a semiconductor storage device.

FIG. 14 illustrates a configuration of the CPU in this embodiment. The CPU illustrated in FIG. 14 mainly includes an arithmetic logic unit (ALU) 9901, an ALU controller 9902, an instruction decoder 9903, an interrupt controller 9904, a timing controller 9905, a register 9906, a register controller 9907, a bus interface (Bus I/F) 9908, a rewritable ROM 9909, and a ROM interface (ROM I/F) 9920, over a substrate 9900. Further, the ROM 9909 and the ROM I/F 9920 may be provided over different chips. Naturally, the CPU illustrated in FIG. 14 is only an example with a simplified configuration, and an actual CPU may employ a variety of configurations depending on the application.

An instruction which is input to the CPU through the Bus I/F 9908 is input to the instruction decoder 9903 and decoded therein, and then, input to the ALU controller 9902, the interrupt controller 9904, the register controller 9907, and the timing controller 9905.

The ALU controller 9902, the interrupt controller 9904, the register controller 9907, and the timing controller 9905 perform various controls based on the decoded instruction. Specifically, the ALU controller 9902 generates signals for controlling the operation of the ALU 9901. While the CPU is executing a program, the interrupt controller 9904 processes an interrupt request from an external input/output device or a peripheral circuit based on its priority or a mask state. The register controller 9907 generates an address of the register 9906, and reads/writes data from/to the register 9906 depending on the state of the CPU.

The timing controller 9905 generates signals for controlling operation timings of the ALU 9901, the ALU controller 9902, the instruction decoder 9903, the interrupt controller 9904, and the register controller 9907. For example, the timing controller 9905 is provided with an internal clock generator for generating an internal clock signal CLK2 on the basis of a reference clock signal CLK1, and inputs the clock signal CLK2 to the above circuits.

In the CPU of this embodiment, a semiconductor storage device having the structure described in any of the above embodiments is provided in the register 9906. In response to an instruction from the ALU 9901, the register controller 9907 can stop the supply of power supply voltage in the semiconductor storage device of the register 9906 without the necessity of saving and returning a data signal.

In such a manner, even in the case where the operation of the CPU is temporarily stopped and the supply of the power supply voltage is stopped, a data signal can be held and power consumption can be reduced. Specifically, for example, while a user of a personal computer does not input data to an input device such as a keyboard, the operation of the CPU can be stopped, so that the power consumption can be reduced.

Although the example of the CPU is described in this embodiment, the signal processing unit according to one embodiment of the present invention is not limited to the CPU and can be applied to an LSI such as a microprocessor, an image processing circuit, a digital signal processor (DSP), or a field programmable gate array (FPGA).

This embodiment can be combined with any of the other embodiments as appropriate.

[Embodiment 5]

This embodiment describes a method for manufacturing the semiconductor storage device 100, specifically, the transistor which is included in the first inverter circuit and whose channel is formed in silicon (hereinafter a transistor 191), the first transistor 111 whose channel is formed in an oxide semiconductor layer, and the first capacitor 114 in the semiconductor storage device in FIG. 2.

Figure 15A:
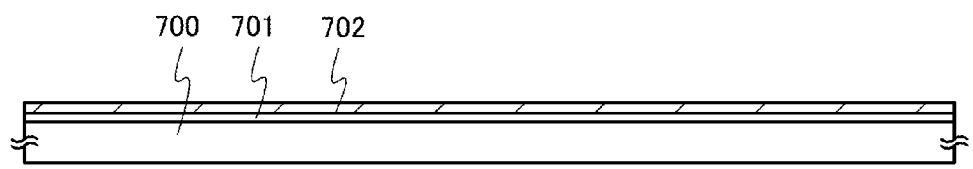
FIGS. 15A to 15D illustrate steps of manufacturing a semiconductor storage device.

As illustrated in FIG. 15A, an insulating film 701 and a semiconductor film 702 that is separated from a single crystal semiconductor substrate are formed over a substrate 700.

Although there is no particular limitation on a material which can be used as the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. In the case where a glass substrate is used and the temperature at which the heat treatment is to be performed later is high, a glass substrate whose strain point is higher than or equal to 730° C. is used.

In this embodiment, an example in which the semiconductor film 702 is formed using single crystal silicon is given as a manufacturing method of the transistor 191. Note that a specific example of a forming method of the single crystal semiconductor film 702 is briefly described. First, an ion beam including ions which are accelerated by an electric field enters a bond substrate which is the single crystal semiconductor substrate and a fragile layer which is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 700 which is provided with the insulating film 701 are attached to each other so that the insulating film 701 is sandwiched therebetween. After the bond substrate and the substrate 700 overlap with each other, a pressure of approximately greater than or equal to 1 N/cm$^2$ and less than or equal to 500 N/cm$^2$, preferably greater than or equal to 11 N/cm$^2$ and less than or equal to 20 N/cm$^2$ is applied to part of the bond substrate and part of the substrate 700 so that the substrates are attached to each other. When the pressure is applied, bonding between the bond substrate and the insulating film 701 starts from the portion, which results in bonding of the entire surface where the bond substrate and the insulating film 701 are in close contact with each other. Subsequently, heat treatment is performed, whereby microvoids that exist in the fragile layer are combined, so that the microvoids increase in volume. Accordingly, a single crystal semiconductor film which is part of the bond substrate is separated from the bond substrate along the fragile layer. The heat treatment is performed at a temperature not exceeding the strain point of the substrate 700. Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which has not been patterned or may be added to the semiconductor film 702 which is formed through the patterning. Alternatively, the impurity element for controlling the threshold voltage may be added to the bond substrate. Further alternatively, the impurity element may be added to the bond substrate in order to roughly control the threshold voltage, and the impurity element may be further added to the semiconductor film which has not been patterned or the semiconductor film 702 which is formed through the patterning in order to finely control the threshold voltage.

Note that although the single crystal semiconductor film is used in this embodiment, the present invention is not limited to this structure. For example, a polycrystalline, microcrystalline, or amorphous semiconductor film which is formed over the insulating film 701 by a vapor deposition method may be used. Alternatively, the semiconductor film may be crystallized by a known technique. As a known crystallization technique, laser crystallization using a laser beam or crystallization using a catalytic element can be used. Alternatively, crystallization using a catalytic element and laser crystallization can be used in combination. When a heat-resistant substrate such as a quartz substrate is used, a crystallization method combined with a thermal crystallization method using an electrically heated furnace, a lamp annealing crystallization method using infrared light, a crystallization method using a catalytic element, or a high-temperature annealing method at approximately 950° C. may be used.

Figure 15B:
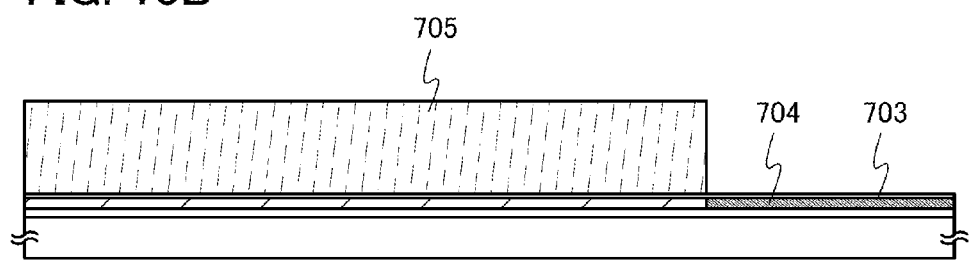

Next, as illustrated in FIG. 15B, a gate insulating film 703 is formed over the semiconductor film 702. Then, a mask 705 is formed over the gate insulating film 703 and an impurity element imparting conductivity is added to part of the semiconductor film 702, so that an impurity region 704 is formed.

The gate insulating film 703 can be formed by oxidizing or nitriding a surface of the semiconductor film 702 by high-density plasma treatment, heat treatment, or the like. The high-density plasma treatment is performed by using, for example, a mixed gas of an inert gas such as He, Ar, Kr, or Xe, and oxygen, nitrogen oxide, ammonia, nitrogen, hydrogen, or the like. In this case, by exciting plasma by introduction of microwaves, high-density plasma with a low electron temperature can be generated. By oxidizing or nitriding the surface of the semiconductor film with oxygen radicals (including OH radicals in some cases) or nitrogen radicals (including NH radicals in some cases) generated by such high-density plasma, an insulating film with a thickness of 1 nm to 20 nm, preferably 5 nm to 10 nm can be formed in contact with the semiconductor film. For example, nitrous oxide ($N_2O$) is diluted with Ar by 1 to 3 times (flow rate) and a microwave (2.45 GHz) electric power of 3 to 5 kW is applied with a pressure of 10 to 30 Pa so that the oxidation or nitriding of the surface of the semiconductor film 702 is performed. By this treatment, an insulating film having a thickness of 1 nm to 10 nm (preferably 2 nm to 6 nm) is formed. Further, nitrous oxide ($N_2O$) and silane ($SiH_4$) are introduced and a microwave (2.45 GHz) power of 3 kW to 5 kW is applied with a pressure of 10 Pa to 30 Pa so that a silicon oxynitride film is formed by a vapor deposition method, whereby the gate insulating film is formed. With a combination of a solid-phase reaction and a reaction by a vapor deposition method, the gate insulating film with low interface state density and high breakdown voltage can be formed.

The oxidation or nitridation of the semiconductor film by the high-density plasma treatment proceeds by solid-phase reaction. Thus, interface state density at the interface between the gate insulating film 703 and the semiconductor film 702 can be made extremely low. Further, by directly oxidizing or nitriding the semiconductor film 702 by high-density plasma treatment, variation in thickness of the insulating film to be formed can be suppressed. Moreover, in the case where the semiconductor film has crystallinity, oxidizing the surface of the semiconductor film with solid-phase reaction by high-density plasma treatment makes it possible to suppress fast oxidation only in a crystal grain boundary; therefore, the gate insulating film with uniformity and low interface state density can be formed. Variations in characteristics of transistors each including an insulating film formed by high-density plasma treatment as part or the whole of a gate insulating film can be suppressed.

The gate insulating film 703 may be formed to have a single-layer structure or a layered structure using a film including silicon oxide, silicon nitride oxide, silicon oxynitride, silicon nitride, hafnium oxide, aluminum oxide, tantalum oxide, yttrium oxide, hafnium silicate ($HfSi_xO_y$, (x>0, y>0)), hafnium silicate ($HfSi_xO_y$ (x>0, y>0)) to which nitrogen is added, hafnium aluminate ($HfAl_xO_y$, (x>0, y>0)) to which nitrogen is added, or the like by a plasma-enhanced CVD method, a sputtering method, or the like.

Note that in this specification, an oxynitride is a substance which includes more oxygen than nitrogen, and a nitride oxide is a substance which includes more nitrogen than oxygen.

The thickness of the gate insulating film 703 can be, for example, greater than or equal to 1 nm and less than or equal to 100 nm, preferably greater than or equal to 10 nm and less than or equal to 50 nm. In this embodiment, a single-layer insulating film containing silicon oxide is formed as the gate insulating film 703 by a plasma-enhanced CVD method.

Figure 15C:
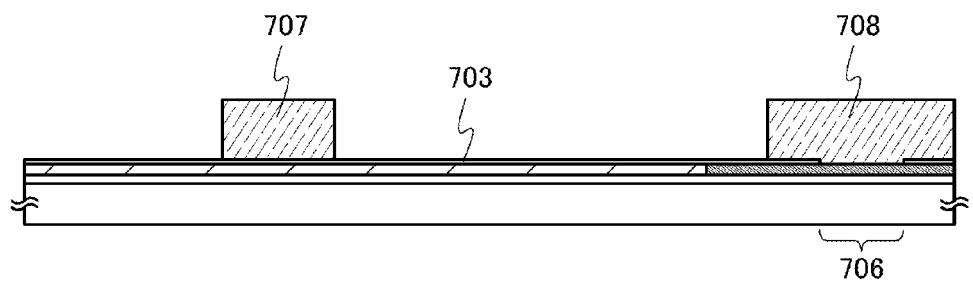

Next, after the mask 705 is removed, part of the gate insulating film 703 is removed as illustrated in FIG. 15C and an opening 706 is formed to overlap with the impurity region 704 by etching or the like. After that, a gate electrode 707 and a conductive film 708 are formed.

The gate electrode 707 and the conductive film 708 can be formed in a manner such that a conductive film is formed to cover the opening 706 and then is processed (patterned) into a predetermined shape. The conductive film 708 is in contact with the impurity region 704 in the opening 706. The conductive film can be formed by a CVD method, a sputtering method, a vapor deposition method, a spin coating method, or the like. For the conductive film, tantalum (Ta), tungsten (W), titanium (Ti), molybdenum (Mo), aluminum (Al), copper (Cu), chromium (Cr), niobium (Nb), or the like can be used. An alloy including the above metal as a main component or a compound including the above metal may be used as the conductive film. Alternatively, a semiconductor film formed using a semiconductor such as polycrystalline silicon doped with an impurity element such as phosphorus imparting conductivity may be used as the conductive film.

Note that although the gate electrode 707 and the conductive film 708 are formed using a single-layer conductive film in this embodiment, this embodiment is not limited to this structure. The gate electrode 707 and the conductive film 708 may be formed of a plurality of stacked conductive films.

As a combination of two conductive films, tantalum nitride or tantalum can be used for a first conductive film and tungsten can be used for a second conductive film. As well as the example, any of the following combination can be used: tungsten nitride and tungsten; molybdenum nitride and molybdenum; aluminum and tantalum; aluminum and titanium; and the like. Since tungsten and tantalum nitride have high heat resistance, heat treatment for thermal activation can be performed in a step performed after the two conductive films are formed. Alternatively, as the combination of the two conductive films, for example, nickel silicide and silicon doped with an impurity element imparting n-type conductivity, tungsten silicide and silicon doped with an impurity element imparting n-type conductivity, or the like can be used.

In the case of a three-layer structure in which three or more conductive films are stacked, a layered structure of a molybdenum film, an aluminum film, and a molybdenum film is preferably used.

A light-transmitting oxide conductive film of indium oxide, indium oxide-tin oxide, indium oxide-zinc oxide, zinc oxide, zinc aluminum oxide, zinc aluminum oxynitride, gallium zinc oxide, or the like can be used for the gate electrode 707 and the conductive film 708.

Alternatively, the gate electrode 707 and the conductive film 708 may be selectively formed by a droplet discharge method without the use of a mask. A droplet discharge method is a method for forming a predetermined pattern by discharge or ejection of a droplet containing a predetermined composition from an orifice, and includes an ink-jet method in its category.

In addition, the gate electrode 707 and the conductive film 708 can be formed in a manner such that a conductive film is formed and then is etched by an inductively coupled plasma (ICP) etching method under appropriately controlled conditions (e.g., the amount of electric power applied to a coiled electrode layer, the amount of electric power applied to an electrode layer on the substrate side, and the electrode temperature on the substrate side) to be tapered in a desired shape. Further, an angle and the like of the tapered shape may be controlled by the shape of a mask. Note that for an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 15D:
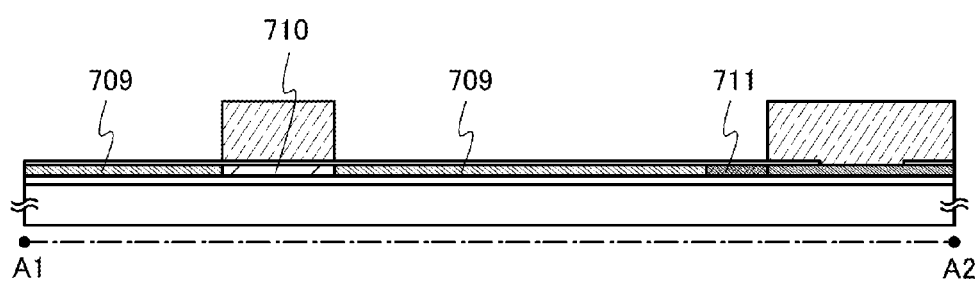

Next, as illustrated in FIG. 15D, when an impurity element imparting one conductivity is added to the semiconductor film 702 with the gate electrode 707 and the conductive film 708 used as masks, a channel formation region 710 overlapping with the gate electrode 707, a pair of impurity regions 709 between which the channel formation region 710 is provided, and an impurity region 711 obtained by further addition of an impurity element to part of the impurity region 704 are formed in the semiconductor film 702.

In this embodiment, the case where an impurity element imparting p-type conductivity (e.g., boron) is added to the semiconductor film 702 is given as an example.

Figure 16A:
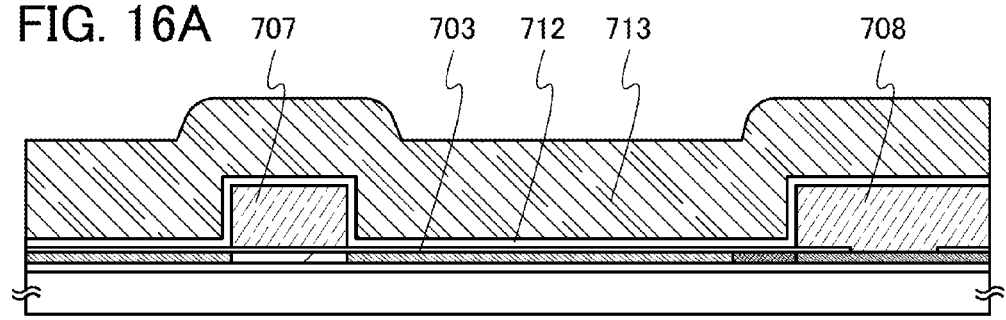
FIGS. 16A to 16C illustrate steps of manufacturing a semiconductor storage device.

Next, as illustrated in FIG. 16A, an insulating film 712 and an insulating film 713 are formed to cover the gate insulating film 703, the gate electrode 707, and the conductive film 708. Specifically, an inorganic insulating film of silicon oxide, silicon nitride, silicon nitride oxide, silicon oxynitride, aluminum nitride, aluminum nitride oxide, or the like can be used as the insulating film 712 and the insulating film 713. In particular, the insulating film 712 and the insulating film 713 are preferably formed using a low dielectric constant (low-k) material because capacitance due to overlapping of electrodes or wirings can be sufficiently reduced. Note that a porous insulating film including such a material may be used as the insulating film 712 and the insulating film 713. Since the porous insulating film has lower dielectric constant than a dense insulating film, parasitic capacitance due to electrodes or wirings can be further reduced.

In this embodiment, the case where silicon oxynitride is used for the insulating film 712 and silicon nitride oxide is used for the insulating film 713 is given as an example. In addition, in this embodiment, the insulating film 712 and the insulating film 713 are formed over the gate electrode 707 and the conductive film 708; however, as one embodiment of the present invention, only one insulating film may be formed over the gate electrode 707 and the conductive film 708, or three or more insulating films may be stacked.

Figure 16B:
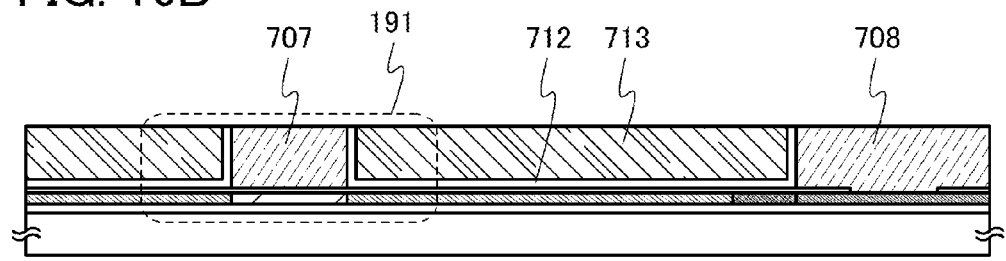

Next, as illustrated in FIG. 16B, the insulating film 712 and the insulating film 713 are subjected to chemical mechanical polishing (CMP) treatment or etching, so that surfaces of the gate electrode 707 and the conductive film 708 are exposed. Note that in order to improve the characteristics of the first transistor 111 which is formed later, surfaces of the insulating film 712 and the insulating film 713 are preferably planarized as much as possible.

Through the above process, the transistor 191 can be formed.

Figure 16C:
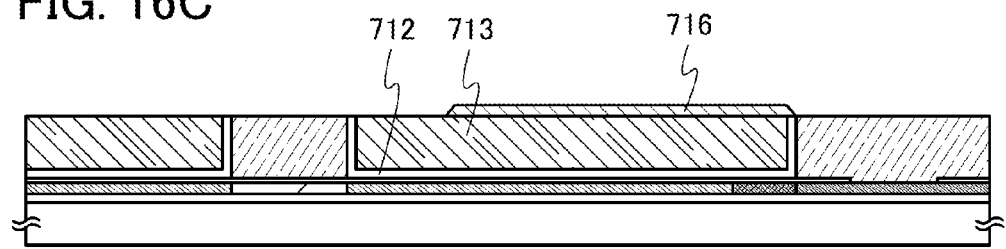

Next, a method for manufacturing the first transistor 111 will be described. First, as illustrated in FIG. 16C, an oxide semiconductor layer 716 is formed over the insulating film 712 or the insulating film 713.

The oxide semiconductor layer 716 can be formed by processing an oxide semiconductor film formed over the insulating film 712 and the insulating film 713 into a desired shape. The thickness of the oxide semiconductor film is greater than or equal to 2 nm and less than or equal to 200 nm, preferably greater than or equal to 3 nm and less than or equal to 50 nm, more preferably greater than or equal to 3 nm and less than or equal to 20 nm. The oxide semiconductor film is deposited by a sputtering method using an oxide semiconductor as a target. Alternatively, the oxide semiconductor film can be formed by a sputtering method in a rare gas (e.g., argon) atmosphere, an oxygen atmosphere, or a mixed atmosphere of a rare gas (e.g., argon) and oxygen.

In the case where the oxide semiconductor layer 716 is formed by a sputtering method, water and hydrogen in a deposition treatment chamber is reduced as much as possible. Specifically, for example, the following countermeasures are preferable: inside of the deposition treatment chamber is heated before the deposition, water and/or a hydrogen concentration in a gas introduced in the deposition treatment chamber is reduced, and counter flow of a gas exhausted from the deposition treatment chamber is prevented.

Note that before the oxide semiconductor film is deposited by a sputtering method, dust attached onto the surfaces of the insulating film 712 and the insulating film 713 is preferably removed by reverse sputtering in which an argon gas is introduced and plasma is generated. The reverse sputtering is a method in which, without application of voltage to a target side, an RF power source is used for application of voltage to a substrate side in an argon atmosphere, and plasma is generated in the vicinity of the substrate so that a substrate surface is modified. Note that a nitrogen atmosphere, a helium atmosphere, or the like may be used instead of the argon atmosphere. Alternatively, an argon atmosphere to which oxygen, nitrous oxide, or the like is added may be used. Alternatively, an argon atmosphere to which oxygen, nitrous oxide, or the like is added may be used.

For example, for the oxide semiconductor film, a four-component metal oxide such as an In—Sn—Ga—Zn-based oxide semiconductor; a three-component metal oxide such as an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, a Sn—Al—Zn-based oxide semiconductor, or an Hf—In—Zn-based oxide semiconductor; a two-component metal oxide such as an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, an In—Mg-based oxide semiconductor, or an In—Ga-based material; or a one-component metal oxide such as an In-based oxide semiconductor, a Sn-based oxide semiconductor, or a Zn-based oxide semiconductor can be used.

In particular, in the case where an In—Sn—Zn-based oxide semiconductor is used as the oxide semiconductor film, the mobility of the transistor can be increased. Further, the use of an In—Sn—Zn-based oxide semiconductor for the transistor allows the threshold voltage of the transistor to be stably controlled. In the case where the In—Sn—Zn-based oxide semiconductor is used, a target may have a composition ratio of In:Sn:Zn=1:2:2, In:Sn:Zn=2:1:3, or In:Sn:Zn=1:1:1 in an atomic ratio, for example.

In this embodiment, a 30-nm-thick In—Ga—Zn-based oxide semiconductor thin film which is obtained by a sputtering method using a target including indium (In), gallium (Ga), and zinc (Zn) is used as the oxide semiconductor film. A target with a composition ratio of metals, In:Ga:Zn=1:1:0.5, In:Ga:Zn=1:1:1, or In:Ga:Zn=1:1:2 can be used as the target, for example. The filling rate of the target including In, Ga, and Zn is higher than or equal to 90% and lower than or equal to 100%, preferably higher than or equal to 95% and lower than 100%. With the use of the target with a high filling rate, a dense oxide semiconductor film is deposited.

In this embodiment, the oxide semiconductor film is deposited in a manner such that the substrate is held in the deposition treatment chamber kept in a reduced pressure state, moisture remaining in the deposition treatment chamber is removed, the sputtering gas from which hydrogen and moisture are removed is introduced, and the target is used. The substrate temperature may be higher than or equal to 100° C.

and lower than or equal to 600° C., preferably higher than or equal to 200° C. and lower than or equal to 400° C. during deposition. By deposition of the oxide semiconductor film while the substrate is heated, the concentration of impurities included in the deposited oxide semiconductor film can be lowered. In addition, damage by sputtering can be reduced. In order to remove moisture remaining in the treatment chamber, an adsorption vacuum pump is preferably used. For example, a cryopump, an ion pump, or a titanium sublimation pump is preferably used. A turbo pump to which a cold trap is added may be used as an evacuation unit. For example, a hydrogen atom, a compound containing a hydrogen atom, such as water ($H_2O$) (preferably a compound containing a carbon atom), and the like are evacuated from the treatment chamber with the use of a cryopump. Thus, the concentration of impurities contained in the oxide semiconductor film deposited in the treatment chamber can be lowered.

As an example of the deposition condition, the following condition is employed: the distance between the substrate and the target is 100 mm, the pressure is 0.6 Pa, the power of the direct current (DC) power source is 0.5 kW, and the atmosphere is an oxygen atmosphere (the proportion of the oxygen flow rate is 100%). Note that it is preferable that pulsed direct-current (DC) power source be used because dust generated during deposition can be reduced and the film thickness can be uniform.

Further, when the leakage rate of the treatment chamber of the sputtering apparatus is set lower than or equal to $1 \times 10^{-10}$ Pa·$m^3$/second, entry of impurities such as alkali metal or hydride into the oxide semiconductor film that is being formed by a sputtering method can be reduced. Furthermore, with the use of the adsorption vacuum pump as an evacuation system, counter flow of impurities such as alkali metal, a hydrogen atom, a hydrogen molecule, water, a hydroxyl group, or hydride from the evacuation system can be reduced.

When the purity of the target is set to 99.99% or higher, alkali metal, a hydrogen atom, a hydrogen molecule, water, a hydroxyl group, hydride, or the like mixed into the oxide semiconductor film can be reduced. In addition, with the use of the target, the concentration of an alkali metal such as lithium, sodium, or potassium can be reduced in the oxide semiconductor film.

Note that in order that hydrogen, a hydroxyl group, and moisture be contained in the oxide semiconductor film as little as possible, it is preferable that an impurity such as hydrogen or moisture that is adsorbed on the substrate 700 be eliminated and evacuated by preheating of the substrate 700 over which the insulating film 712 and the insulating film 713 are formed in a preheating chamber of the sputtering apparatus, as pretreatment for deposition. The temperature of the preheating is higher than or equal to 100° C. and lower than or equal to 400° C., preferably higher than or equal to 150° C. and lower than or equal to 300° C. As an evacuation unit provided in the preheating chamber, a cryopump is preferable. Note that the preheating treatment can be omitted. This preheating may be similarly performed on the substrate 700 over which a conductive film 719 and a conductive film 720 are formed before the deposition of a gate insulating film 721 in a later step.

Note that etching for forming the oxide semiconductor layer 716 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching, parallel plate reactive ion etching (RIE) or inductively coupled plasma (ICP) etching can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, organic acid such as citric acid or oxalic acid, or the like can be used. In this embodiment, ITO-07N (produced by KANTO CHEMICAL CO., INC.) is used.

A resist mask for forming the oxide semiconductor layer 716 may be formed by an ink-jet method. When the resist mask is formed by an ink-jet method, a photomask is not used; thus, manufacturing cost can be reduced.

Note that it is preferable that reverse sputtering be performed before a conductive film is formed in a subsequent step so that resist residues and the like that attach onto surfaces of the oxide semiconductor layer 716, the insulating film 712, and the insulating film 713 are removed.

Note that the oxide semiconductor film deposited by sputtering or the like contains a large amount of moisture or hydrogen (including a hydroxyl group) as an impurity in some cases. Moisture or hydrogen easily forms a donor level and thus serves as an impurity in the oxide semiconductor. Thus, in one embodiment of the present invention, in order to reduce impurities such as moisture or hydrogen in the oxide semiconductor film (in order to perform dehydration or dehydrogenation), the oxide semiconductor layer 716 is subjected to heat treatment in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or less, preferably 1 ppm or less, more preferably 10 ppb or less, in the case where measurement is performed by a dew point meter in a cavity ring down laser spectroscopy (CRDS) method).

By performing heat treatment on the oxide semiconductor layer 716, moisture or hydrogen in the oxide semiconductor layer 716 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately longer than or equal to 3 minutes and shorter than or equal to 6 minutes. When RTA is used for the heat treatment, dehydration or dehydrogenation can be performed in a short time; thus, treatment can be performed even at a temperature higher than the strain point of a glass substrate.

In this embodiment, an electric furnace that is one of heat treatment apparatuses is used.

Note that the heat treatment apparatus is not limited to an electric furnace, and may be provided with a device for heating an object by thermal conduction or thermal radiation from a heater such as a resistance heater. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus with which heat treatment is performed using a high-temperature gas. As the gas, an inert gas which does not react with an object by heat treatment, such as nitrogen or a rare gas (e.g., argon), is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably higher than or equal to 6N (99.9999%), more preferably higher than or equal to 7N (99.99999%) (that is, the impurity concentration is lower than or equal to 1 ppm, preferably lower than or equal to 0.1 ppm).

Note that it has been pointed out that an oxide semiconductor is insensitive to impurities, there is no problem when a considerable amount of metal impurities is contained in the film, and soda-lime glass which contains a large amount of alkali metal such as sodium and which is inexpensive can be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). However, such consideration is not appropriate. Alkali metal is not an element included in an oxide semiconductor and thus is an impurity. Alkaline earth metal is also an impurity in the case where alkaline earth metal is not included in an oxide semiconductor. Alkali metal, in particular, Na becomes $Na^+$ when an insulating film which is in contact with an oxide semiconductor layer is an oxide and Na diffuses into the insulating film. In addition, in the oxide semiconductor layer, Na cuts or enters a bond between metal and oxygen which are included in an oxide semiconductor. As a result, for example, deterioration of characteristics of a transistor, such as a normally-on state of the transistor due to negative shift of the threshold voltage, or a decrease in mobility, occurs. Variation in characteristics also occurs. Such deterioration of characteristics and variation in characteristics of the transistor due to the impurity remarkably appear when the concentration of hydrogen in the oxide semiconductor layer is extremely low. Thus, when the concentration of hydrogen in the oxide semiconductor layer is lower than or equal to $1\times10^{18}$ atoms/$cm^3$, preferably lower than or equal to $1\times10^{17}$ atoms/$cm^3$, the concentration of the impurity is preferably lowered. Specifically, the measurement value of a Na concentration by secondary ion mass spectrometry is preferably lower than or equal to $5\times10^{16}$ atoms/$cm^3$, more preferably lower than or equal to $1\times10^{16}$ atoms/$cm^3$, further preferably lower than or equal to $1\times10^{15}$ atoms/$cm^3$. Similarly, the measurement value of a Li concentration is preferably lower than or equal to $5\times10^{15}$ atoms/$cm^3$, more preferably lower than or equal to $1\times10^{15}$ atoms/$cm^3$. Similarly, the measurement value of a K concentration is preferably lower than or equal to $5\times10^{15}$ atoms/$cm^3$, more preferably lower than or equal to $1\times10^{15}$ atoms/$cm^3$.

Through the above steps, the concentration of hydrogen in the oxide semiconductor layer 716 can be lowered and the oxide semiconductor layer 716 can be purified. Accordingly, the oxide semiconductor layer can be stable. In addition, the heat treatment at a temperature lower than or equal to the glass transition temperature makes it possible to form an oxide semiconductor layer with a wide band gap. Thus, the transistor can be formed using a large substrate, so that mass productivity can be increased. The heat treatment can be performed at any time after the oxide semiconductor layer is deposited.

Note that the oxide semiconductor layer may be either amorphous or crystalline. The oxide semiconductor layer having crystallinity is a c-axis aligned crystalline oxide semiconductor (CAAC-OS) layer.

The CAAC-OS layer is not completely single crystal nor completely amorphous. The CAAC-OS layer is an oxide semiconductor film with a crystal-amorphous mixed phase structure where a crystal part (crystal region) and an amorphous part (amorphous region) are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS layer is not clear. Further, with the TEM, a grain boundary in the CAAC-OS layer is not found. Thus, in the CAAC-OS layer, a reduction in electron mobility, due to the grain boundary, is suppressed.

In each of the crystal parts included in the CAAC-OS layer, a c-axis is aligned in a direction parallel to a normal vector of a surface where the CAAC-OS layer is formed or a normal vector of a surface of the CAAC-OS layer, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS layer, distribution of crystal parts is not necessarily uniform. For example, in the formation process of the CAAC-OS layer, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS layer, the crystal part in a region to which the impurity is added becomes amorphous in some cases.

Since the c-axes of the crystal parts included in the CAAC-OS layer are aligned in the direction parallel to a normal vector of a surface where the CAAC-OS layer is formed or a normal vector of a surface of the CAAC-OS layer, the directions of the c-axes may be different from each other depending on the shape of the CAAC-OS layer (the cross-sectional shape of the surface where the CAAC-OS layer is formed or the cross-sectional shape of the surface of the CAAC-OS layer). Note that when the CAAC-OS layer is formed, the direction of c-axis of the crystal part is the direction parallel to a normal vector of the surface where the CAAC-OS layer is formed or a normal vector of the surface of the CAAC-OS layer. The crystal part is formed by film formation or by performing treatment for crystallization such as heat treatment after film formation.

With use of the CAAC-OS layer in a transistor, change in electric characteristics of the transistor due to irradiation with visible light or ultraviolet light can be reduced. Thus, the transistor has high reliability.

The CAAC-OS layer can also be formed by a sputtering method. In order to obtain a CAAC-OS layer by a sputtering method, it is important that hexagonal crystals be formed in the initial stage of deposition of an oxide semiconductor film and other crystals grow on the hexagonal crystals serving as seed crystals. In order to achieve this, it is preferable that the distance between the target and the substrate be made longer (e.g., 150 mm to 200 mm) and the substrate heating temperature be 100° C. to 500° C., more preferably 200° C. to 400° C., further preferably 250° C. to 300° C.

The proportion of oxygen gas in an atmosphere is preferably set high when a CAAC-OS layer is deposited by a sputtering method. For sputtering in a mixed gas atmosphere of argon and oxygen, for example, the proportion of oxygen gas is preferably set 30% or higher, more preferably 40% or higher. This is because supply of oxygen from the atmosphere promotes crystallization of a CAAC-OS layer.

When an oxide semiconductor film including a CAAC-OS layer is deposited by a sputtering method, a substrate over which a CAAC-OS layer is deposited is heated preferably to a temperature higher than or equal to 150° C., more preferably higher than or equal to 170° C. This is because a rise in substrate temperature promotes crystallization of a CAAC-OS layer.

Here, the CAAC-OS will be described in detail with reference to FIGS. 19A to 19E, FIGS. 20A to 20C, and FIGS. 21A to 21C. In FIGS. 19A to 19E, FIGS. 20A to 20C, and FIGS. 21A to 21C, the vertical direction corresponds to the c-axis direction and a plane perpendicular to the c-axis direction corresponds to the a-b plane, unless otherwise specified. In the case where the expressions "an upper half" and "a lower half" are simply used, they refer to an upper half above the a-b plane and a lower half below the a-b plane (an upper half and a lower half with respect to the a-b plane). Furthermore, in FIGS. 19A to 19E, O surrounded by a circle represents tetracoordinate O and O surrounded by a double circle represents tricoordinate O.

Figure 19A:
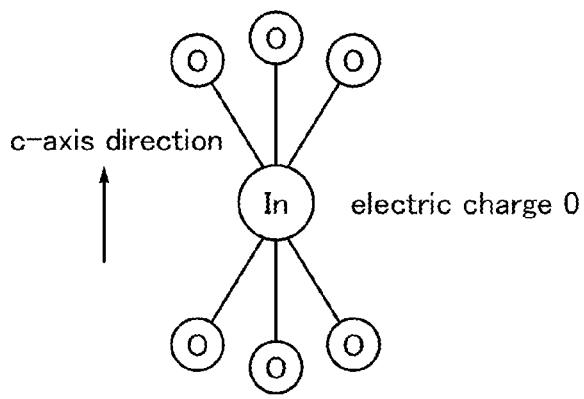
FIGS. 19A to 19E illustrate a structure of an oxide material according to one embodiment of the present invention.

FIG. 19A illustrates a structure including one hexacoordinate In atom and six tetracoordinate oxygen (hereinafter referred to as tetracoordinate O) atoms proximate to the In atom. A structure in which only one In atom and oxygen atoms proximate thereto are illustrated is called a subunit here. The structure in FIG. 19A is actually an octahedral structure, but is illustrated as a planar structure for simplicity. Note that three tetracoordinate O atoms exist in each of an upper half and a lower half in FIG. 19A. In the subunit illustrated in FIG. 19A, electric charge is 0 (zero).

Figure 19D:
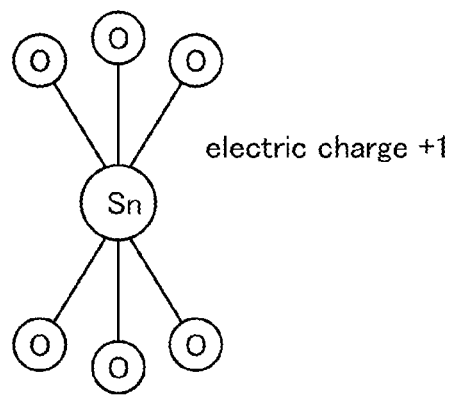
Figure 19B:
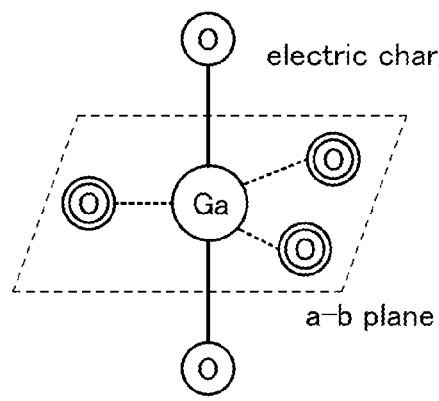

FIG. 19B illustrates a structure including one pentacoordinate Ga atom (or near neighbor Ga atom), three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 19B. An In atom can also have the structure illustrated in FIG. 16B because an In atom can have five ligands. In the subunit illustrated in FIG. 19B, electric charge is 0.

Figure 19E:
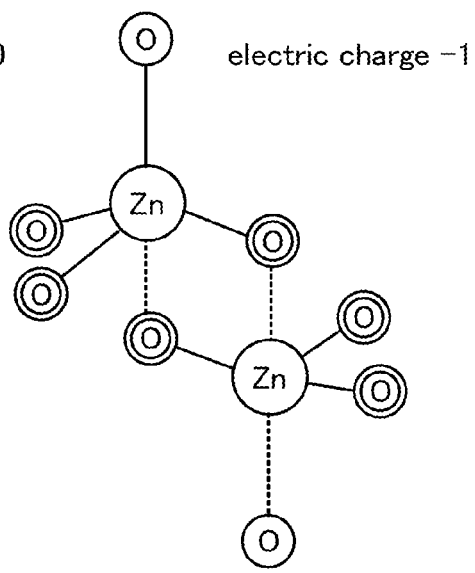
Figure 19C:
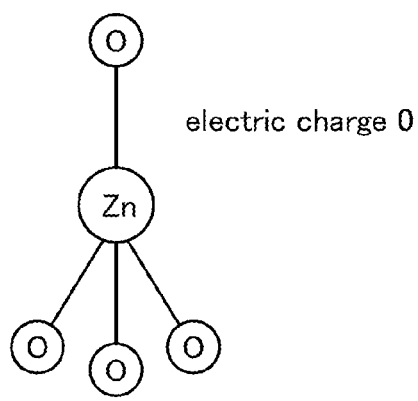

FIG. 19C illustrates a structure including one tetracoordinate Zn atom and four tetracoordinate O atoms proximate to the Zn atom. In FIG. 19C, one tetracoordinate O atom exists in an upper half and three tetracoordinate O atoms exist in a lower half In the subunit illustrated in FIG. 19C, electric charge is 0.

FIG. 19D illustrates a structure including one hexacoordinate Sn atom and six tetracoordinate O atoms proximate to the Sn atom. In FIG. 19D, three tetracoordinate O atoms exist in each of an upper half and a lower half In the subunit illustrated in FIG. 19D, electric charge is +1.

FIG. 19E illustrates a subunit including two Zn atoms. In FIG. 19E, one tetracoordinate O atom exists in each of an upper half and a lower half In the subunit illustrated in FIG. 19E, electric charge is −1.

Here, a plurality of subunits forms a group, and a plurality of groups form one cycle which is called a unit.

Now, a rule of bonding between the subunits will be described. The three O atoms in the upper half with respect to the hexacoordinate In atom in FIG. 19A has three proximate In atoms in the downward direction, and the three O atoms in the lower half has three proximate In atoms in the upward direction. The one O atom in the upper half with respect to the pentacoordinate Ga atom in FIG. 19B has one proximate Ga atom in the downward direction, and the one O atom in the lower half has one proximate Ga atom in the upward direction. The one O atom in the upper half with respect to the one tetracoordinate Zn atom in FIG. 19C has one proximate Zn atom in the downward direction, and the three O atoms in the lower half has three proximate Zn atoms in the upward direction. In this manner, the number of tetracoordinate O atoms above a metal atom is equal to the number of metal atoms proximate to and below the tetracoordinate O atoms; similarly, the number of tetracoordinate O atoms below a metal atom is equal to the number of metal atoms proximate to and above the tetracoordinate O atoms. Since the coordination number of the tetracoordinate O atom is 4, the sum of the number of metal atoms proximate to and below the O atom and the number of metal atoms proximate to and above the O atom is 4. Accordingly, when the sum of the number of tetracoordinate O atoms above a metal atom and the number of tetracoordinate O atoms below another metal atom is 4, the two kinds of subunits including the metal atoms can be bonded to each other. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition, one group can also be formed in a different manner by combining subunits so that the total electric charge of the layered structure is 0.

FIG. 20A illustrates a model of one group included in a layered structure of an In—Sn—Zn-based oxide. FIG. 20B illustrates a unit including three groups. FIG. 20C illustrates an atomic arrangement where the layered structure in FIG. 20B is observed from the c-axis direction.

In FIG. 20A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 20A, one tetracoordinate O atom existing in each of an upper half and a lower half with respect to an In atom is denoted by circled 1. FIG. 20A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the group included in the layered structure of the In—Sn—Zn-based oxide in FIG. 20A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a subunit that includes two Zn atoms and is proximate to one tetracoordinate O atom in an upper half, and the subunit is bonded to a Sn atom proximate to three tetracoordinate O atoms in each of an upper half and a lower half through one tetracoordinate O atom in a lower half with respect to the subunit. A plurality of such groups is bonded to form one unit.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a subunit including a Sn atom is +1. Therefore, electric charge of −1, which cancels +1, is needed to form a layered structure including a Sn atom. As a structure having electric charge of −1, the subunit including two Zn atoms as illustrated in FIG. 19E can be given. For example, with one subunit including two Zn atoms, electric charge of one subunit including a Sn atom can be cancelled, so that the total electric charge of the layered structure can be 0.

In addition, an In atom can have either five ligands or six ligands. Specifically, when a unit illustrated in FIG. 20B is repeated, an In—Sn—Zn-based oxide ($In_2SnZn_3O_8$) crystal can be obtained. Note that a layered structure of the obtained In—Sn—Zn-based oxide can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, or a Sn—Al—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 21A:
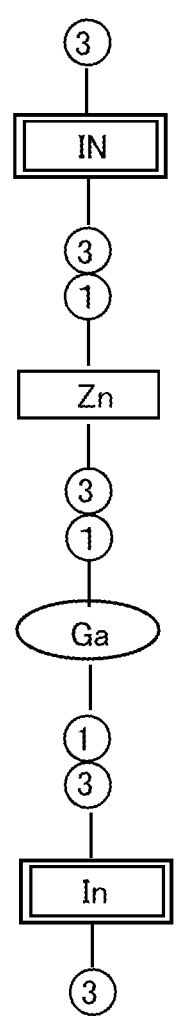
FIGS. 21A to 21C illustrate a structure of an oxide material according to one embodiment of the present invention.

For example, FIG. 21A illustrates a model of one group included in a layered structure of an In—Ga—Zn-based oxide.

In the group included in the layered structure of the In—Ga—Zn-based oxide in FIG. 21A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such groups is bonded to form one unit.

Figure 21B:
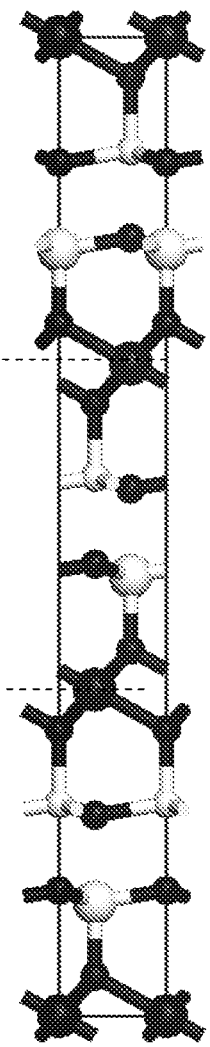
Figure 21C:
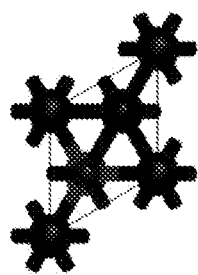

FIG. 21B illustrates a unit including three groups. Note that FIG. 21C illustrates an atomic arrangement in the case where the layered structure in FIG. 21B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a subunit including any of an In atom, a Zn atom, and a Ga atom is 0. As a result, the total electric charge of a group having a combination of such subunits is always 0.

In order to form the layered structure of the In—Ga—Zn-based oxide, a unit can be formed using not only the group illustrated in FIG. 21A but also a group in which the arrangement of the In atom, the Ga atom, and the Zn atom is different from that in FIG. 21A.

Figure 17A:
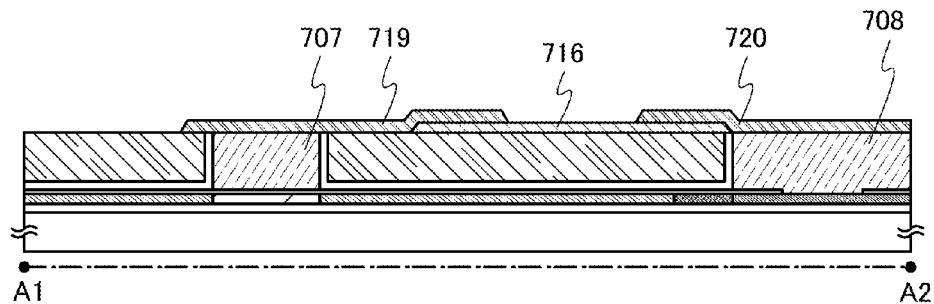
FIGS. 17A to 17C illustrate steps of manufacturing a semiconductor storage device.

Next, as illustrated in FIG. 17A, the conductive film 719 which is in contact with the gate electrode 707 and the oxide semiconductor layer 716, and the conductive film 720 which is in contact with the conductive film 708 and the oxide semiconductor layer 716 are formed. The conductive film 719 and the conductive film 720 function as source and drain electrodes.

Specifically, the conductive film 719 and the conductive film 720 can be formed in a manner such that a conductive film is formed to cover the gate electrode 707 and the conductive film 708 by a sputtering method or a vacuum vapor deposition method and then is processed (patterned) into a predetermined shape.

As the conductive film which serves as the conductive film 719 and the conductive film 720, any of the following materials can be used: an element selected from aluminum, chromium, copper, tantalum, titanium, molybdenum, or tungsten; an alloy including any of these elements; an alloy film including the above elements in combination; and the like. Alternatively, a structure may be employed in which a film of a refractory metal such as chromium, tantalum, titanium, molybdenum, or tungsten is stacked over or below a metal film of aluminum, copper, or the like. Aluminum or copper is used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which serves as the conductive film 719 and the conductive film 720 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesion with an oxide film. Thus, for the conductive film 719 and the conductive film 720, a layered structure is employed in which a conductive film including a Cu—Mg—Al alloy, a Mo—Ti alloy, Ti, or Mo is used for a lower layer and a conductive film including Cu is used for an upper layer. Consequently, the adhesion between an insulating film which is an oxide film and the conductive film 719 and the conductive film 720 can be increased.

For the conductive film which serves as the conductive film 719 and the conductive film 720, a conductive metal oxide may be used. As the conductive metal oxide, indium oxide, tin oxide, zinc oxide, indium oxide-tin oxide, indium oxide-zinc oxide, or the conductive metal oxide material containing silicon or silicon oxide can be used.

In the case where heat treatment is performed after the formation of the conductive film, the conductive film preferably has heat resistance high enough to withstand the heat treatment.

Note that each material and etching conditions are adjusted as appropriate so that the oxide semiconductor layer 716 is not removed as much as possible during etching of the conductive film. Depending on the etching conditions, an exposed portion of the oxide semiconductor layer 716 is partly etched, so that a groove (a depression portion) is formed in some cases.

In this embodiment, a titanium film is used as the conductive film. Thus, the conductive film can be selectively etched by wet etching using a solution (an ammonia hydrogen peroxide mixture) containing ammonia and hydrogen peroxide water. Specifically, an ammonia hydrogen peroxide mixture in which oxygenated water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

Note that in order to reduce the number of photomasks used in a photolithography step and to reduce the number of processes, an etching step may be performed using a resist mask formed using a multi-tone mask through which light is transmitted to have a plurality of intensities. A resist mask formed using a multi-tone mask has a plurality of thicknesses, and can be changed in shape by etching; thus, the resist mask can be used in a plurality of etching steps for processing films into different patterns. Accordingly, a resist mask corresponding to at least two or more kinds of different patterns can be formed by one multi-tone mask. Thus, the number of exposure masks and the number of corresponding photolithography steps can be reduced, so that the process can be simplified.

Further, an oxide conductive film functioning as source and drain regions may be provided between the oxide semiconductor layer 716, and the conductive film 719 and the conductive film 720 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, patterning for forming the oxide conductive film and patterning for forming the conductive film 719 and the conductive film 720 may be performed concurrently.

With provision of the oxide conductive film functioning as source and drain regions, resistance between the oxide semiconductor layer 716, and the conductive film 719 and the conductive film 720 can be lowered, so that the transistor can operate at high speed. In addition, with provision of the oxide conductive film functioning as source and drain regions, the withstand voltage of the transistor can be increased.

Next, plasma treatment may be performed using a gas such as $N_2O$, $N_2$, or Ar. With this plasma treatment, water and the like attached onto an exposed surface of the oxide semiconductor layer are removed. Alternatively, plasma treatment may be performed using a mixture gas of oxygen and argon.

Figure 17B:
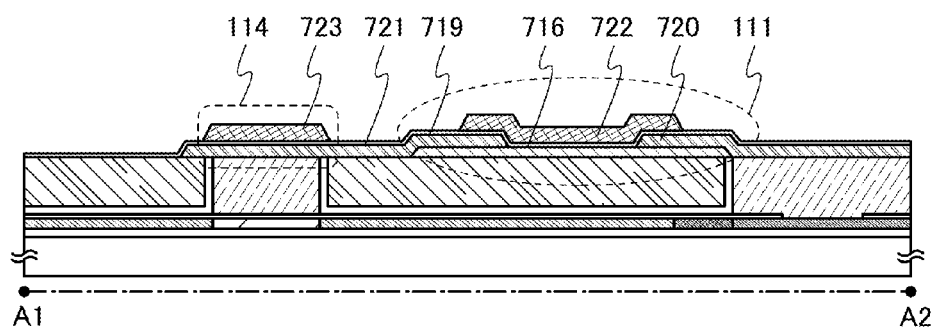

After the plasma treatment, as illustrated in FIG. 17B, the gate insulating film 721 is formed to cover the conductive film 719, the conductive film 720, and the oxide semiconductor layer 716. Then, a gate electrode 722 is formed over the gate insulating film 721 to overlap with the oxide semiconductor layer 716, and a conductive film 723 is formed over the gate insulating film 721 to overlap with the conductive film 719.

The gate insulating film 721 can be formed using a material and a layered structure which are similar to those of the gate insulating film 703. Note that the gate insulating film 721 preferably includes impurities such as moisture or hydrogen as little as possible, and the gate insulating film 721 may be formed using a single-layer insulating film or a plurality of insulating films stacked. When hydrogen is contained in the gate insulating film 721, hydrogen enters the oxide semiconductor layer 716 or oxygen in the oxide semiconductor layer 716 is extracted by hydrogen, whereby the oxide semiconductor layer 716 has lower resistance (n-type conductivity); thus, a parasitic channel might be formed. Thus, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, or an aluminum nitride oxide film can be used, for example. When a plurality of insulating films stacked are used, an insulating film having low proportion of nitrogen, such as a silicon oxide film or a silicon oxynitride film, is formed on a side which is closer to the oxide semiconductor layer 716 than the insulating film having a high barrier property. Then, the insulating film having a high barrier property is formed to overlap with the conductive film 719 and the conductive film 720, and the oxide semiconductor layer 716 with the insulating film having low proportion of nitrogen provided therebetween. When the insulating film having a high barrier property is used, impurities such as moisture or hydrogen can be prevented from entering the oxide semiconductor layer 716, the gate insulating film 721, or the interface between the oxide semiconductor layer 716 and another insulating film and the vicinity thereof. In addition, the insulating film having low proportion of nitrogen, such as a silicon oxide film or a silicon oxynitride film, is formed to be in contact with the oxide semiconductor layer 716, so that the insulating film having a high barrier property can be prevented from being in direct contact with the oxide semiconductor layer 716.

In this embodiment, the gate insulating film 721 with a structure in which a 100-nm-thick silicon nitride film formed by a sputtering method is stacked over a 200-nm-thick silicon oxide film formed by a sputtering method is formed. The substrate temperature during deposition may be higher than or equal to room temperature and lower than or equal to 300° C., and is 100° C. in this embodiment.

After the gate insulating film 721 is formed, heat treatment may be performed. The heat treatment is performed in a nitrogen atmosphere, ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. It is preferable that the content of water in the gas be lower than or equal to 20 ppm, preferably lower than or equal to 1 ppm, more preferably lower than or equal to 10 ppb. In this embodiment, for example, heat treatment is performed at 250° C. in a nitrogen atmosphere for an hour. Alternatively, RTA treatment for a short time at a high temperature may be performed before the conductive film 719 and the conductive film 720 are formed in a manner similar to that of the heat treatment performed on the oxide semiconductor layer for reduction of moisture or hydrogen. Even when oxygen defects are generated in the oxide semiconductor layer 716 by heat treatment performed on the oxide semiconductor layer 716 by performing the heat treatment after the gate insulating film 721 containing oxygen is provided, oxygen is supplied to the oxide semiconductor layer 716 from the gate insulating film 721. By the supply of oxygen to the oxide semiconductor layer 716, oxygen defects that serve as donors can be reduced in the oxide semiconductor layer 716 and the stoichiometric composition ratio can be satisfied. The oxide semiconductor layer 716 preferably contains oxygen whose composition exceeds the stoichiometric composition. As a result, the oxide semiconductor layer 716 can be made substantially intrinsic and variation in electric characteristics of the transistor due to oxygen defects can be reduced; thus, the electric characteristics can be improved. The timing of this heat treatment is not particularly limited as long as it is after the formation of the gate insulating film 721. When this heat treatment serves as heat treatment in another step (e.g., heat treatment during formation of a resin film or heat treatment for lowering the resistance of a transparent conductive film), the oxide semiconductor layer 716 can be made substantially intrinsic without the increase in the number of steps.

Alternatively, the oxygen defects that serve as donors in the oxide semiconductor layer 716 may be reduced by performing heat treatment on the oxide semiconductor layer 716 in an oxygen atmosphere so that oxygen is added to the oxide semiconductor. The heat treatment is performed at a temperature, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. Alternatively, the purity of the oxygen gas which is introduced into the heat treatment apparatus is preferably higher than or equal to 6N (99.9999%), more preferably higher than or equal to 7N (99.99999%) (that is, the impurity concentration in oxygen is lower than or equal to 1 ppm, preferably lower than or equal to 0.1 ppm).

Alternatively, oxygen may be added to the oxide semiconductor layer 716 by ion implantation, ion doping, or the like so that oxygen defects that serve as donors are reduced. For example, oxygen made to be plasma with a microwave of 2.45 GHz may be added to the oxide semiconductor layer 716.

The gate electrode 722 and the conductive film 723 can be formed in a manner such that a conductive film is formed over the gate insulating film 721 and then is patterned. The gate electrode 722 and the conductive film 723 can be formed using a material similar to that of the gate electrode 707, or the conductive film 719 and the conductive film 720.

The thickness of the gate electrode 722 and the conductive film 723 is 10 nm to 400 nm, preferably 100 nm to 200 nm. In this embodiment, after a 150-nm-thick conductive film for the gate electrode is formed by a sputtering method using a tungsten target, the conductive film is processed (patterned) into a desired shape by etching, so that the gate electrode 722 and the conductive film 723 are formed. A resist mask may be formed by an ink-jet method. When the resist mask is formed by an ink-jet method, a photomask is not used; thus, manufacturing cost can be reduced.

Through the above steps, the first transistor 111 is formed.

Note that a portion where the conductive film 719 and the conductive film 723 overlap with each other with the gate insulating film 721 provided therebetween corresponds to the first capacitor 114.

Although the first transistor 111 is described as a single-gate transistor, a dual gate or multi-gate transistor including a plurality of channel formation regions can be formed when a plurality of gate electrodes which are electrically connected are included when needed.

Note that an insulating film which is in contact with the oxide semiconductor layer 716 (in this embodiment, corresponding to the gate insulating film 721) may be formed using an insulating material containing an element that belongs to Group 13 and oxygen. Many oxide semiconductor materials contain an element that belongs to Group 13, and an insulating material containing an element that belongs to Group 13 works well with an oxide semiconductor. By using such an insulating material containing an element that belongs to Group 13 for the insulating film which is in contact with the oxide semiconductor layer, the state of the interface with the oxide semiconductor layer can be kept well.

An insulating material containing an element that belongs to Group 13 is an insulating material containing one or more elements that belong to Group 13. Examples of the insulating material containing an element that belongs to Group 13 include gallium oxide, aluminum oxide, aluminum gallium oxide, and gallium aluminum oxide. Here, aluminum gallium oxide is a material whose content of aluminum is larger than the content of gallium in an atomic percent, and gallium aluminum oxide is a material whose content of gallium is larger than or equal to the content of aluminum in an atomic percent.

For example, in the case where an insulating film is formed in contact with an oxide semiconductor layer containing gallium, when a material containing gallium oxide is used for the insulating film, favorable characteristics can be kept at the interface between the oxide semiconductor layer and the insulating film. For example, when the oxide semiconductor layer and the insulating film containing gallium oxide are provided in contact with each other, pileup of hydrogen at the interface between the oxide semiconductor layer and the insulating film can be reduced. Note that a similar effect can be obtained in the case where an element that belongs to the same group as a constituent element of the oxide semiconductor is used for the insulating film. For example, it is effective to form an insulating film with the use of a material containing aluminum oxide. Aluminum oxide does not easily transmit water. Thus, it is preferable to use the material including aluminum oxide in order to prevent water from entering the oxide semiconductor layer.

The insulating film which is in contact with the oxide semiconductor layer 716 preferably contains oxygen in a proportion higher than that in the stoichiometric composition by heat treatment in an oxygen atmosphere, oxygen doping, or the like. "Oxygen doping" refers to addition of oxygen to a bulk. Note that the term "bulk" is used in order to clarify that oxygen is added not only to a surface of a thin film but also to the inside of the thin film. In addition, the term "oxygen doping" includes "oxygen plasma doping" in which oxygen which is made to be plasma is added to a bulk. The oxygen doping may be performed by ion implantation or ion doping.

For example, in the case where the insulating film which is in contact with the oxide semiconductor layer 716 is formed using gallium oxide, the composition of gallium oxide can be set to be $Ga_2O_X$ ($X=3+\alpha$, $0<\alpha<1$) by heat treatment in an oxygen atmosphere or oxygen doping.

In the case where the insulating film which is in contact with the oxide semiconductor layer 716 is formed using aluminum oxide, the composition of aluminum oxide can be set to be $Al_2O_X$ ($X=3+\alpha$, $0<\alpha<1$) by heat treatment in an oxygen atmosphere or oxygen doping.

In the case where the insulating film which is in contact with the oxide semiconductor layer 716 is formed using gallium aluminum oxide (aluminum gallium oxide), the composition of gallium aluminum oxide (aluminum gallium oxide) can be set to be $Ga_XAl_{2-X}O_{3+\alpha}$ ($0<X<2$, $0<\alpha<1$) by heat treatment in an oxygen atmosphere or oxygen doping.

By oxygen doping, an insulating film including a region where the proportion of oxygen is higher than that in the stoichiometric composition can be formed. When the insulating film including such a region is in contact with the oxide semiconductor layer, oxygen that exists excessively in the insulating film is supplied to the oxide semiconductor layer, and oxygen vacancies in the oxide semiconductor layer or at the interface between the oxide semiconductor layer and the insulating film are reduced. Thus, the oxide semiconductor layer can be an intrinsic oxide semiconductor or a substantially intrinsic oxide semiconductor.

The oxide semiconductor layer in which oxygen vacancies have been reduced by supplying excessive oxygen in the insulating film to the oxide semiconductor layer is a highly purified oxide semiconductor layer in which hydrogen concentration is sufficiently reduced and defect levels in the energy gap due to oxygen vacancies are reduced by sufficient supply of oxygen. Consequently, an oxide semiconductor layer in which carrier concentration is extremely low, which enables the transistor to have an extremely low off-state current, can be obtained. When such a transistor having an extremely low off-state current is used as the first transistor according to the above embodiment, the first transistor can be considered substantially as an insulator when brought out of conduction. Thus, this means, when such a transistor is used as the first to third transistors, a reduction in the potentials of the first data holding portion D_HOLD1 and the second data holding portion D_HOLD2 can be kept to an extremely low level. As a result, it is possible to obtain a nonvolatile storage device which can reduce variations in the potential of the first data holding portion D_HOLD1 and the potential of the second data holding portion D_HOLD2 and can prevent the stored data from being lost even in the case where the supply of power supply voltage is stopped.

The insulating film including a region where the proportion of oxygen is higher than that in the stoichiometric composition may be used for either the insulating film placed on an upper side of the oxide semiconductor layer or the insulating film placed on a lower side of the oxide semiconductor layer of the insulating films which are in contact with the oxide semiconductor layer 716; however, it is preferable to use such an insulating film for both the insulating films which are in contact with the oxide semiconductor layer 716. The above advantageous effect can be enhanced with a structure where the oxide semiconductor layer 716 is sandwiched between the insulating films each including a region where the proportion of oxygen is higher than that in the stoichiometric composition, which are used as the insulating films in contact with the oxide semiconductor layer 716 and positioned on the upper side and the lower side of the oxide semiconductor layer 716.

The insulating films on the upper side and the lower side of the oxide semiconductor layer 716 may contain the same constituent element or different constituent elements. For example, the insulating films on the upper side and the lower side may be both formed using gallium oxide whose composition is $Ga_2O_X$ ($X=3+\alpha$, $0<\alpha<1$). Alternatively, one of the insulating films on the upper side and the lower side may be formed using gallium oxide whose composition is $Ga_2O_X$ ($X=3+\alpha$, $0<\alpha<1$) and the other may be formed using aluminum oxide whose composition is $Al_2O_X$ ($X=3+\alpha$, $0<\alpha<1$).

The insulating film which is in contact with the oxide semiconductor layer 716 may be formed by a stack of insulating films each including a region where the proportion of oxygen is higher than that in the stoichiometric composition. For example, the insulating film on the upper side of the oxide semiconductor layer 716 may be formed as follows: gallium oxide whose composition is $Ga_2O_X$ ($X=3+\alpha$, $0<\alpha<1$) is formed and gallium aluminum oxide (aluminum gallium oxide) whose composition is $Ga_XAl_{2-X}O_{3+\alpha}$ ($0<X<2$, $0<\alpha<1$) is formed thereover. Note that the insulating film on the lower side of the oxide semiconductor layer 716 may be formed by a stack of insulating films each including a region where the proportion of oxygen is higher than that in the stoichiometric composition. Alternatively, both the insulating films on the upper side and the lower side of the oxide semiconductor layer 716 may be formed by a stack of insulating films each including a region where the proportion of oxygen is higher than that in the stoichiometric composition.

Figure 17C:
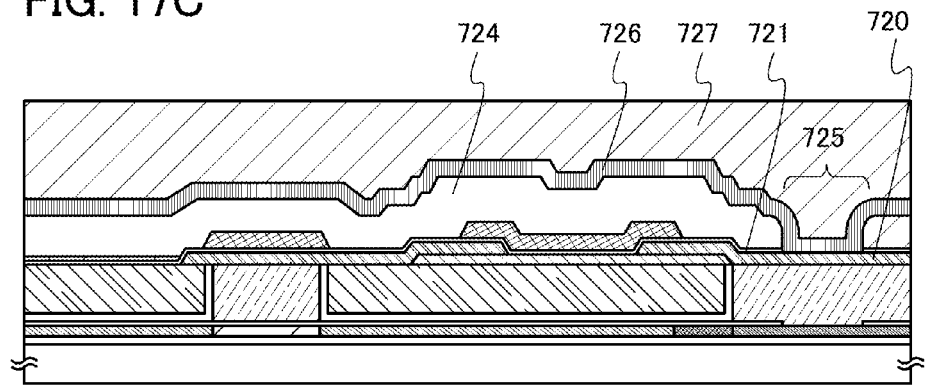

Next, as illustrated in FIG. 17C, an insulating film 724 is formed to cover the gate insulating film 721, the conductive film 723, and the gate electrode 722. The insulating film 724 can be formed by a PVD method, a CVD method, or the like. The insulating film 724 can be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, parasitic capacitance generated between wirings or electrodes can be reduced, which results in higher speed operation. Note that although the insulating film 724 has a single-layer structure in this embodiment, one embodiment of the present invention is not limited to this structure. The insulating film 724 may have a layered structure of two or more layers.

Next, an opening 725 is formed in the gate insulating film 721 and the insulating film 724, so that part of the conductive film 720 is exposed. After that, a wiring 726 which is in contact with the conductive film 720 through the opening 725 is formed over the insulating film 724.

A conductive film is formed by a PVD method or a CVD method and then is patterned, so that the wiring 726 is formed. As the material of the conductive film, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

Specifically, for example, it is possible to employ a method in which a thin titanium film is formed in a region including the opening of the insulating film 724 by a PVD method and a thin titanium film (with a thickness of approximately 5 nm) is formed by a PVD method, and then an aluminum film is formed to be embedded in the opening 725. Here, the titanium film formed by a PVD method has a function of reducing an oxide film (e.g., a native oxide film) formed on a surface over which the titanium film is formed to decrease the contact resistance with the lower electrode or the like (here, the conductive film 720). In addition, hillocks of the aluminum film can be prevented. A copper film may be formed by a plating method after a barrier film of titanium, titanium nitride, or the like is formed.

The opening 725 formed in the insulating film 724 is preferably formed in a region overlapping with the conductive film 708. Formation of the opening 725 in such a region makes it possible to prevent an increase in element area due to a contact region.

Here, the case where a connection position of the impurity region 704 and the conductive film 720 and a connection position of the conductive film 720 and the wiring 726 overlap with each other without the use of the conductive film 708 will be described. In that case, an opening (also referred to as an opening in a lower portion) is formed in the insulating film 712 and the insulating film 713 which are formed over the impurity region 704, and the conductive film 720 is formed to cover the opening in the lower portion. After that, an opening (also referred to as an opening in an upper portion) is formed in the gate insulating film 721 and the insulating film 724 in a region overlapping with the opening in the lower portion, and the wiring 726 is formed. When the opening in the upper portion is formed in the region overlapping with the opening in the lower portion, the conductive film 720 formed in the opening in the lower portion might be disconnected due to etching. In order to avoid the disconnection, the openings in the lower portion and in the upper portion are formed not to overlap with each other, so that a problem of the increase in element area occurs.

As described in this embodiment, with the use of the conductive film 708, the opening in the upper portion can be formed without disconnection of the conductive film 720.

Thus, the openings in the lower portion and in the upper portion can be formed to overlap with each other, so that the increase in element area due to the openings can be suppressed. In other words, the integration degree of the semiconductor storage device can be increased.

Next, an insulating film 727 is formed to cover the wiring 726. Through the series of steps, the semiconductor storage device can be formed.

Note that in the manufacturing method, the conductive film 719 and the conductive film 720 functioning as source and drain electrodes are formed after the formation of the oxide semiconductor layer 716. Thus, as illustrated in FIG. 17B, in the first transistor 111 obtained by the manufacturing method, the conductive film 719 and the conductive film 720 are formed over the oxide semiconductor layer 716. However, in the first transistor 111, the conductive films functioning as source and drain electrodes may be formed below the oxide semiconductor layer 716, that is, between the oxide semiconductor layer 716, and the insulating film 712 and the insulating film 713.

Figure 18:
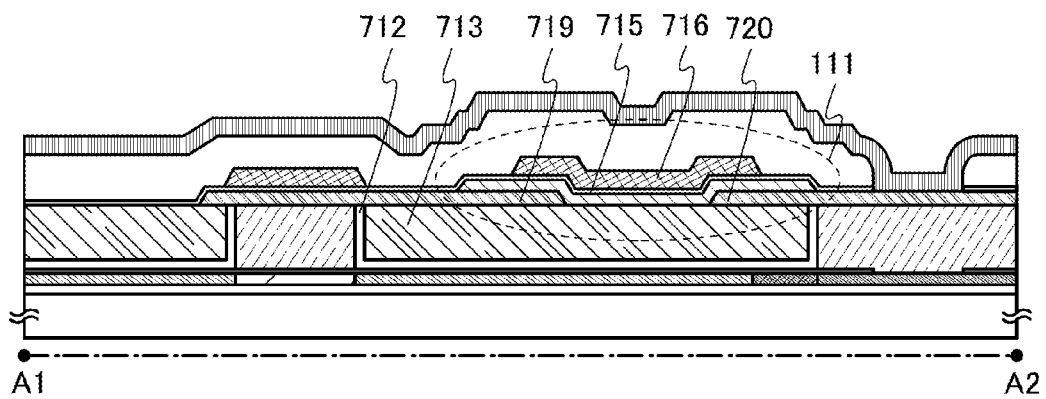
FIG. 18 is a cross-sectional view illustrating a structure of a semiconductor storage device.

FIG. 18 illustrates a cross-sectional view of the first transistor 111 in the case where the conductive film 719 and the conductive film 720 functioning as source and drain electrodes are provided between the oxide semiconductor layer 716, and the insulating film 712 and the insulating film 713. The first transistor 111 illustrated in FIG. 18 can be obtained in a manner such that the conductive film 719 and the conductive film 720 are formed after the formation of the insulating film 713 and then the oxide semiconductor layer 716 is formed.

Figure 22A:
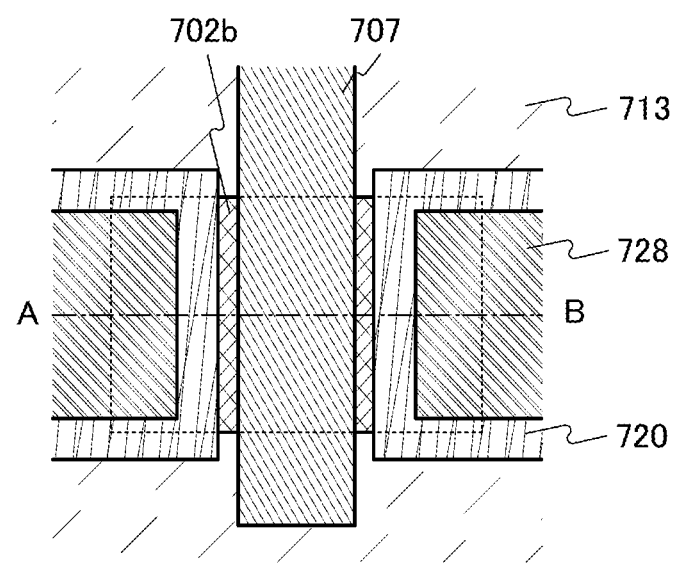
FIGS. 22A and 22B illustrate a structure of a transistor.
Figure 22B:
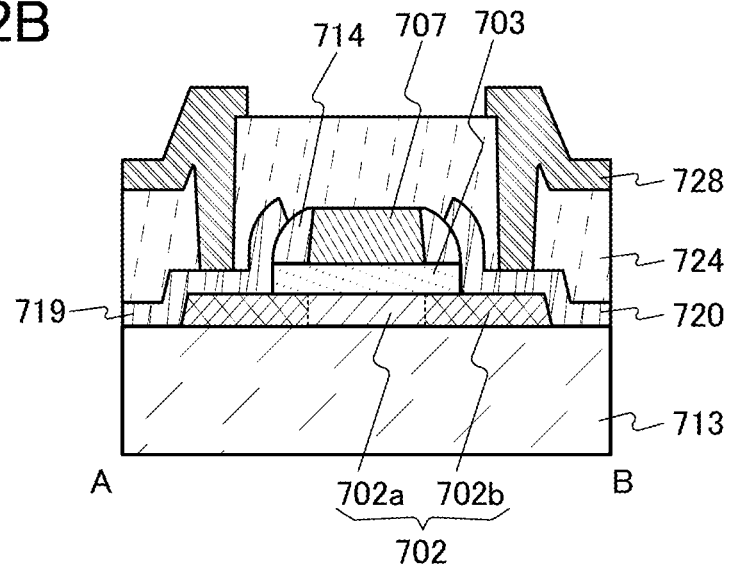

Note that the first transistor 111 is not limited to the mode illustrated in FIG. 18 and a planar type which is suitable for miniaturization can be employed. FIGS. 22A and 22B illustrate an example thereof. An example of a transistor in which an In—Sn—Zn—O film is used as an oxide semiconductor film will be described with reference to FIGS. 22A and 22B.

FIGS. 22A and 22B are a top view and a cross-sectional view of a coplanar transistor having a top-gate top-contact structure. FIG. 22A is the top view of the transistor. FIG. 22B illustrates a cross section A-B along the dashed-dotted line A-B in FIG. 22A.

The transistor illustrated in FIG. 22B includes a semiconductor film 702 which is provided over an insulating film 713 and includes a high-resistance region 702a and low-resistance regions 702b; a gate insulating film 703 provided over the semiconductor film 702; a gate electrode 707 provided to overlap with the semiconductor film 702 with the gate insulating film 703 provided therebetween; sidewall insulating films 714 provided in contact with side surfaces of the gate electrode 707; a conductive film 719 and a conductive film 720 provided in contact with at least the low-resistance regions 702b; an insulating film 724 provided to cover at least the semiconductor film 702, the gate electrode 707, the conductive film 719, and the conductive film 720; and wirings 728 provided to be connected to the conductive film 719 and the conductive film 720 through openings formed in the insulating film 724.

Although not illustrated, a protective film may be provided to cover the insulating film 724 and the wirings 728. With the protective film, a minute amount of leakage current generated by surface conduction of the insulating film 724 can be reduced, so that the off-state current of the transistor can be reduced.

Figure 23A:
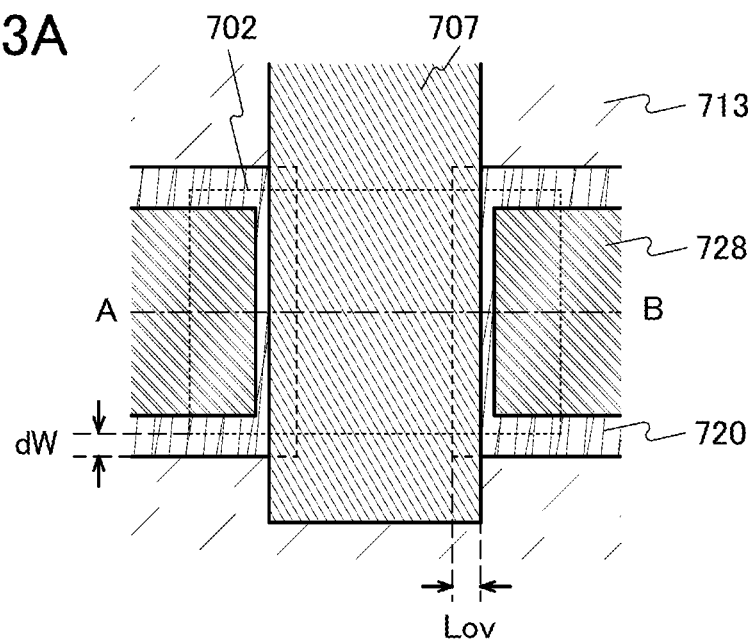
FIGS. 23A and 23B illustrate a structure of a transistor.
Figure 23B:
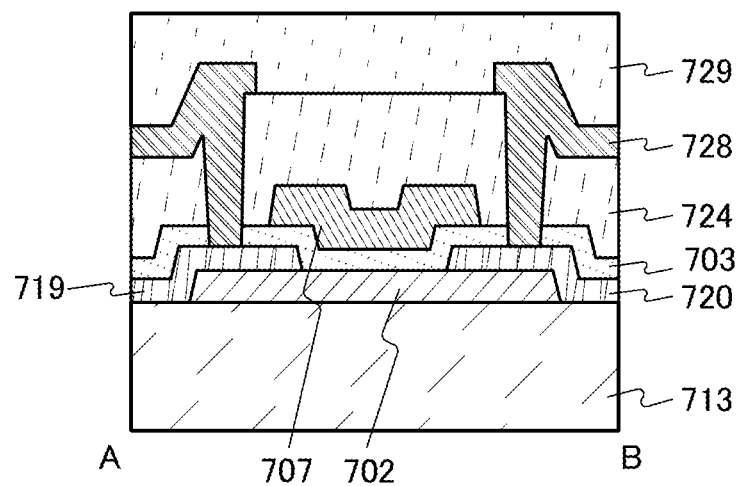

FIGS. 23A and 23B are a top view and a cross-sectional view illustrating a structure of another transistor. FIG. 23A is the top view of the transistor. FIG. 23B is a cross-sectional view taken along the dashed-dotted line A-B in FIG. 23A.

The transistor illustrated in FIG. 23B includes a semiconductor film 702 which is provided over an insulating film 713; a conductive film 719 and a conductive film 720 provided in contact with the semiconductor film 702; a gate insulating film 703 which is provided over the semiconductor film 702, the conductive film 719, and the conductive film 720; a gate electrode 707 provided to overlap with the semiconductor film 702 with the gate insulating film 703 provided therebetween; an insulating film 724 provided to cover the gate insulating film 703 and the gate electrode 707; wirings 728 provided to be connected to the conductive film 719 and the conductive film 720 through openings formed in the insulating film 724; and a protective film 729 provided to cover the insulating film 724 and the wirings 728.

As the insulating film 713, a silicon oxide film is used. As the semiconductor film 702, an In—Sn—Zn—O film is used. As the conductive film 719 and the conductive film 720, a tungsten film is used. As the gate insulating film 703, a silicon oxide film is used. The gate electrode 707 has a layered structure of a tantalum nitride film and a tungsten film. The insulating film 724 has a layered structure of a silicon oxynitride film and a polyimide film. The wirings 728 have a layered structure in which a titanium film, an aluminum film, and a titanium film are formed in this order. As the protective film 729, a polyimide film is used.

Note that in the transistor having the structure illustrated in FIG. 23A, the width of a portion where the gate electrode 707 overlaps with the conductive film 719 or the conductive film 720 is referred to as Lov. Similarly, the width of a portion of the conductive film 719 or the conductive film 720, which does not overlap with the semiconductor film 702, is referred to as dW.

Here, the field-effect mobility of a transistor whose channel is formed using an oxide semiconductor is considered. The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility is expressed by the following formula.

$$\mu = \mu_0 \exp\left(-\frac{E}{kT}\right)$$

Here, E represents the height of the potential barrier, k represents the Boltzmann constant, and T represents the absolute temperature. When the potential barrier is assumed to be attributed to a defect, the height of the potential barrier is expressed by the following formula according to the Levinson model.

$$E = \frac{e^2 N^2}{8\varepsilon n} = \frac{e^3 N^2 t}{8\varepsilon C_{ox} V_g}$$

Here, e represents the elementary electric charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region is expressed by the following formula.

$$I_d = \frac{W\mu V_g V_d C_{ox}}{L} \exp\left(-\frac{E}{kT}\right)$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g}$$

The right side of Formula 5 is a function of $V_g$. From the equation, it is found that the defect density N can be obtained from the slope of a line with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, or the like, to can be calculated to be 120 cm²/Vs from Formula 2 and Formula 3. The measured mobility of an In—Sn—Zn-based oxide including a defect is approximately 35 cm²/Vs. However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at an interface between a channel and a gate insulating film affects the transport property of the transistor. In other words, the mobility $\mu_1$ at a position that is distance x away from the interface between the channel and the gate insulating film can be expressed by the following formula.

$$\frac{1}{\mu_1} = \frac{1}{\mu_0} + \frac{D}{B}\exp\left(-\frac{x}{G}\right)$$

Here, D represents the electric field in the gate direction, and B and G are constants. B and G can be obtained from actual measurement results, and according to the above measurement results, B is $4.75 \times 10^7$ cm/s and G is 10 nm (the depth to which the influence of interface scattering reaches). When D is increased (i.e., when the gate voltage is increased), the second term of Formula 6 is increased, so that the mobility $\mu_1$ is decreased.

Figure 24:
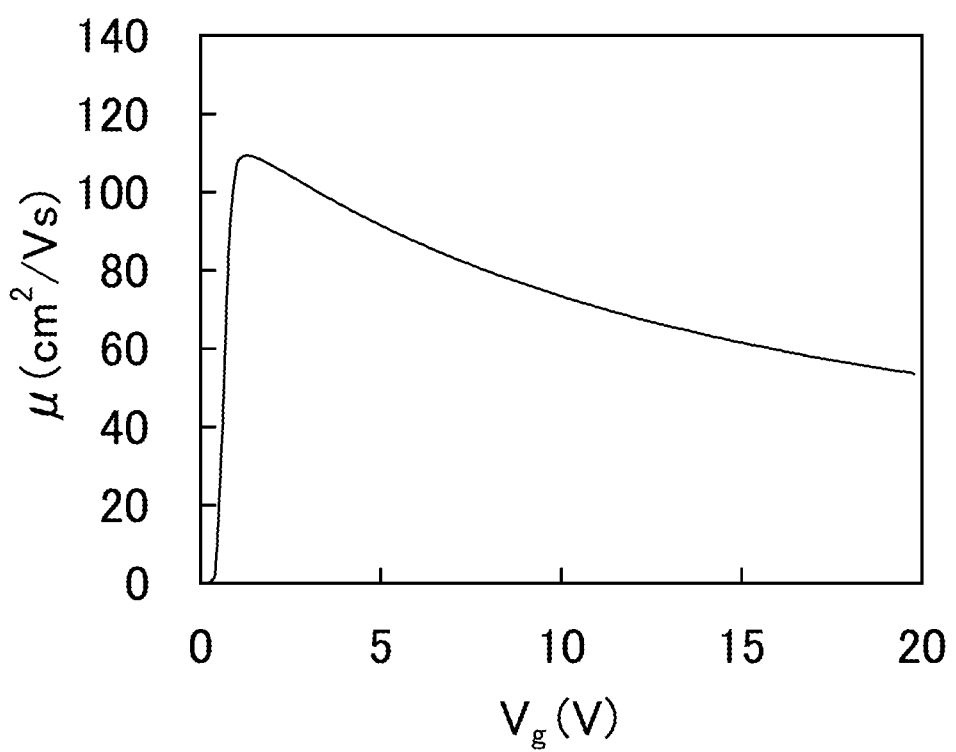
FIG. 24 shows gate voltage dependence of mobility obtained by calculation.

Calculation results of the mobility $\mu_2$ of a transistor whose channel includes an ideal oxide semiconductor without a defect inside the semiconductor are shown in FIG. 24. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 24, the mobility has a peak of 100 cm²/Vs or more at a gate voltage that is a little over 1 V and is decreased as the gate voltage becomes higher because the influence of interface scattering is increased. Note that in order to reduce interface scattering, it is preferable that a surface of the semiconductor layer be flat at the atomic level (atomic layer flatness).

Calculation results of characteristics of minute transistors formed using an oxide semiconductor having such a mobility are shown in FIGS. 25A to 25C, FIGS. 26A to 26C, and FIGS. 27A to 27C. FIGS. 28A and 28B illustrate cross-sectional structures of the transistors used for the calculation. The transistors illustrated in FIGS. 28A and 28B each include low-resistance regions 702b which have $n^+$-type conductivity in an oxide semiconductor layer. The resistivity of the low-resistance 702b is $2 \times 10^{-3}$ Ωcm.

The transistor illustrated in FIG. 28A is formed over an insulating film 713 and an embedded insulator 715 that is embedded in the insulating film 713 and is formed of aluminum oxide. The transistor includes the low-resistance regions 702b including an oxide semiconductor, a high-resistance region 702a that is placed therebetween and serves as a channel formation region, and a gate electrode 707. The width of the gate electrode 707 is 33 nm.

A gate insulating film 703 is formed between the gate electrode 707 and the high-resistance region 702a. Sidewall insulating films 714 are formed on both side surfaces of the gate electrode 707, and an insulating layer 717 is formed over the gate electrode 707 to prevent a short circuit between the gate electrode 707 and another wiring. The sidewall insulating films 714 each have a width of 5 nm. In addition, a conductive film 719 and a conductive film 720 which serve as source and drain electrodes are formed in contact with the low-resistance regions 702b. Note that the channel width of this transistor is 40 nm.

The transistor in FIG. 28B is the same as the transistor in FIG. 28A in that it is formed over the insulating film 713 and the embedded insulator 715 formed of aluminum oxide and that it includes the low-resistance regions 702b including an oxide semiconductor, the high-resistance region 702a including an oxide semiconductor provided therebetween, the gate electrode 707 having a width of 33 nm, the gate insulating film 703, the sidewall insulating films 714, the insulating layer 717, and the conductive film 719 and the conductive film 720 which serve as the source and drain electrodes.

The difference between the transistor in FIG. 28A and the transistor in FIG. 28B is the conductivity type of semiconductor regions under the sidewall insulating films 714. In the transistor in FIG. 28A, the semiconductor regions under the sidewall insulating films 714 are parts of the low-resistance regions 702b having $n^+$-type conductivity, whereas in the transistor in FIG. 28B, the semiconductor regions under the sidewall insulating films 714 are parts of the high-resistance region 702a. In other words, there is a region with a width $L_{off}$ in which the gate electrode 707 does not overlap with the low-resistance region 702b. This region is called an offset region, and the width $L_{off}$ is called an offset length. As is seen from the drawing, the offset length is equal to the width of the sidewall insulating film 714.

Figure 25:
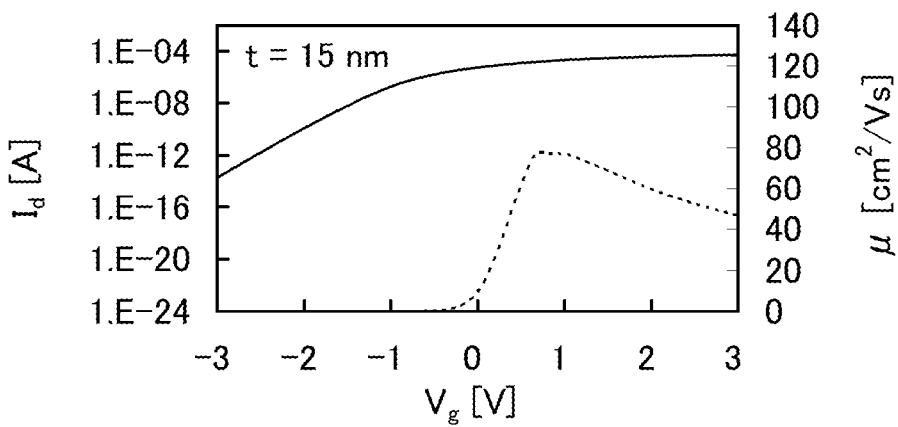
FIGS. 25A to 25C show gate voltage dependence of drain current and mobility obtained by calculation.
Figure 25B:
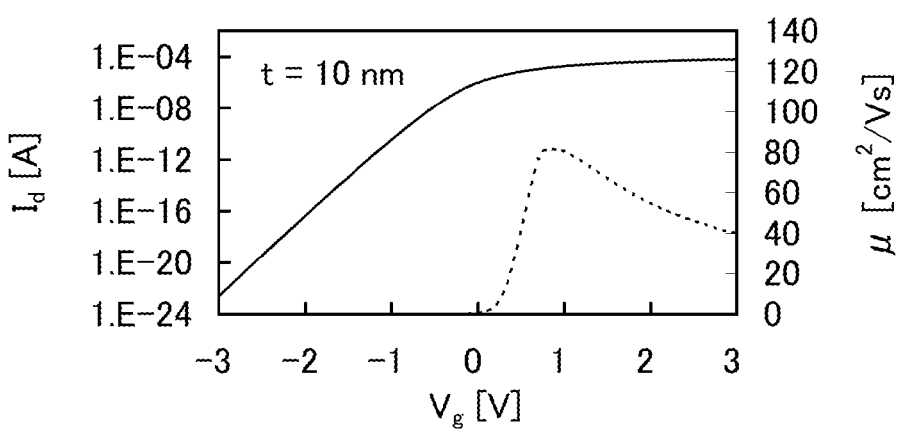
Figure 25C:
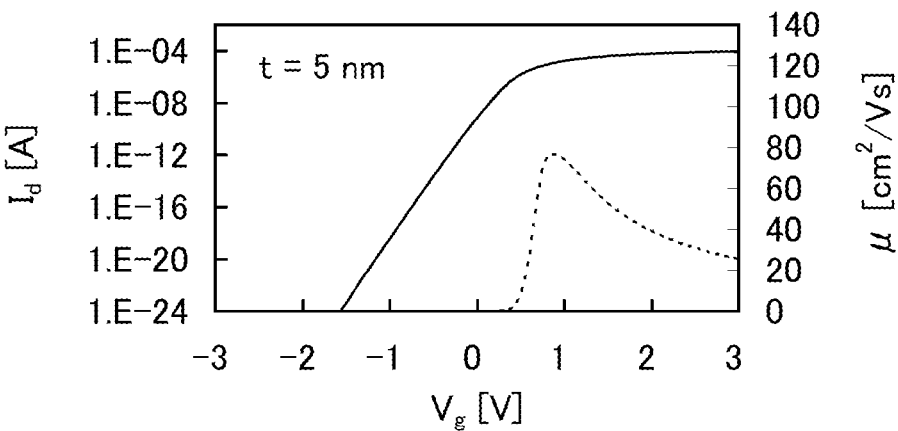

The other parameters used in calculation are as described above. For the calculation, device simulation software Sentaurus Device manufactured by Synopsys, Inc. was used. FIGS. 25A to 25C show the gate voltage ($V_g$: a potential difference between the gate and the source) dependence of the drain current ($I_d$, a solid line) and the mobility (μ, a dotted line) of the transistor having the structure illustrated in FIG. 28A. The drain current $I_d$ is obtained by calculation under the assumption that the drain voltage (a potential difference between the drain and the source) is +1 V, and the mobility μ is obtained by calculation under the assumption that the drain voltage is +0.1 V.

FIG. 25A shows the gate voltage dependence of the transistor in the case where the thickness of the gate insulating film is 15 nm, FIG. 25B shows that of the transistor in the case where the thickness of the gate insulating film is 10 nm, and FIG. 25C shows that of the transistor in the case where the thickness of the gate insulating film is 5 nm. As the gate insulating film is thinner, the drain current $I_d$ particularly in the off state (off-state current) is significantly decreased. In contrast, there is no noticeable change in the peak value of the mobility μ and the drain current $I_d$ in the on state (on-state current).

Figure 26A:
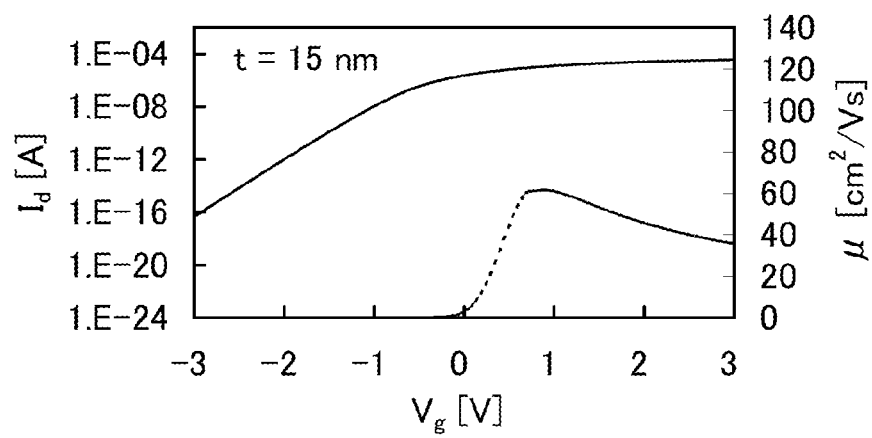
FIGS. 26A to 26C show gate voltage dependence of drain current and mobility obtained by calculation.
Figure 26B:
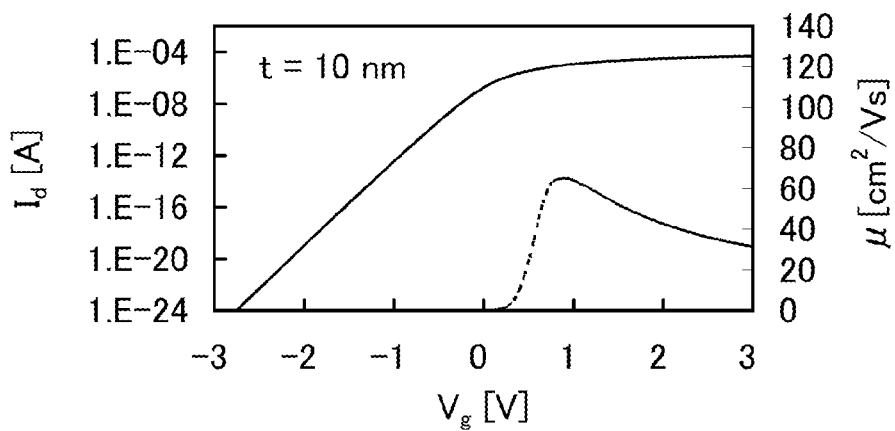
Figure 26C:
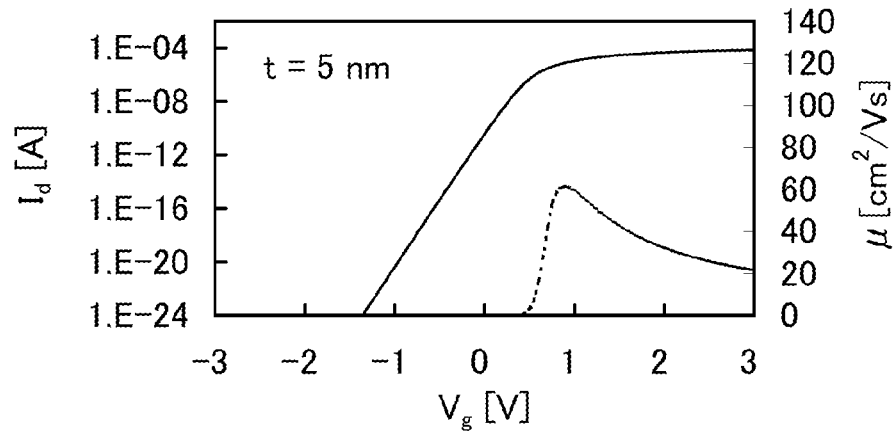

FIGS. 26A to 26C show the gate voltage $V_g$ dependence of the drain current $I_d$ (a solid line) and the mobility μ (a dotted line) of the transistor having the structure in FIG. 28B and an offset length $L_{off}$ of 5 nm. The drain current $I_d$ is obtained by calculation under the assumption that the drain voltage is +1 V and the mobility μ is obtained by calculation under the assumption that the drain voltage is +0.1 V. FIG. 26A shows the gate voltage dependence of the transistor in the case where the thickness of the gate insulating film is 15 nm, FIG. 26B shows that of the transistor in the case where the thickness of the gate insulating film is 10 nm, and FIG. 26C shows that of the transistor in the case where the thickness of the gate insulating film is 5 nm.

Figure 27A:
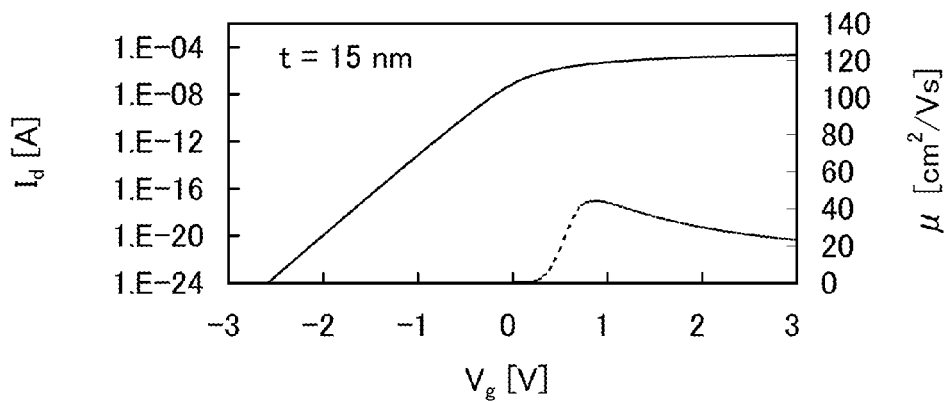
FIGS. 27A to 27C show gate voltage dependence of drain current and mobility obtained by calculation.
Figure 27B:
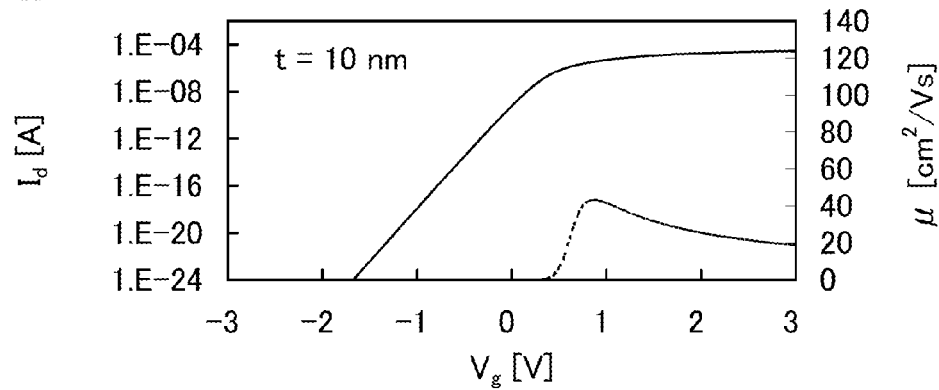
Figure 27C:
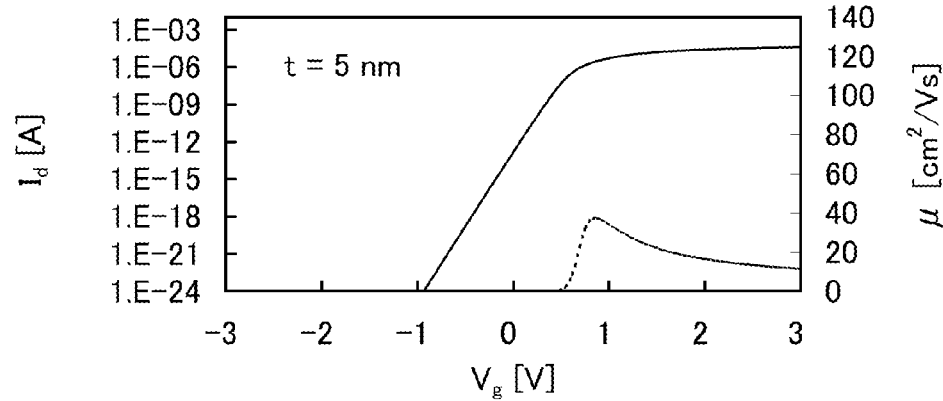
Figure 28A:
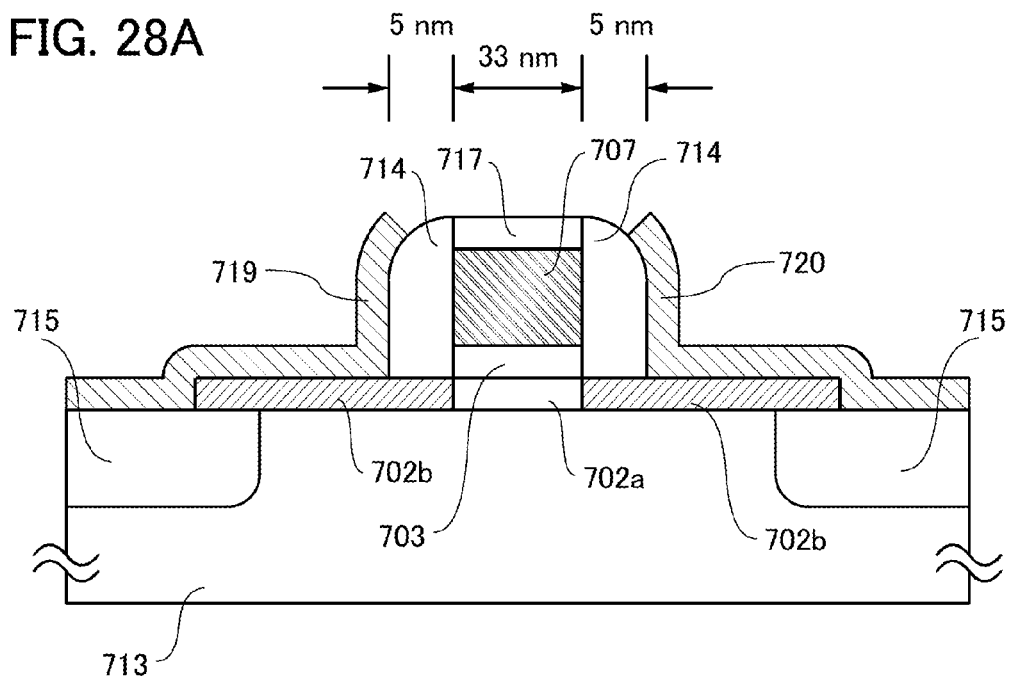
FIGS. 28A and 28B illustrate cross-sectional structures of transistors used for calculation.
Figure 28B:
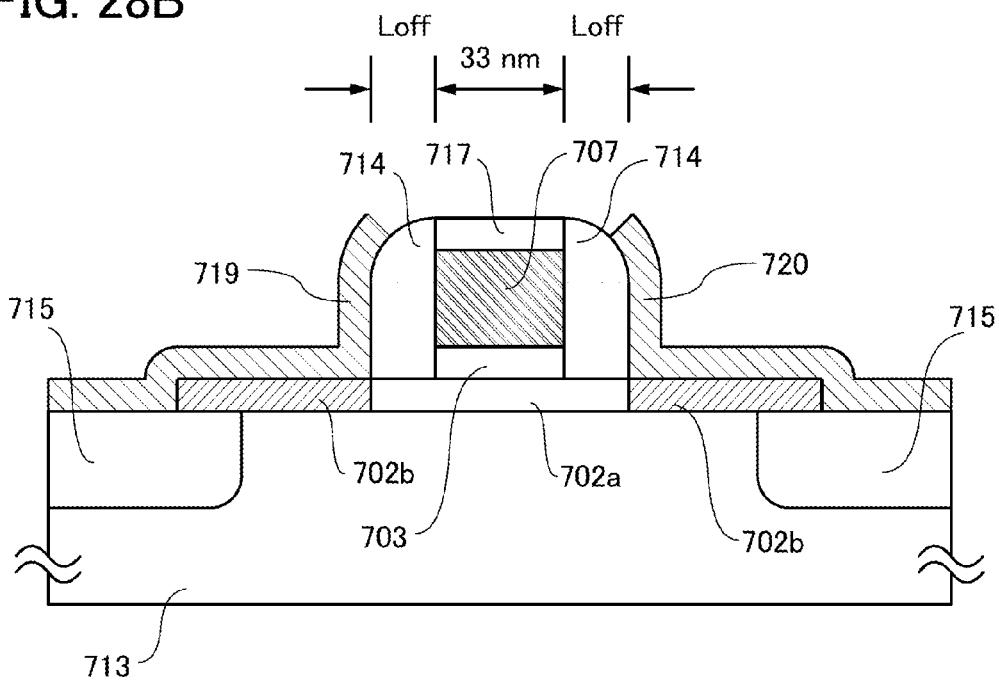

FIGS. 27A to 27C show the gate voltage dependence of the drain current $I_d$ (a solid line) and the mobility μ (a dotted line) of the transistor having the structure in FIG. 28B and an offset length $L_{off}$ of 15 nm. The drain current $I_d$ is obtained by calculation under the assumption that the drain voltage is +1 V and the mobility μ is obtained by calculation under the assumption that the drain voltage is +0.1 V. FIG. 27A shows the gate voltage dependence of the transistor in the case where the thickness of the gate insulating film is 15 nm, FIG. 27B shows that of the transistor in the case where the thickness of the gate insulating film is 10 nm, and FIG. 27C shows that of the transistor in the case where the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm$^2$/Vs in FIGS. 25A to 25C, approximately 60 cm$^2$/Vs in FIGS. 26A to 26C, and approximately 40 cm$^2$/Vs in FIGS. 27A to 27C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current.

As described above, the field-effect mobility of the transistor is described in detail; however, this embodiment can be combined with any of the above embodiments as appropriate.

[Embodiment 6]

A transistor whose channel formation region includes an oxide semiconductor including In, Sn, and Zn as main components can have favorable characteristics by depositing the oxide semiconductor while heating a substrate or by performing heat treatment after an oxide semiconductor film is formed. Note that a main component refers to an element included in a composition ratio at 5 atomic % or more.

By intentionally heating the substrate after deposition of the oxide semiconductor film including In, Sn, and Zn as main components, the field-effect mobility of the transistor can be improved. Further, the threshold voltage of the transistor can be positively shifted to make the transistor normally off.

Figure 29A:
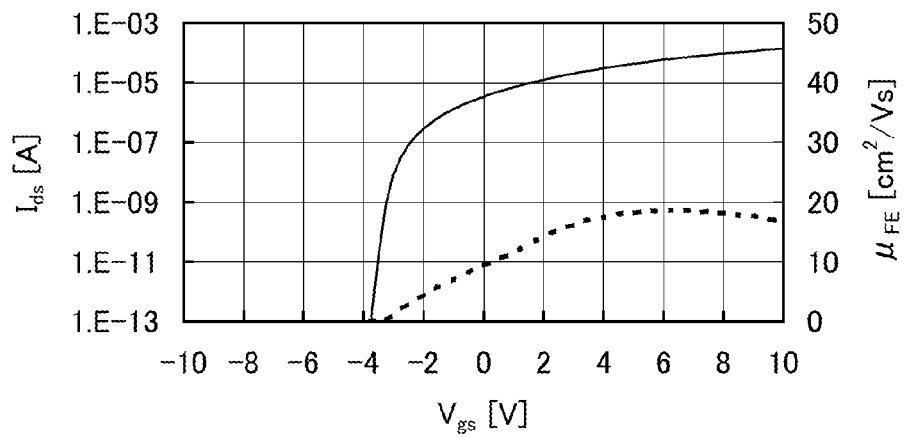
FIGS. 29A to 29C are graphs each showing characteristics of a transistor including an oxide semiconductor film.
Figure 29B:
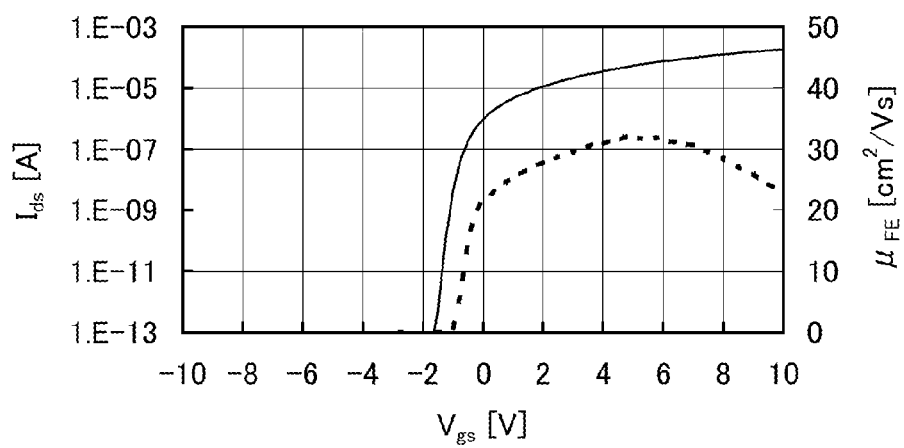
Figure 29C:
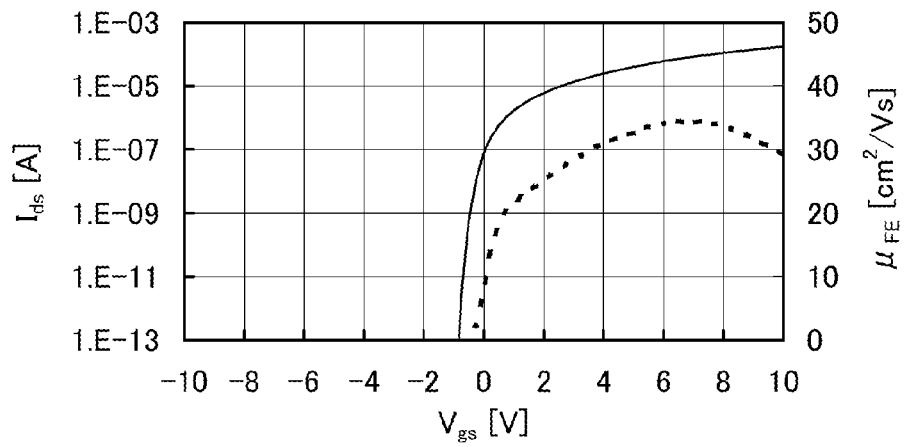

For example, FIGS. 29A to 29C each show characteristics of a transistor that includes an oxide semiconductor film including In, Sn, and Zn as main components and having a channel length L of 3 μm and a channel width W of 10 μm, and a gate insulating film with a thickness of 100 nm. Note that $V_d$ was set to 10 V.

FIG. 29A shows characteristics of a transistor whose oxide semiconductor film including In, Sn, and Zn as main components was formed by a sputtering method without heating a substrate intentionally. The field-effect mobility of the transistor is 18.8 cm$^2$/Vs. On the other hand, when the oxide semiconductor film including In, Sn, and Zn as main components is formed while heating the substrate intentionally, the field-effect mobility can be improved. FIG. 29B shows characteristics of a transistor whose oxide semiconductor film including In, Sn, and Zn as main components was formed while heating a substrate at 200° C. The field-effect mobility of the transistor is 32.2 cm$^2$/Vs.

The field-effect mobility can be further improved by performing heat treatment after the oxide semiconductor film including In, Sn, and Zn as main components is formed. FIG. 29C shows characteristics of a transistor whose oxide semiconductor film including In, Sn, and Zn as main components was deposited by a sputtering method at 200° C. and then subjected to heat treatment at 650° C. The field-effect mobility of the transistor is 34.5 cm$^2$/Vs.

The intentional heating of the substrate can reduce moisture taken into the oxide semiconductor film during the deposition by a sputtering method. Further, the heat treatment after deposition enables hydrogen, a hydroxyl group, or moisture to be released and removed from the oxide semiconductor film. In this manner, the field-effect mobility can be improved. It is presumed that such an improvement in field-effect mobility is achieved not only by removal of impurities by dehydration or dehydrogenation but also by a reduction in interatomic distance due to an increase in density. In addition, the oxide semiconductor can be crystallized by being purified by removal of impurities from the oxide semiconductor. In the case of using such a purified non-single-crystal oxide semiconductor, ideally, a field-effect mobility exceeding 100 cm$^2$/Vs is expected to be realized.

The oxide semiconductor including In, Sn, and Zn as main components may be crystallized in the following manner: oxygen ions are implanted into the oxide semiconductor; hydrogen, a hydroxyl group, or moisture included in the oxide semiconductor is released by heat treatment; and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during deposition and/or the heat treatment after the deposition contributes not only to improving field-effect mobility but also to making the transistor normally off. In a transistor whose channel formation region is formed in an oxide semiconductor film including In, Sn, and Zn as main components without heating a substrate intentionally, the threshold voltage tends to be shifted negatively. In contrast, when the oxide semiconductor film formed while heating the substrate intentionally is used, the problem of the negative shift of the threshold voltage can be solved. That is, the threshold voltage is shifted so that the transistor becomes normally off; such a tendency can be confirmed by comparison between FIGS. 29A and 29B.

Note that the threshold voltage can also be controlled by changing the ratio of In, Sn, and Zn; when the composition ratio of In, Sn, and Zn is 2:1:3, a normally-off transistor can be expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is higher than or equal to 150° C., preferably higher than or equal to 200° C., more preferably higher than or equal to 400° C. When deposition or heat treatment is performed at a high temperature, the transistor can be normally off.

By intentionally heating the substrate during deposition and/or by performing heat treatment after the deposition, the stability against a gate-bias stress can be increased. For example, when a gate bias is applied with an intensity of 2 MV/cm at 150° C. for an hour, drift of the threshold voltage can be less than ±1.5 V, preferably less than ±1.0 V.

A BT test was performed on the following two transistors: Sample 1 on which heat treatment was not performed after deposition of an oxide semiconductor film; and Sample 2 on which heat treatment at 650° C. was performed after deposition of an oxide semiconductor film.

First, $V_{gs}$-$I_{ds}$ characteristics of the transistors were measured at a substrate temperature of 25° C. and $V_{ds}$ of 10 V. Then, the substrate temperature was set to 150° C. and $V_{ds}$ was set to 0.1 V. After that, $V_{gs}$ of 20 V was applied so that the intensity of an electric field applied to the gate insulating film was 2 MV/cm, and the condition was kept for an hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a positive BT test.

In a similar manner, first, $V_{gs}$-$I_{ds}$ characteristics of the transistors were measured at a substrate temperature of 25° C. and $V_{ds}$ of 10 V. Then, the substrate temperature was set to 150° C. and $V_{ds}$ was set to 0.1 V. After that, $V_{gs}$ of −20 V was applied so that the intensity of an electric field applied to the gate insulating film was −2 MV/cm, and the condition was kept for an hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a negative BT test.

Figure 30A:
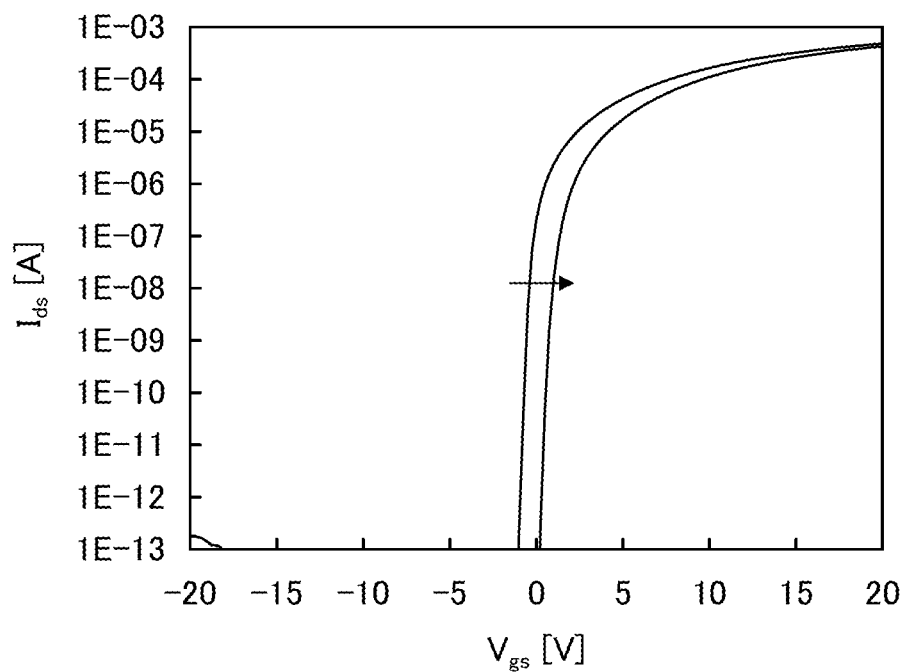
FIGS. 30A and 30B show $V_{gs}$-$I_{ds}$ characteristics after BT tests of a transistor of Sample 1.
Figure 30B:
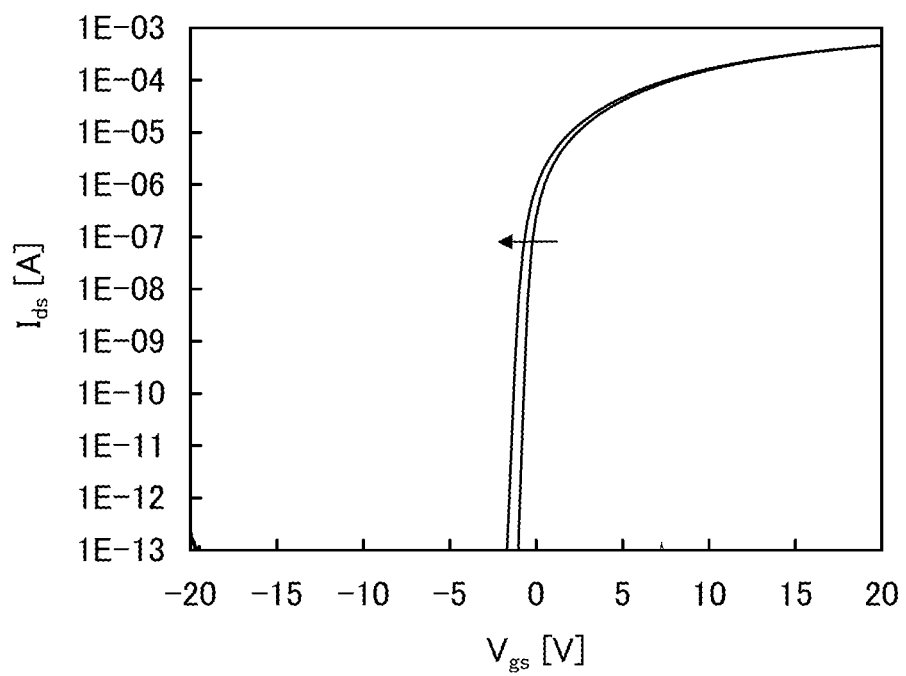
Figure 31A:
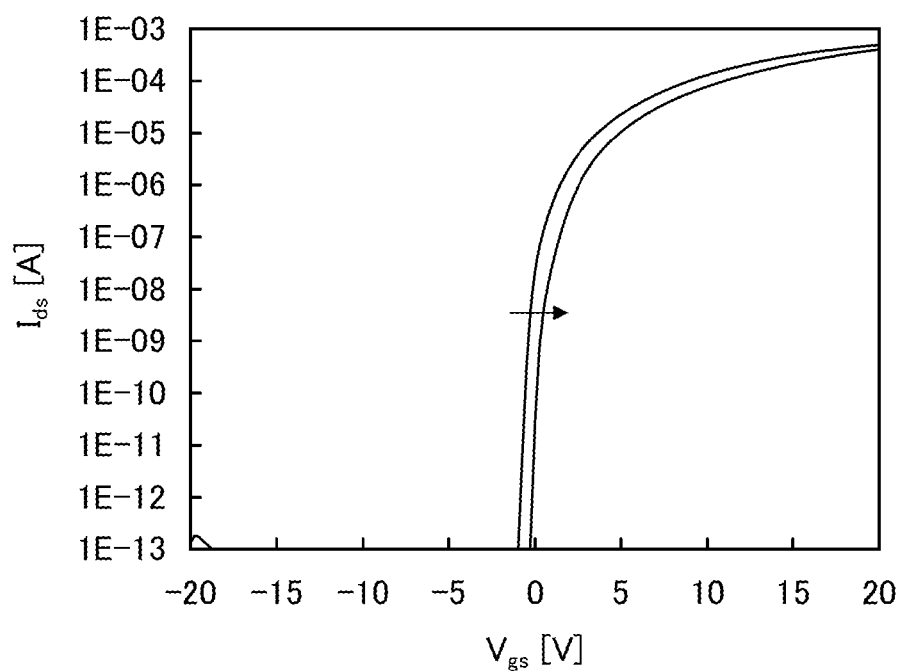
FIGS. 31A and 31B show $V_{gs}$-$I_{ds}$ characteristics after BT tests of a transistor of Sample 2.
Figure 31B:
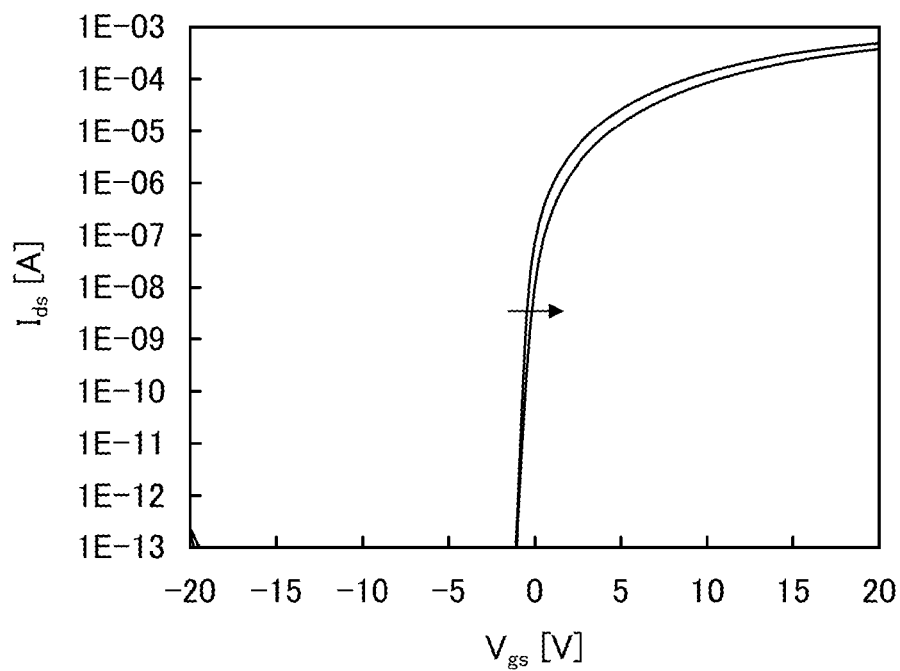

FIGS. 30A and 30B show results of the positive BT test and the negative BT test, respectively, of Sample 1. FIGS. 31A and 31B show results of the positive BT test and the negative BT test, respectively, of Sample 2.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the advantageous effect of the heat treatment can be further increased. As a method for supplying oxygen after dehydration or dehydrogenation, a method in which oxygen ions are accelerated by an electric field and implanted into the oxide semiconductor film may be employed.

A defect due to an oxygen vacancy is easily caused in the oxide semiconductor or at an interface with between the oxide semiconductor and a stacked film; when excess oxygen is included in the oxide semiconductor by the heat treatment, an oxygen vacancy caused later can be compensated for with excess oxygen. The excess oxygen is mainly oxygen existing between lattices. When the concentration of the oxygen is set in the range of $1\times10^{16}$/cm$^3$ to $2\times10^{20}$/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film is deposited by a sputtering method without heating a substrate intentionally, using a target having a composition ratio of In:Sn:Zn=1:1:1, a halo pattern is observed from the oxide semiconductor film by X-ray diffraction (XRD). This deposited oxide semiconductor film can be crystallized by being subjected to heat treatment. The temperature of the heat treatment can be set as appropriate; when the heat treatment is performed at 650° C., for example, a clear diffraction peak can be observed by X-ray diffraction.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for forming Sample A and Sample B will be described below.

An In—Sn—Zn—O film with a thickness of 100 nm was deposited over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target of In:Sn:Zn=1:1:1 [atomic ratio] was used as a target. Note that the substrate heating temperature during deposition was set at 200° C. A sample formed in this manner was used as Sample A.

Next, a sample formed by a method similar to that of Sample A was subjected to heat treatment at 650° C. As the heat treatment, heat treatment in a nitrogen atmosphere was first performed for an hour and heat treatment in an oxygen atmosphere was further performed for an hour without lowering the temperature. A sample formed in this manner was used as Sample B.

Figure 32:
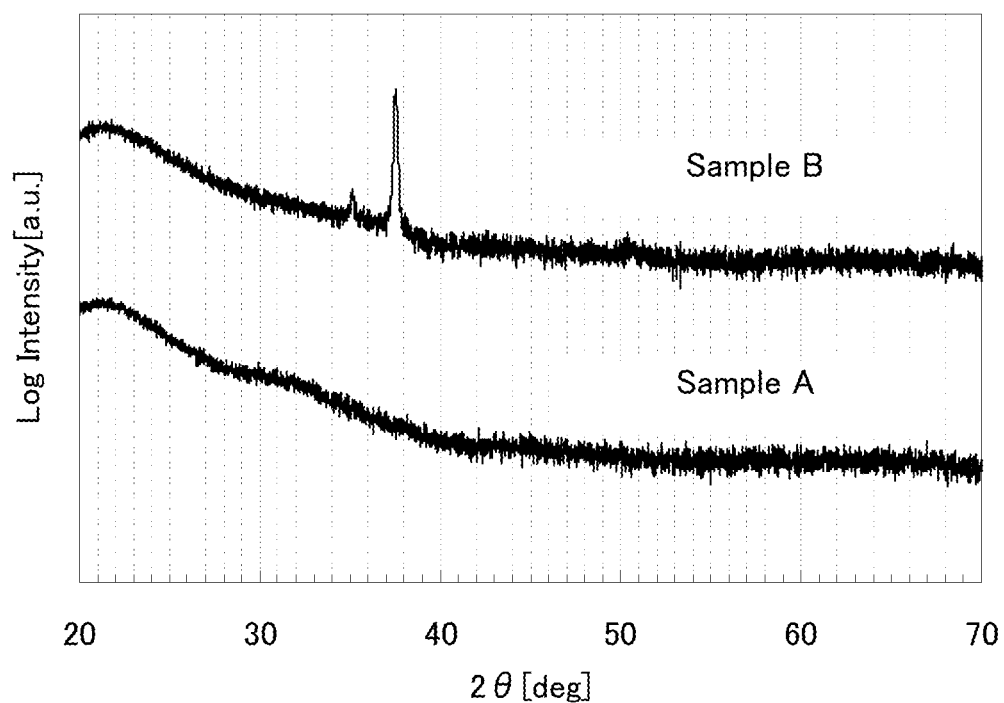
FIG. 32 is a graph showing XRD spectra of Sample A and Sample B.

FIG. 32 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an advantageous effect of preventing hydrogen and a hydroxyl group, which are unfavorable impurities for an oxide semiconductor, from being included in the film or an advantageous effect of removing hydrogen and a hydroxyl group from the film. That is, an oxide semiconductor can be purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 33:
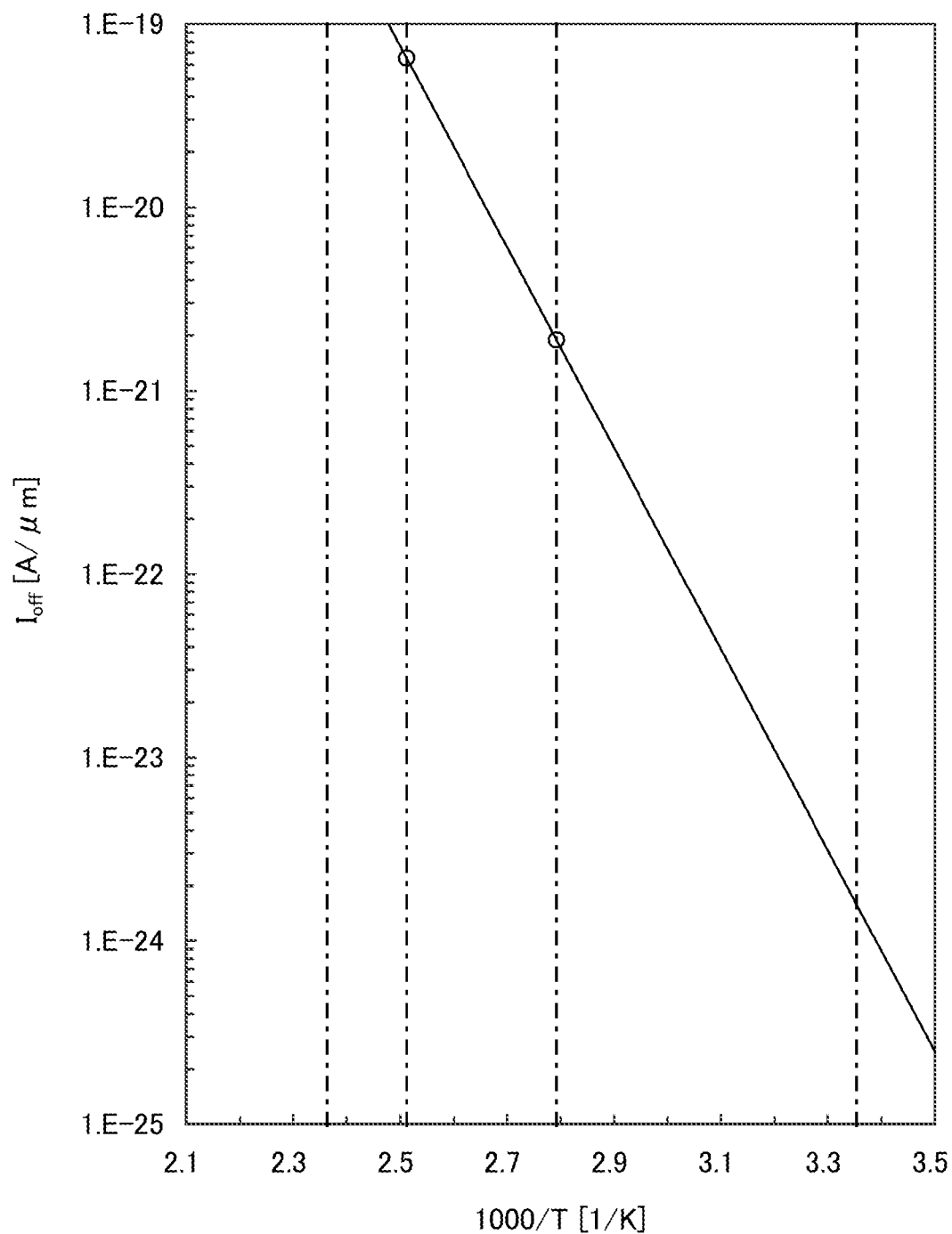
FIG. 33 is a graph showing a relation between the off-state current of a transistor and the substrate temperature in measurement.

FIG. 33 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 33, the off-state current can be lower than or equal to 1 aA/μm ($1 \times 10^{-18}$ A/μm), lower than or equal to 100 zA/μm ($1 \times 10^{-19}$ A/μm), and lower than or equal to 1 zA/μm ($1 \times 10^{-21}$ A/μm) when the substrate temperature is 125° C., 85° C., and room temperature (27° C.), respectively. Preferably, the off-state current can be lower than or equal to 0.1 aA/μm ($1 \times 10^{-19}$ A/μm), lower than or equal to 10 zA/μm ($1 \times 10^{-20}$ A/μm), and lower than or equal to 0.1 zA/μm ($1 \times 10^{-22}$ A/μm) at 125° C., 85° C., and room temperature, respectively.

Note that in order to prevent hydrogen and moisture from being included in the oxide semiconductor film during deposition of the film, it is preferable to increase the purity of a sputtering gas by sufficiently suppressing leakage from the outside of a deposition chamber and degasification through an inner wall of the deposition chamber. For example, a gas with a dew point of lower than or equal to −70° C. is preferably used as the sputtering gas in order to prevent moisture from being included in the film. In addition, it is preferable to use a target that is highly purified so as not to include impurities such as hydrogen and moisture. Although it is possible to remove moisture from a film of an oxide semiconductor including In, Sn, and Zn as main components by heat treatment, a film that does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of the transistor of the sample on which heat treatment at 650° C. was performed after deposition of the oxide semiconductor film was evaluated.

The transistor used for the measurement has a channel length L of 3 μm, a channel width W of 10 μm, Lov of 0 μm, and dW of 0 μm. Note that $V_{ds}$ was set to 10 μV. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 34:
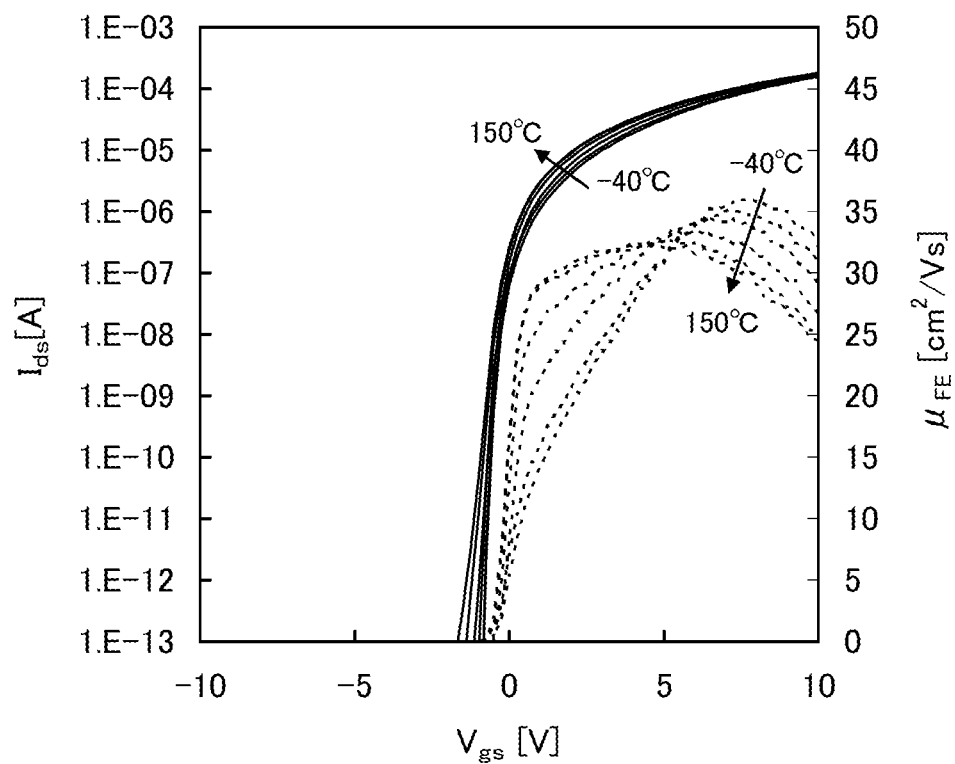
FIG. 34 is a graph showing $V_{gs}$ dependence of $I_{ds}$ and field-effect mobility.
Figure 35A:
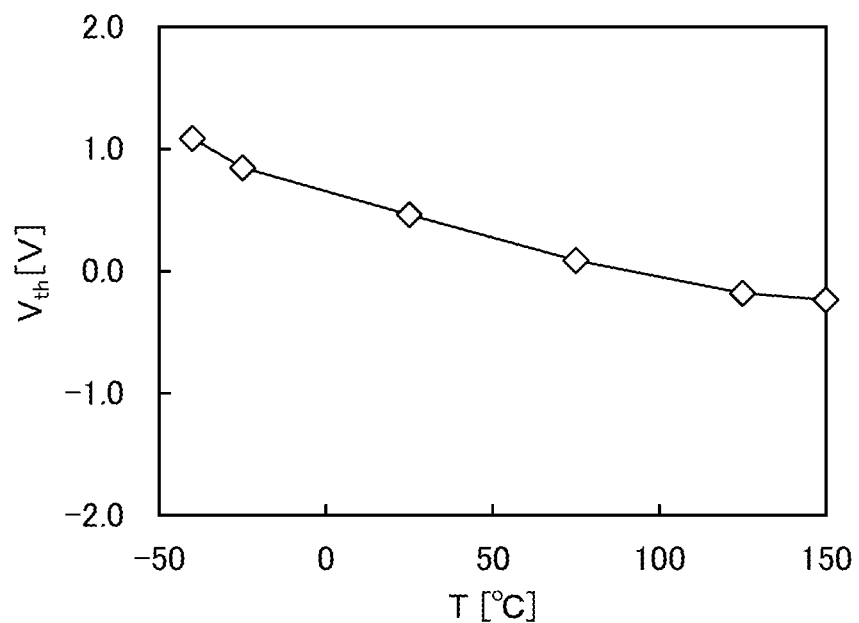
FIG. 35A is a graph showing a relation between the substrate temperature and the threshold voltage.

FIG. 34 shows the $V_{gs}$ dependence of $I_{ds}$ (a solid line) and field-effect mobility (a dotted line). FIG. 35A shows a relation between the substrate temperature and the threshold voltage, and FIG. 35B shows a relation between the substrate temperature and the field-effect mobility.

From FIG. 35A, it is found that the threshold voltage gets lower as the substrate temperature increases. Note that the threshold voltage is decreased from 1.09 V to −0.23 V in the range from −40° C. to 150° C.

Figure 35B:
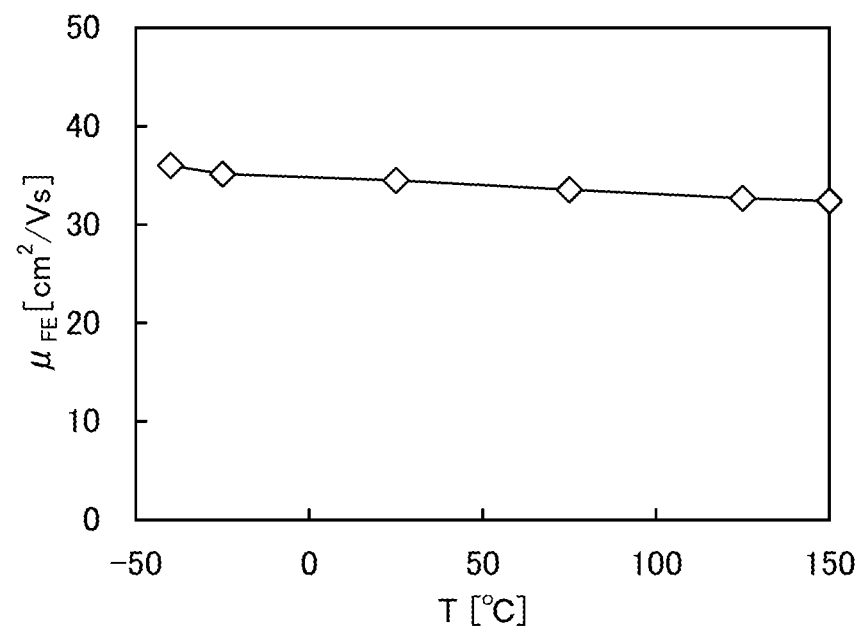
FIG. 35B is a graph showing a relation between the substrate temperature and the field-effect mobility.

From FIG. 35B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electric characteristics is small in the above temperature range.

In a transistor whose channel formation region includes such an oxide semiconductor including In, Sn, and Zn as main components, a field-effect mobility higher than or equal to 30 cm$^2$/Vs, preferably higher than or equal to 40 cm$^2$/Vs, more preferably higher than or equal to 60 cm$^2$/Vs can be obtained with the off-state current maintained at 1 aA/μm or lower, which can achieve an on-state current needed for an LSI. For example, in an FET where L/W is 33 nm/40 nm, an on-state current higher than or equal to 12 μA can flow when the gate voltage is 2.7 V and the drain voltage is 1.0 V. In addition, sufficient electric characteristics can be ensured in a temperature range needed for the operation of the transistor. With such characteristics, in an integrated circuit, a transistor including a Si semiconductor and a transistor including an oxide semiconductor can be operated together. Thus, a semiconductor storage device without the necessity of saving and returning a data signal between a volatile storage device and a nonvolatile storage device can be provided.

Meanwhile, a magnetic tunnel junction element (MTJ element) is known as a storage element used for a nonvolatile semiconductor storage device. The MTJ element is an element for storing information in a low-resistance state when the spin directions in films which are formed with an insulating film provided therebetween are parallel and storing information in a high-resistance state when the spin directions are not parallel. Therefore, the principle of the MTJ element is completely different from that of the semiconductor storage device including an oxide semiconductor, which is described in this embodiment. Table 1 shows a comparison between the MTJ element and the semiconductor storage device according to this embodiment (in the table indicated by "Oxide semiconductor/Si").

TABLE 1

| | Spintronics (MTJ element) | Oxide semiconductor/Si |
|---|---|---|
| Heat resistance | Curie temperature | Process temperature around 500° C. (Reliability at 150° C.) |
| Driving method | Current driving | Voltage driving |
| Writing principle | Changing spin direction of magnetic body | On/off of FET |
| Si LSI | Suitable for bipolar LSI (MOS device is preferable for high integration because bipolar device is unsuitable for high integration. Note that W gets larger.) | Suitable for MOS LSI |
| Overhead | Large (Because of high Joule heat) | Smaller by 2 to 3 or more orders of magnitude than the MTJ element (Because of charging and discharging of parasitic capacitance) |
| Nonvolatility | Utilizing spin | Utilizing low off-state current |
| Read Number | Without limitation | Without limitation |
| 3D conversion | Difficult (at most two layers) | Easy (the number of layers is limitless) |
| Integration degree | 4 F$^2$ to 15 F$^2$ | Depends on the number of layers stacked |

TABLE 1-continued

| | Spintronics (MTJ element) | Oxide semiconductor/Si |
|---|---|---|
| ($F^2$) | | in 3D conversion (it is necessary to ensure heat resistance in process of forming upper OS FET) |
| Material | Magnetic rare-earth element | Oxide semiconductor material |
| Cost per bit | High | Low (Might be slightly high depending on oxide semiconductor material (such as In)) |
| Resistance to magnetic field | Low | High |

The MTJ element has a disadvantage in that a magnetic property is lost when the temperature is higher than or equal to the Curie temperature because a magnetic material is used. In addition, the MTJ element is compatible with a silicon bipolar device because current driving is employed; however, the bipolar device is unsuitable for high integration. Further, there is a problem in that power consumption is increased by an increase of memory capacity, though the writing current of the MTJ element is extremely low.

In principal, the MTJ element has low resistance to a magnetic field, and the spin direction is easily changed when the MTJ element is exposed to a high magnetic field. In addition, it is necessary to control magnetic fluctuation which is caused by nanoscaling of a magnetic body used for the MTJ element.

Further, a rare-earth element is used for the MTJ element; therefore, incorporation of a process of the MTJ element into a process of a silicon semiconductor which avoids metal contamination should be paid high attention to. The material cost per bit of the MTJ element is expensive.

On the other hand, the transistor including an oxide semiconductor in the semiconductor storage device described in this embodiment is similar to a silicon MOSFET in the element structure and the operation principal except that a semiconductor material which forms the channel formation region is a metal oxide. In addition, the transistor including an oxide semiconductor is not affected by a magnetic field, and the transistor does not cause soft error. This shows that the transistor is highly compatible with a silicon integrated circuit.

This application is based on Japanese Patent Application serial No. 2011-102540 filed with the Japan Patent Office on Apr. 29, 2011 and Japanese Patent Application serial No. 2011-108890 filed with the Japan Patent Office on May 14, 2011, the entire contents of which are hereby incorporated by reference.

What is claimed is:

1. A semiconductor storage device comprising:
   first to N-th stage semiconductor storage devices,
   wherein one of the first to N-th stage semiconductor storage devices comprises:
     first to third transistors; and
     a first capacitor and a second capacitor,
   wherein the first to third transistors are electrically connected to one another in series,
   wherein one of two electrodes of the first capacitor is electrically connected to one of a source electrode and a drain electrode of the first transistor, and
   wherein one of two electrodes of the second capacitor is electrically connected to one of a source electrode and a drain electrode of the second transistor,
   wherein N is a natural number,
   wherein the first to N-th stage semiconductor storage devices are connected in cascade,
   wherein data is input to an input terminal of the first-stage semiconductor storage device, and
   wherein the first to N-th stage semiconductor storage devices output first to N-th pulse signals which are shifted sequentially.

2. The semiconductor storage device according to claim 1,
   wherein the data is supplied to the first transistor from the other of the source electrode and the drain electrode of the first transistor,
   wherein the one of the source electrode and the drain electrode of the first transistor, the other of the source electrode and the drain electrode of the second transistor, and the one of the two electrodes of the first capacitor are electrically connected to one another and form a first data holding portion which holds the data,
   wherein the one of the source electrode and the drain electrode of the second transistor, one of a source electrode and a drain electrode of the third transistor, and the one of the two electrodes of the second capacitor are electrically connected to one another and form a second data holding portion which holds the data which is supplied through the second transistor,
   wherein the one of the first to N-th stage semiconductor storage devices further comprises:
   a first data potential holding and outputting circuit which outputs the data with a potential of the first data holding portion held;
   a first data potential control circuit to which an output signal of the first data potential holding and outputting circuit and a first capacitor control signal are input and which controls a potential of the other of the two electrodes of the first capacitor;
   a second data potential holding and outputting circuit which outputs the data with a potential of the second data holding portion held; and
   a second data potential control circuit to which an output signal of the second data potential holding and outputting circuit and a second capacitor control signal are input and which controls a potential of the other of the two electrodes of the second capacitor,
   wherein a first gate control signal is input to each gate of the first transistor and the third transistor, and a second gate control signal is input to a gate of the second transistor,
   wherein the first data holding portion holds the data by bringing a connection between the first transistor and the second transistor out of conduction,
   wherein the second data holding portion holds the data through the second transistor by bringing a connection between the second transistor and the third transistor out of conduction,
   wherein the first data potential control circuit changes a potential of an output terminal of the first data potential control circuit to control the potential of the first data holding portion by capacitive coupling through the first capacitor, and
   wherein the second data potential control circuit changes a potential of an output terminal of the second data potential control circuit to control the potential of the second data holding portion by capacitive coupling through the second capacitor.

3. The semiconductor storage device according to claim 2, wherein a transistor included in each of the first data potential holding and outputting circuit, the second data potential holding and outputting circuit, the first data potential control circuit, and the second data potential control circuit is a transistor including a semiconductor layer comprising silicon.

4. The semiconductor storage device according to claim 3, wherein the transistor including the semiconductor layer comprising silicon and the first transistor to the third transistor are stacked.

5. The semiconductor storage device according to claim 2, wherein the first transistor, the second transistor and the third transistor are each a transistor including a semiconductor layer comprising an oxide semiconductor.

6. The semiconductor storage device according to claim 5, wherein the oxide semiconductor is an In—Sn—Zn-based oxide semiconductor.

7. A semiconductor device including the semiconductor storage device according to claim 1.

8. The semiconductor storage device according to claim 1,
wherein the data is supplied to the first transistor from the other of the source electrode and the drain electrode of the first transistor,
wherein the one of the source electrode and the drain electrode of the first transistor, the other of the source electrode and the drain electrode of the second transistor, the one of the two electrodes of the first capacitor, and an input terminal of a first inverter circuit are electrically connected to one another and form a first data holding portion which holds the data,
wherein the one of the source electrode and the drain electrode of the second transistor, one of a source electrode and a drain electrode of the third transistor, the one of the two electrodes of the second capacitor, and an input terminal of a second inverter circuit are electrically connected to one another and form a second data holding portion which holds the data which is supplied through the second transistor,
wherein the one of the first to N-th stage semiconductor storage devices further comprises:
a first NOR circuit to which a signal of an output terminal of the first inverter circuit and a first capacitor control signal are input and whose output terminal is electrically connected to the other of the two electrodes of the first capacitor; and
a second NOR circuit to which a signal of an output terminal of the second inverter circuit and a second capacitor control signal are input and whose output terminal is electrically connected to the other of the two electrodes of the second capacitor,
wherein a first gate control signal is input to each gate of the first transistor and the third transistor, and a second gate control signal is input to a gate of the second transistor,
wherein the first data holding portion holds the data by bringing a connection between the first transistor and the second transistor out of conduction,
wherein the second data holding portion holds the data through the second transistor by bringing a connection between the second transistor and the third transistor out of conduction,
wherein the first NOR circuit changes a potential of the output terminal of the first NOR circuit by the signal of the output terminal of the first inverter circuit and the first capacitor control signal to control a potential of the first data holding portion by capacitive coupling through the first capacitor, and
wherein the second NOR circuit changes a potential of the output terminal of the second NOR circuit by the signal of the output terminal of the second inverter circuit and the second capacitor control signal to control a potential of the second data holding portion by capacitive coupling through the second capacitor.

9. The semiconductor storage device according to claim 8, wherein a transistor included in each of the first inverter circuit, the second inverter circuit, the first NOR circuit, and the second NOR circuit is a transistor including a semiconductor layer comprising silicon.

10. The semiconductor storage device according to claim 9, wherein the transistor including the semiconductor layer comprising silicon and the first transistor to the third transistors are stacked.

11. The semiconductor storage device according to claim 8, wherein each of the first transistor, the second transistor, and the third transistor is a transistor including a semiconductor layer containing an oxide semiconductor.

12. The semiconductor storage device according to claim 11, wherein the oxide semiconductor is an In—Sn—Zn-based oxide semiconductor.

13. A semiconductor storage device comprising:
a first transistor to which data is supplied from a first terminal of the first transistor;
a first data holding portion in which a second terminal of the first transistor, a first terminal of a second transistor, and a first electrode of a first capacitor are electrically connected to one another and which holds the data;
a first data potential holding and outputting circuit which outputs the data with a potential of the first data holding portion held;
a first data potential control circuit to which an output signal of the first data potential holding and outputting circuit and a first capacitor control signal are input and which controls a potential of a second electrode of the first capacitor;
a second data holding portion in which a second terminal of the second transistor, a first terminal of a third transistor, and a first electrode of a second capacitor are electrically connected to one another and which holds the data which is supplied through the second transistor;
a second data potential holding and outputting circuit which outputs the data with a potential of the second data holding portion held; and
a second data potential control circuit to which an output signal of the second data potential holding and outputting circuit and a second capacitor control signal are input and which controls a potential of a second electrode of the second capacitor,
wherein a first gate control signal is input to each gate of the first transistor and the third transistor, and a second gate control signal is input to a gate of the second transistor,
wherein the first data holding portion holds the data by bringing a connection between the first transistor and the second transistor out of conduction,
wherein the second data holding portion holds the data through the second transistor by bringing a connection between the second transistor and the third transistor out of conduction,
wherein the first data potential control circuit changes a potential of an output terminal of the first data potential control circuit to control the potential of the first data holding portion by capacitive coupling through the first capacitor, and
wherein the second data potential control circuit changes a potential of an output terminal of the second data potential control circuit to control the potential of the second data holding portion by capacitive coupling through the second capacitor.

14. The semiconductor storage device according to claim 13, wherein a transistor included in each of the first data potential holding and outputting circuit, the second data potential holding and outputting circuit, the first data potential control circuit, and the second data potential control circuit is a transistor including a semiconductor layer comprising silicon.

15. The semiconductor storage device according to claim 14, wherein the transistor including a semiconductor layer containing silicon and the first to third transistors are stacked.

16. The semiconductor storage device according to claim 13, wherein each of the first transistor, the second transistor, and the third transistor is a transistor including a semiconductor layer containing an oxide semiconductor.

17. The semiconductor storage device according to claim 16, wherein the oxide semiconductor is an In—Sn—Zn-based oxide semiconductor.

18. A semiconductor storage device comprising:
a first transistor to which data is supplied from a first terminal of the first transistor;
a first data holding portion in which a second terminal of the first transistor, a first terminal of a second transistor, a first electrode of a first capacitor, and an input terminal of a first inverter circuit are electrically connected to one another and which holds the data;
a first NOR circuit to which a signal of an output terminal of the first inverter circuit and a first capacitor control signal are input and whose output terminal is electrically connected to a second electrode of the first capacitor;
a second data holding portion in which a second terminal of the second transistor, a first terminal of a third transistor, a first electrode of a second capacitor, and an input terminal of a second inverter circuit are electrically connected to one another and which holds the data which is supplied through the second transistor; and
a second NOR circuit to which a signal of an output terminal of the second inverter circuit and a second capacitor control signal are input and whose output terminal is electrically connected to a second electrode of the second capacitor,
wherein a first gate control signal is input to each gate of the first transistor and the third transistor, and a second gate control signal is input to a gate of the second transistor,
wherein the first data holding portion holds the data by bringing a connection between the first transistor and the second transistor out of conduction,
wherein the second data holding portion holds the data through the second transistor by bringing a connection between the second transistor and the third transistor out of conduction,
wherein the first NOR circuit changes a potential of the output terminal of the first NOR circuit by the signal of the output terminal of the first inverter circuit and the first capacitor control signal to control a potential of the first data holding portion by capacitive coupling through the first capacitor, and
wherein the second NOR circuit changes a potential of the output terminal of the second NOR circuit by the signal of the output terminal of the second inverter circuit and the second capacitor control signal to control a potential of the second data holding portion by capacitive coupling through the second capacitor.

19. The semiconductor storage device according to claim 18, wherein a transistor included in each of the first inverter circuit, the second inverter circuit, the first NOR circuit, and the second NOR circuit is a transistor including a semiconductor layer containing silicon.

20. The semiconductor storage device according to claim 19, wherein the transistor including a semiconductor layer containing silicon and the first to third transistors are stacked.

21. The semiconductor storage device according to claim 18, wherein the first to third transistors are each a transistor including a semiconductor layer containing an oxide semiconductor.

22. The semiconductor storage device according to claim 21, wherein the oxide semiconductor is an In—Sn—Zn-based oxide semiconductor.

* * * * *